United States Patent
Valcore, Jr. et al.

(10) Patent No.: US 9,997,333 B2
(45) Date of Patent: Jun. 12, 2018

(54) SUB-PULSING DURING A STATE

(71) Applicant: Lam Research Corporation, Fremont, CA (US)

(72) Inventors: John C. Valcore, Jr., Fremont, CA (US); Harmeet Singh, Fremont, CA (US); Bradford J. Lyndaker, San Ramon, CA (US)

(73) Assignee: Lam Research Corporation, Fremont, CA (US)

( * ) Notice: Subject to any disclaimer, the term of this patent is extended or adjusted under 35 U.S.C. 154(b) by 0 days. days.

(21) Appl. No.: 15/726,235

(22) Filed: Oct. 5, 2017

(65) Prior Publication Data

US 2018/0033596 A1 Feb. 1, 2018

Related U.S. Application Data

(60) Continuation of application No. 15/172,004, filed on Jun. 2, 2016, now Pat. No. 9,812,294, which is a division of application No. 14/466,724, filed on Aug. 22, 2014, now Pat. No. 9,390,893, which is a continuation-in-part of application No. 13/620,386, filed on Sep. 14, 2012, now Pat. No. 9,197,196, which is a continuation-in-part of application No. 13/531,491, filed on Jun. 22, 2012, now Pat. No. 9,114,666.

(60) Provisional application No. 61/602,040, filed on Feb. 22, 2012, provisional application No. 61/602,041, filed on Feb. 22, 2012.

(51) Int. Cl.
*H01J 37/32* (2006.01)
*H05H 1/24* (2006.01)
*H03L 7/06* (2006.01)
*H03K 3/01* (2006.01)
*H03L 7/00* (2006.01)
*H05H 1/46* (2006.01)

(52) U.S. Cl.
CPC .... *H01J 37/32146* (2013.01); *H01J 37/3244* (2013.01); *H01J 37/3255* (2013.01); *H01J 37/32082* (2013.01); *H01J 37/32174* (2013.01); *H01J 37/32183* (2013.01); *H03K 3/01* (2013.01); *H03L 7/00* (2013.01); *H03L 7/06* (2013.01); *H01J 2237/327* (2013.01); *H05H 2001/4682* (2013.01)

(58) Field of Classification Search
None
See application file for complete search history.

(56) References Cited

U.S. PATENT DOCUMENTS

2011/0031216 A1* 2/2011 Liao ................ H01J 37/32082
216/67

* cited by examiner

*Primary Examiner* — Dedei K Hammond
(74) *Attorney, Agent, or Firm* — Martine Penilla Group, LLP

(57) ABSTRACT

A method for achieving sub-pulsing during a state is described. The method includes receiving a clock signal from a clock source, the clock signal having two states and generating a pulsed signal from the clock signal. The pulsed signal has sub-states within one of the states. The sub-states alternate with respect to each other at a frequency greater than a frequency of the states. The method includes providing the pulsed signal to control power of a radio frequency (RF) signal that is generated by an RF generator. The power is controlled to be synchronous with the pulsed signal.

20 Claims, 33 Drawing Sheets

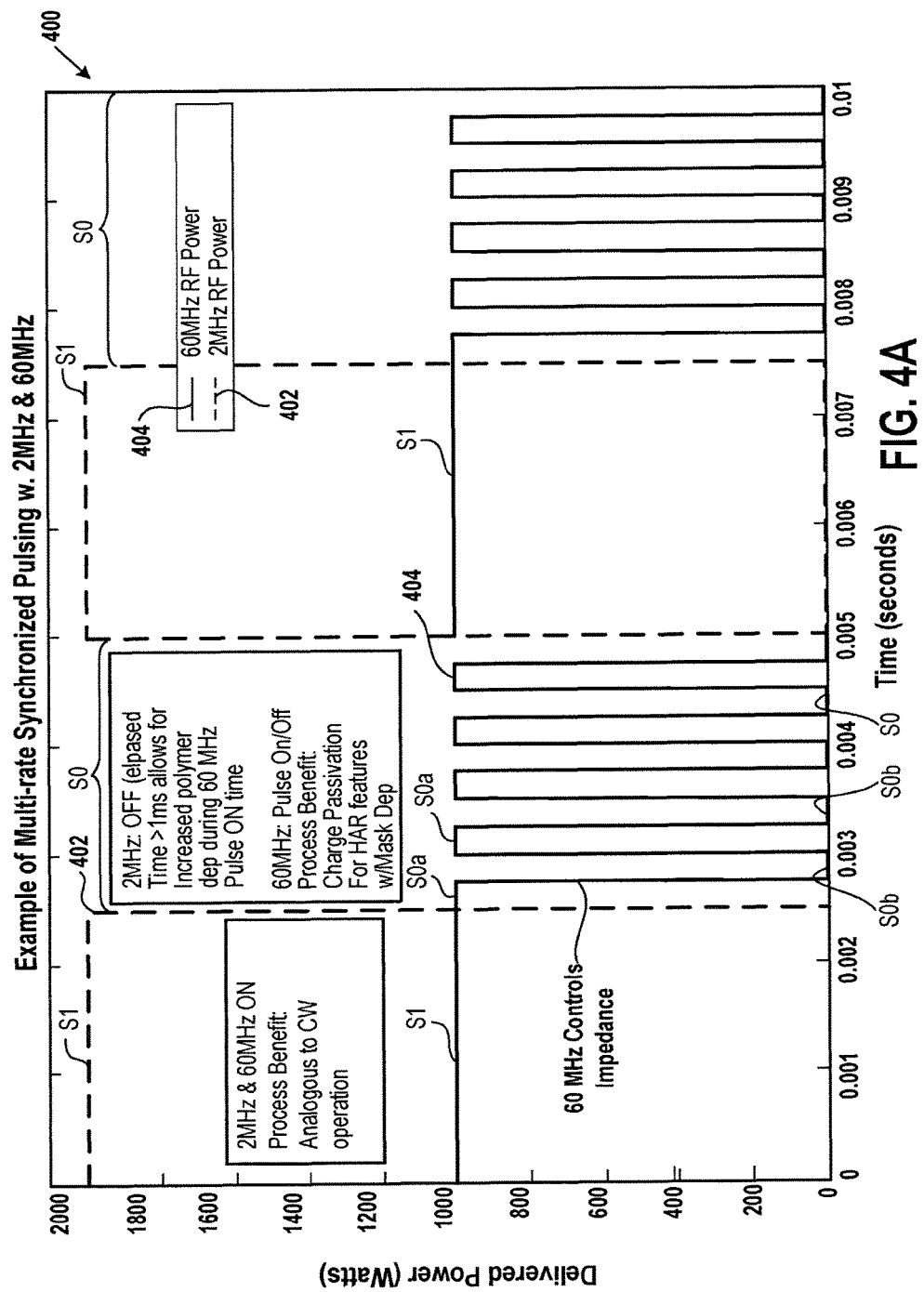

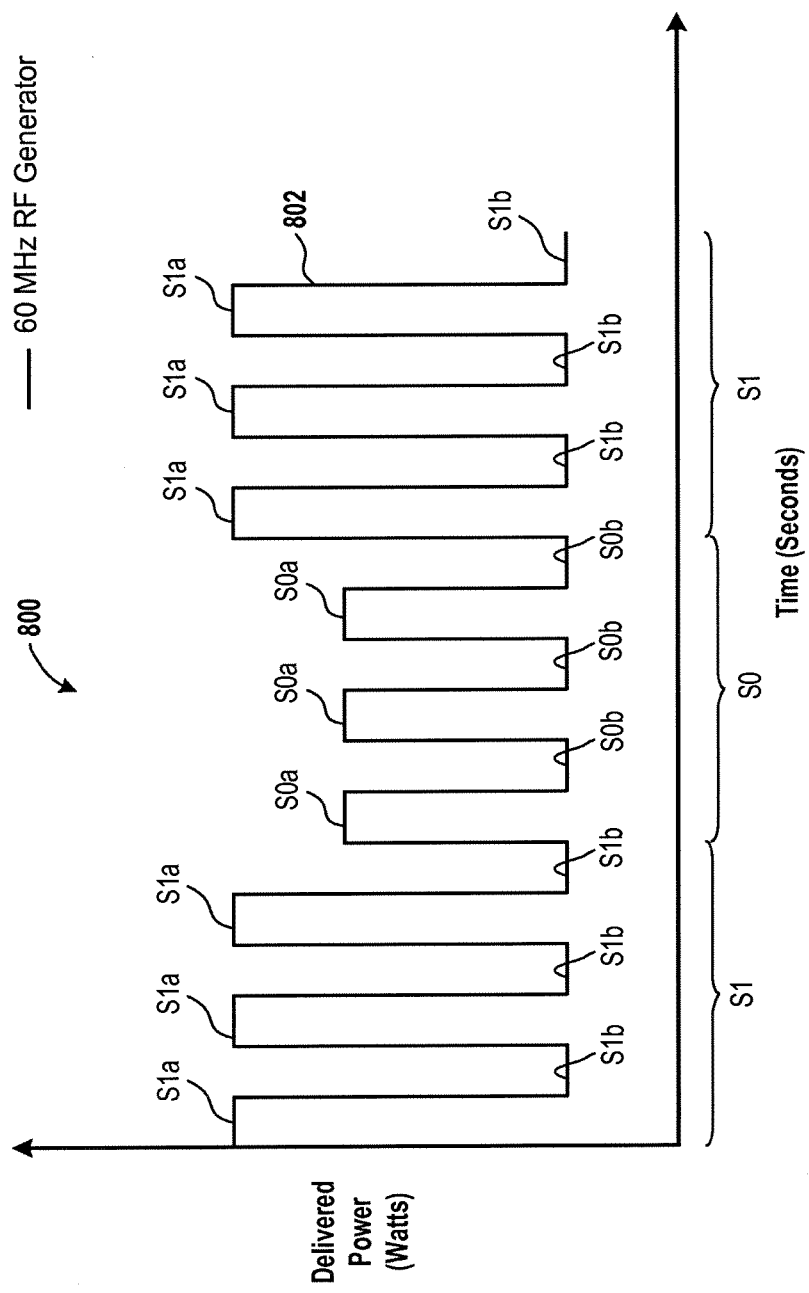

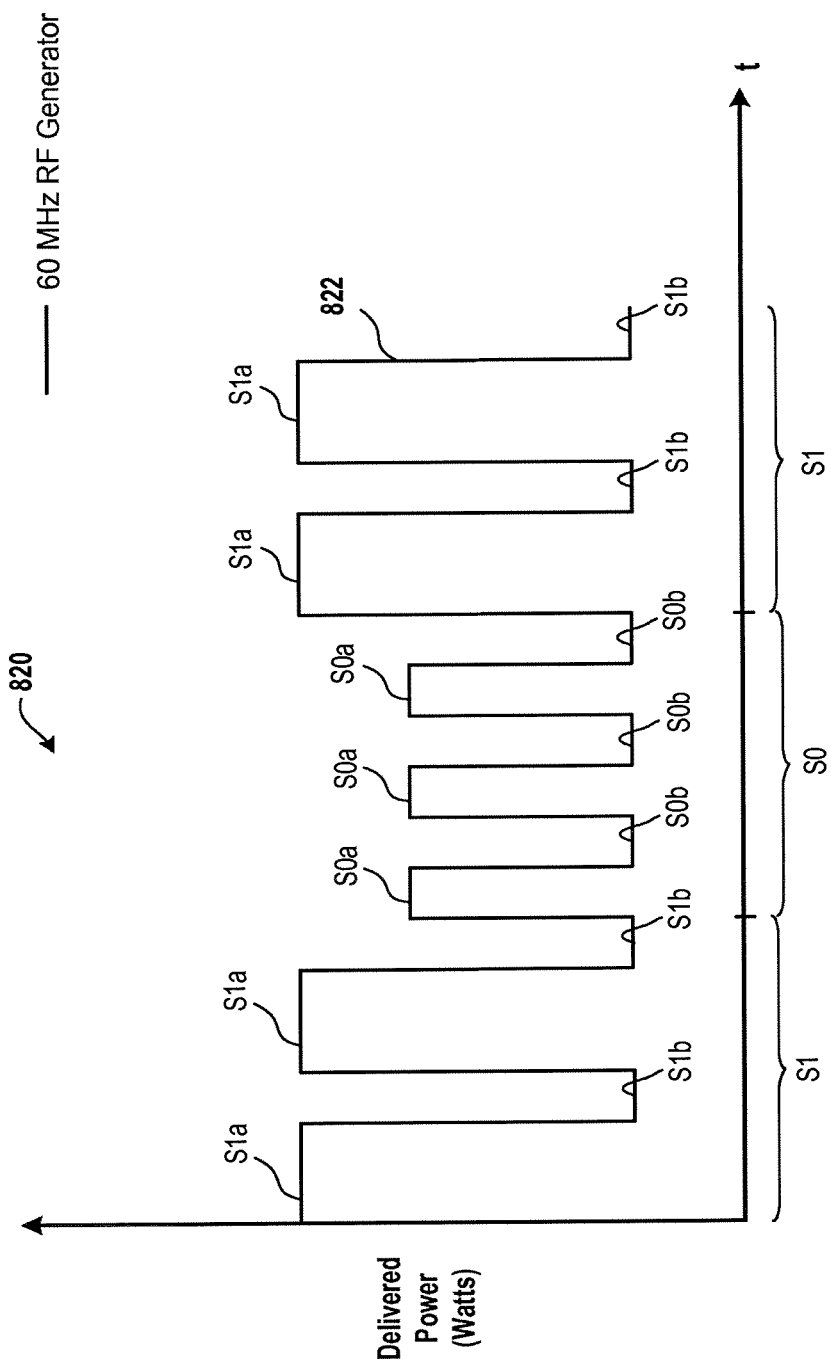

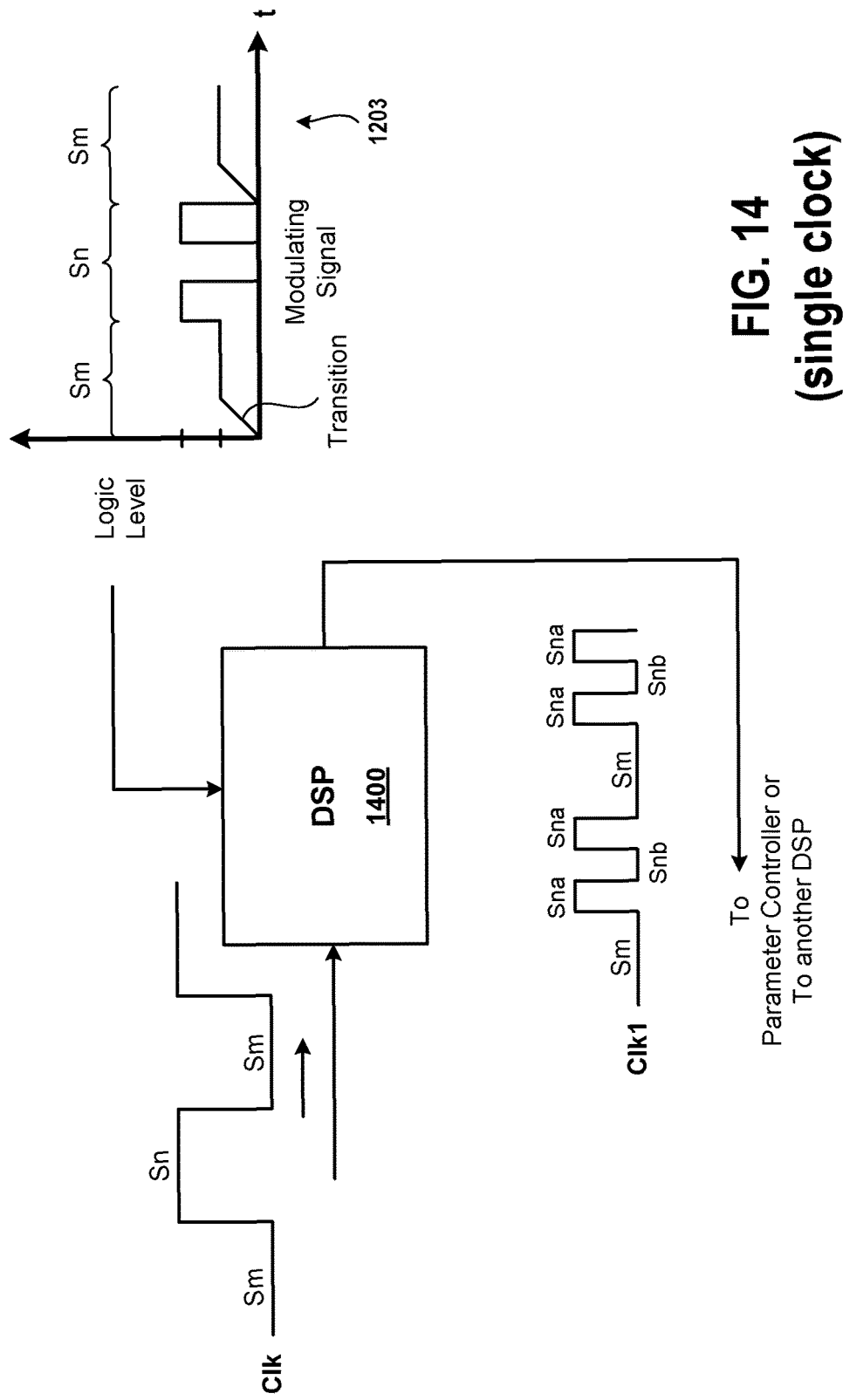
FIG. 14 (single clock)

SUB-PULSING DURING A STATE

CLAIM OF PRIORITY

The present patent application is a continuation of and claims the benefit of and priority, under 35 U.S.C. § 120, to application Ser. No. 15/172,004, filed on Jun. 2, 2016, and titled "Sub-pulsing During a State", which is a divisional of and claims the benefit of and priority, under 35 U.S.C. § 120, to application Ser. No. 14/466,724, filed on Aug. 22, 2014, and titled "Sub-pulsing During a State", now issued as U.S. Pat. No. 9,390,893 on Jul. 12, 2016, which is a continuation-in-part of and claims the benefit of and priority, under 35 U.S.C. § 120, to application Ser. No. 13/620,386, filed on Sep. 14, 2012, and titled "State-based Adjustment of Power and Frequency", now issued as U.S. Pat. No. 9,197,196 on Nov. 24, 2015, all of which are incorporated by reference herein in their entirety for all purposes.

The application Ser. No. 13/620,386 claims the benefit of and priority, under 35 U.S.C. § 119(e), to U.S. Provisional Patent Application No. 61/602,040, filed on Feb. 22, 2012, and titled "Frequency Enhanced Impedance Dependent Power Control For Multi-frequency RF Pulsing", which is incorporated by reference herein in its entirety for all purposes.

The application Ser. No. 13/620,386 is a continuation-in-part of and claims the benefit of and priority, under 35 U.S.C. § 120, to U.S. patent application Ser. No. 13/531,491, filed on Jun. 22, 2012, and titled "Methods and Apparatus For Controlling Plasma In A Plasma Processing System", now issued as U.S. Pat. No. 9,114,666 on Aug. 25, 2015, which claims the benefit of and priority, under 35 U.S.C. § 119(e), to U.S. Provisional Patent Application No. 61/602,040, filed on Feb. 22, 2012, and titled "Frequency Enhanced Impedance Dependent Power Control For Multi-frequency RF Pulsing" and claims the benefit of and priority, under 35 U.S.C. § 119(e), to U.S. Provisional Patent Application No. 61/602,041, filed on Feb. 22, 2012, and titled "Methods and Apparatus for Synchronizing RF Pulses in a Plasma Processing System", all of which are incorporated by reference herein in their entirety for all purposes.

FIELD

The present embodiments relate to creating sub-pulses during a state of a radio frequency (RF) generator.

BACKGROUND

Plasma chambers are used to perform a variety of processes, e.g., etching, depositing, etc. For example, a gas is supplied to the plasma chamber when power is supplied to the chamber. Plasma is stricken when the power is supplied while the gas is in the plasma chamber. The plasma is used to etch a substrate or to clean the plasma chamber. Also, materials are deposited on the substrate by using liquid or gas flows into the chamber.

However, controlling the processes is a difficult task. For example, the materials on the substrate are etched too much or too little. As another example, layers deposited on the substrate have a greater thickness than that desired or have lesser thickness that that desired.

It is in this context that embodiments described in the present disclosure arise.

SUMMARY

Embodiments of the disclosure provide apparatus, methods and computer programs for sub-pulsing within a state. It should be appreciated that the present embodiments can be implemented in numerous ways, e.g., a process, an apparatus, a system, a device, or a method on a computer-readable medium. Several embodiments are described below.

In some embodiments, a method for achieving sub-pulsing during a state is described. The method includes receiving a clock signal from a clock source, the clock signal having two states and generating a pulsed signal from the clock signal. The pulsed signal has sub-states within one of the states. The sub-states alternate with respect to each other at a frequency greater than a frequency of the states. The method includes providing the pulsed signal to control power of a radio frequency (RF) signal that is generated by an RF generator. The power is controlled to be synchronous with the pulsed signal.

In various embodiments, an RF generator is described. The RF generator includes a processor. The processor receives a clock signal from a clock source. The clock signal has two states. The processor generates a pulsed signal from the clock signal. The pulsed signal has sub-states within one of the states. The sub-states have a frequency greater than a frequency of the states. The processor provides the pulsed signal to control power of an RF signal. The power is controlled to be synchronous with the pulsed signal. The RF generator includes an RF power supply coupled to the processor. The RF power supply generates the RF signal having the power for providing the RF signal to a plasma chamber via an impedance matching circuit.

In various embodiments, a plasma system is described. The plasma system includes a processor that receives a clock signal from a clock source. The clock signal has two states. The processor generates a pulsed signal from the clock signal. The pulsed signal has sub-states within one of the states and the sub-states have a frequency greater than a frequency of the states. The processor provides the pulsed signal to control power of a radio frequency (RF) signal. The power is controlled to be synchronous with the pulsed signal. The plasma system further includes an RF power supply for generating the RF signal having the power. The plasma system also includes an RF cable coupled to the RF power supply. The plasma system includes an impedance matching circuit coupled to the RF power supply for receiving the RF signal via the RF cable. The impedance matching circuit matches an impedance of a load coupled to the impedance matching circuit with that of a source coupled to the impedance matching circuit to generate a modified RF signal from the RF signal. The plasma system includes a plasma chamber coupled to the impedance matching circuit for receiving the modified RF signal for changing an impedance of plasma.

Some advantages of the above-described embodiments include use of sub-pulsing within a state to create sub-states within the state. The sub-pulsing when used by a low frequency RF generator, e.g., a 2 MHz RF generator, etc., results in coarse control of processing a wafer, e.g., a substrate, a substrate with one or more layers of one or more materials deposited on the substrate, etc. For example, when an RF signal that is generated by the low frequency RF generator is sub-pulsed within a state, further coarse control of etching or depositing materials on the substrate is achieved compared to that when the RF signal is not sub-pulsed. Moreover, sub-pulsing when used by a high frequency RF generator, e.g., a 60 MHz RF generator, etc. results in fine control of processing the wafer. For example, when an RF signal that is generated by the high frequency RF generator is sub-pulsed within a state, further granular control of etching or depositing materials on the substrate is achieved compared to that when the RF signal is not sub-pulsed. It should be noted that in some embodiments, the granular control is for achieving a range of rates that is within a range of rates associated with the coarse control.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 4A is a graph illustrating the x MHz RF generator operating in two states S1 and S0, and the y MHz RF generator operating in the state S1, a state S0$a$, and a state S0$b$, in accordance with some embodiments described in the present disclosure.

FIG. 8A is a graph to illustrate sub-pulsing of an RF signal that is generated by the y MHz RF generator during both the states S1 and S0, in accordance with some embodiments described in the present disclosure.

FIG. 8C is a diagram of a graph to illustrate a different duty cycle during the state S0 than during the state S1, in accordance with various embodiments described in the present disclosure.

FIG. 14 is a diagram of a DSP that uses a modulating signal to determine whether to generate sub-states Sna and Snb or to generate a state Sm, in accordance with some embodiments described in the present disclosure.

DETAILED DESCRIPTION

The following embodiments describe systems and methods for sub-pulsing within a state. It will be apparent that the present embodiments may be practiced without some or all of these specific details. In other instances, well known process operations have not been described in detail in order not to unnecessarily obscure the present embodiments.

Figure 1:
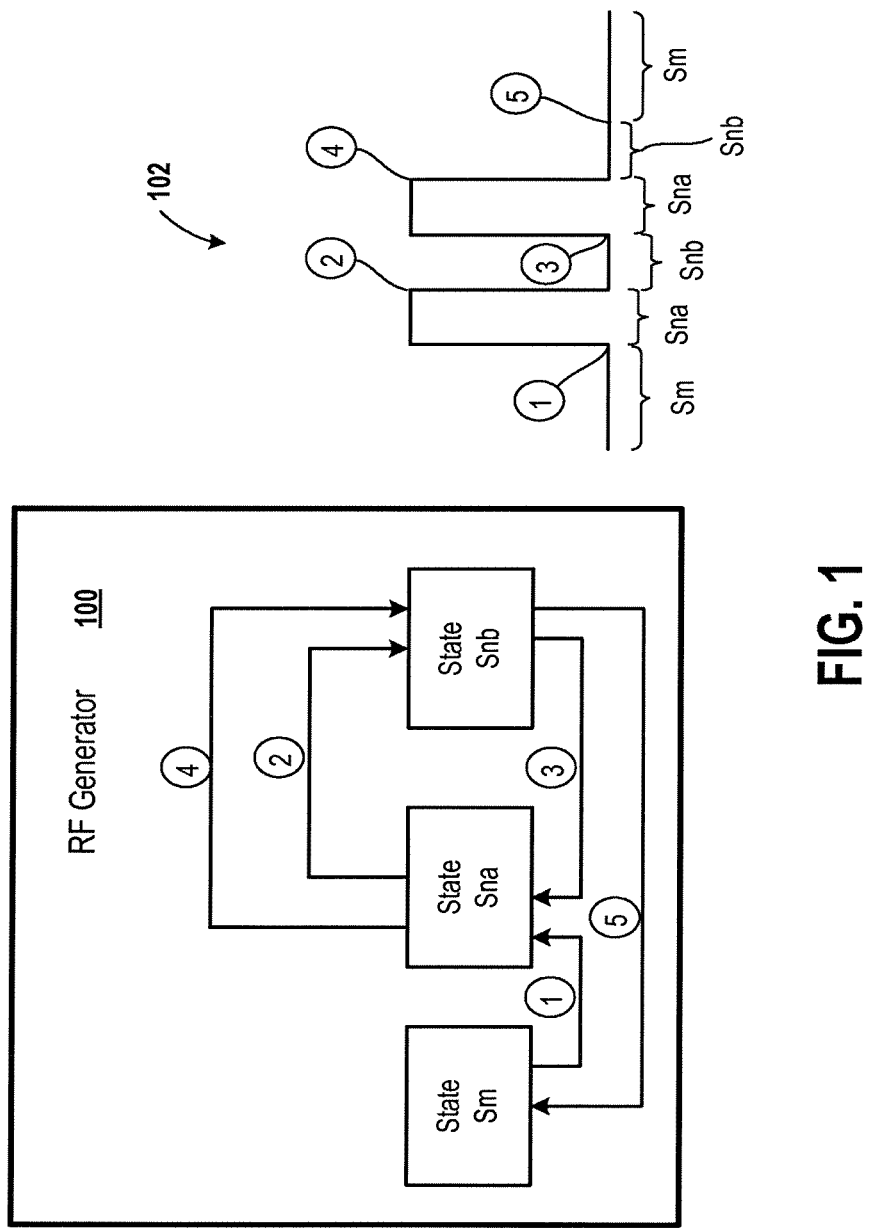
FIG. 1 is a diagram to illustrate sub-pulsing within a state of a radio frequency (RF) signal that is generated by an RF generator, in accordance with some embodiments described in the present disclosure.

FIG. 1 is a diagram of an embodiment of a radio frequency (RF) generator 100 to illustrate sub-pulsing within a state. The RF generator 100 receives a clock signal, e.g., a transistor-transistor logic (TTL) signal, etc., or generates the clock signal. For example, the RF generator 100 receives a clock signal from a clock source or includes the clock source that generates the clock signal. Examples of a clock source include an oscillator, e.g., a crystal oscillator, etc., or an oscillator coupled with a phase-locked loop. The clock signal has states Sm, where m is 1 or 0. For example, the clock signal has a high state and a low state, which is lower than the high state. As another example, the clock signal has a logic level 1 and a logic 0.

The RF generator 100 creates a pulsed signal from the clock signal having the states Sm. For example, the RF generator 100 generates the pulsed signal that transitions from the state Sm to a state Sna and further to a state Snb, where n is 0 or 1. The pulsed signal that is created by the RF generator 100 has a higher frequency than a frequency of the clock signal having the states Sm. For example, the pulsed signal has a higher frequency during the state S1 or S0 than that of the clock signal during the state S1 and the state S0. As another example, the pulsed signal has a higher frequency during the state S1 and S0 than that of the clock signal during the state S1 and the state S0.

In some embodiments, the state S1 has a higher power level than a power level of the state S0. For example, a power level of an RF signal having the state S1 is 2000 watts and a power level of the RF signal during the state S0 is 0 watts. As another example, a power level of an RF signal having the state S1 is greater than 0 watts and a power level of the RF signal during the state S0 is 0 watts. As yet another example, a power level of an RF signal during the state S0 is greater than 0 watts and a power level of the RF signal during the state S1 is greater than the power level of the RF signal during the state S0.

The states Sna and Snb are embedded within the state S1 or the state S0 of the clock signal. For example, the states Sna and Snb occupy one of the states Sm. As another example, the states S1a and S1b occupy the state S1 and do not occupy the state S0. As yet another example, the states S0a and S0b occupy the state S0 and do not occupy the state S1.

As illustrated in a graph 102, the pulsed signal having the states Sna and Snb transitions from the state Sna to the state Snb, further transitions from the state Snb to the state Sna, and then transitions from the state Sna to the state Snb, and then to the state Sm.

Figure 2A:
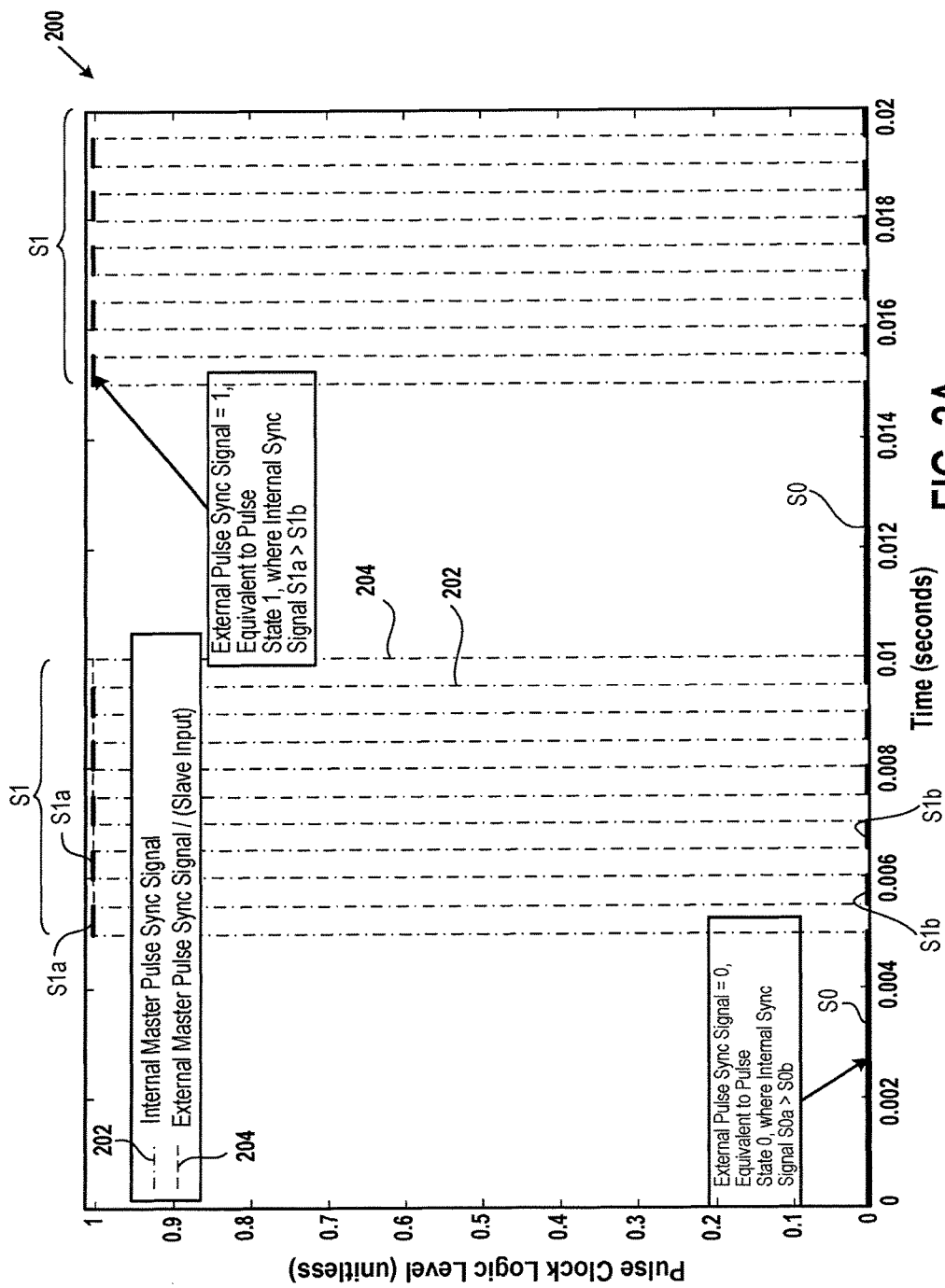
FIG. 2A is a graph to illustrate sub-pulsing within a state for an x megahertz (MHz) RF generator, in accordance with some embodiments described in the present disclosure.

FIG. 2A is an embodiment of a graph 200 to illustrate sub-pulsing within a state for an x megahertz (MHz) RF generator, where x is 2. In some embodiments, x is within a pre-determined range of 2. For example, x is within 1 MHz of 2. As another example, x is 2.5. As yet another example, x is 1.5.

In various embodiments, x is 27. In various embodiments, x is within a pre-determined range of 27. For example, x is within 2 MHz of 27. As another example, x is 25.5. As yet another example, x is 29. As yet another example, x is within 5 MHz of 27.

The graph 200 plots a logic level of a pulsed signal 202 etc., versus time, which is measured in seconds. The pulsed signal 202 is created from a clock signal 204, e.g., a TTL1 signal, etc. For example, the pulsed signal 202 is created from the clock signal 204 by modulating the clock signal 204 with a modulating signal, e.g. a TTL2 signal, etc., to arrive at the pulsed signal 202. As another example, the pulsed signal 202 is created when an amplitude, e.g., a power level, etc., of the clock signal 204 is multiplied with an amplitude of a signal that is the same as that of the pulsed signal 202. The pulsed signal 202 is an example of a digital pulsed signal TTL3.

During the state S0 of the clock signal 204, the pulsed signal 202 has one logic level, e.g., a logic level of 0, a logic level of 0.5, a logic level of 0.2, etc. During the state S1 of the clock signal 204, the pulsed signal 202 has multiple logic levels, e.g., a logic level of 1 and a logic level of 0, a logic level of 0.5 and a logic level of 1, a logic level of 0.9 and a logic level of 0, etc. During the state S1 of the clock signal 204, the pulsed signal 202 transitions, e.g., alternates, etc., between the states S1a and S1b. A frequency of transition between the states S1a and S1b of the pulsed signal 202 is greater than a frequency of transition between the states S1 and S0 of the clock signal 204. For example, a frequency of transition between the states S1b and S1a is four times greater than a frequency of transition between the states S0 and S1. As another example, a frequency of transition between the states S1b and S1a is five times greater than a frequency of transition between the states S0 and S1. As yet another example, a frequency of transition between the states S1b and S1a is between two times and 100 times greater than a frequency of transition between the states S0 and S1.

It should be noted that in various embodiments, the pulsing of the signal 202 between the states S1a and S1b facilitates a chemistry impasse, e.g., time for entry of gases, etc., to occur within a plasma chamber or allows achievement of a pressure within the plasma chamber or allows achievement of a temperature in the plasma chamber or allows achievement of a gap between a lower electrode and an upper electrode of the plasma chamber. Moreover, in some embodiments, the pulsing of the signal 202 between the states S1a and S1b is done to control etching of a substrate or of a layer deposited on the substrate. In several embodiments, the pulsing of the signal 202 between the states S1a and S1b reduces chances of creation of an amount of energy to destroy features, e.g., deposited layers, silicon, traces, etc., of a wafer or features, e.g., circuit components, etc., of a substrate overlaid with an integrated circuit. Furthermore, in some embodiments, the state S1a facilitates creation of an amount of energy to creates an amount of ions within the plasma chamber and the state S1B facilitates movement of the ions within the plasma chamber to facilitate a process, e.g., etching, cleaning, lowering a rate of deposition compared to that during the state S0, etc.

It should be noted that during the state S0 of the clock signal 204, an amount of power generated by the x MHz RF generator is less than an amount of power generated during the states S1a and S1b of the pulsed signal 204. The lesser amount of power results in a lower amount of ion energy of ions of plasma than that generated during the states S1a and S1b and/or in a lower density of the ions than that during the states S1a and S1b.

Figure 2B:
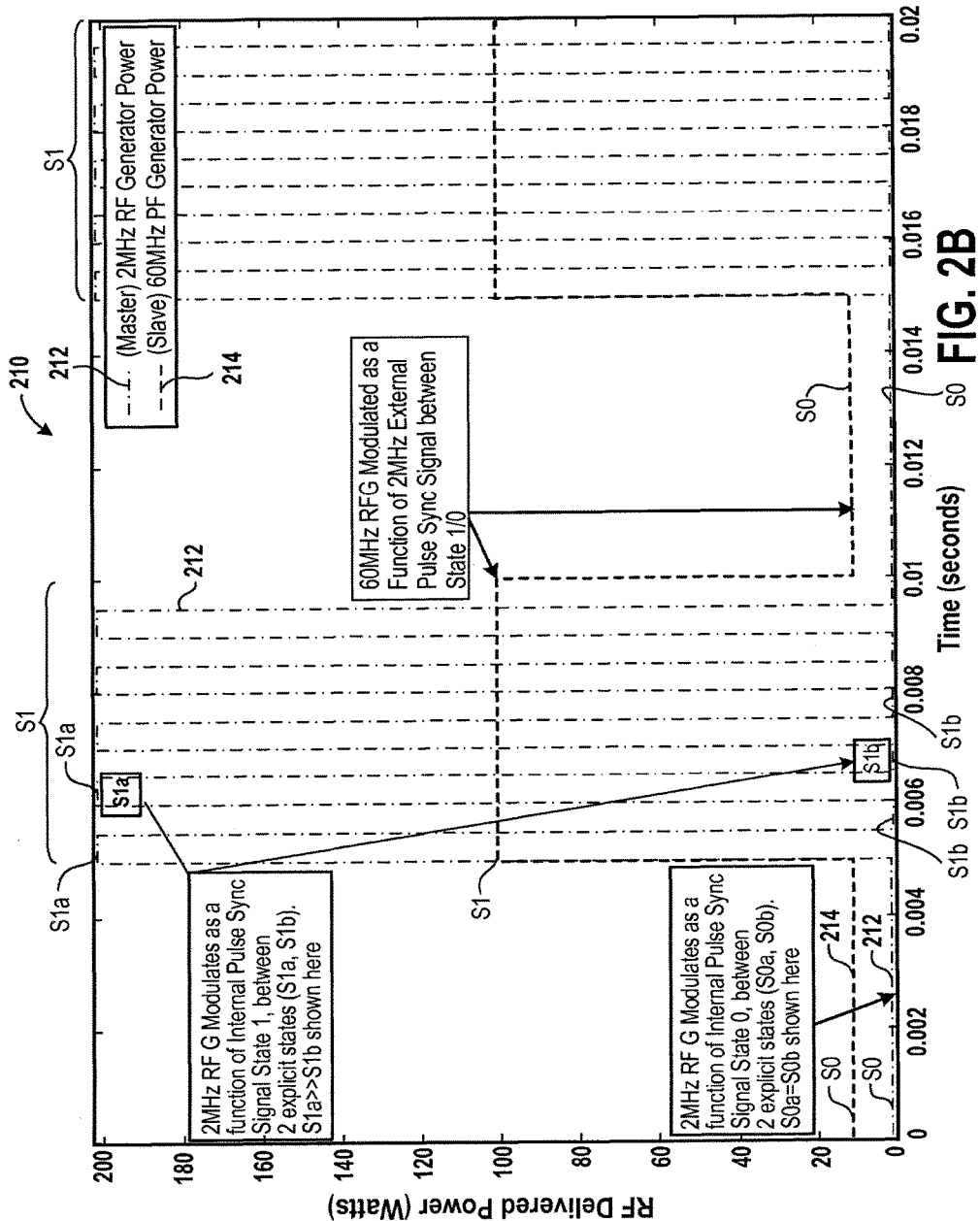
FIG. 2B is a graph to illustrate use of sub-pulsing by the x MHz RF generator with use of pulsing by a y MHz RF generator, in accordance with various embodiments described in the present disclosure.

FIG. 2B is a diagram of an embodiment of a graph 210 to illustrate use of the x MHz RF generator with a y MHz RF generator. Examples of y include 27 and 60. In some embodiments, y is within a pre-determined range of 27. For example, y is between 25 and 29 MHz. As another example, y is between 57 and 63 MHz. As yet another example, y is between 24 and 30 MHz. As another example, y is between 55 and 65 MHz.

In some embodiments, when x is 2, y is 27. In various embodiments, when x is 27, y is 60. In several embodiments, when x is 2, y is 60.

The graph 210 plots delivered power of an RF signal that is generated by an RF generator versus time. It should be noted that delivered power is a difference forward power and reflected power. In some embodiments, the forward power is power that is generated by an RF generator and supplied by the RF generator to a plasma chamber, and the reflected power is power that is reflected towards the RF generator from the plasma chamber.

The graph 210 includes an RF signal 212, which is similar to the pulsed signal 202 (FIG. 2A). For example, the RF signal 212 has the states S0, S1a, and S1b, and transitions among the states S0, S1a, and S1b in a manner similar to that in which the pulsed signal 202 transitions among the states. The RF signal 212 has the same frequency as that of the pulsed signal 202 and as that of the TTL3 signal. The RF signal 212 is produced from delivered power that is generated based on an RF signal supplied by the x MHz RF generator and an RF signal that is reflected towards the x MHz RF generator.

During the state S0 of the RF signal 212, the y MHz generator supplies an RF signal. When the RF signal is supplied by the y MHz RF generator, power is reflected towards the y MHz RF generator from a plasma chamber to further create a delivered power RF signal 214. The RF signal 214 has the state S0 and has the same frequency as that of the TTL1 signal. Moreover, during the states S1a and S1b of the RF signal 212, the RF signal 214 has the state S1. The RF signal 212 transitions between the states S1 and S0. For example, when the RF signal 212 transitions among the states S0, S1a, and S1b, the RF signal 214 transitions between the states S1 and S0.

Figure 2C:
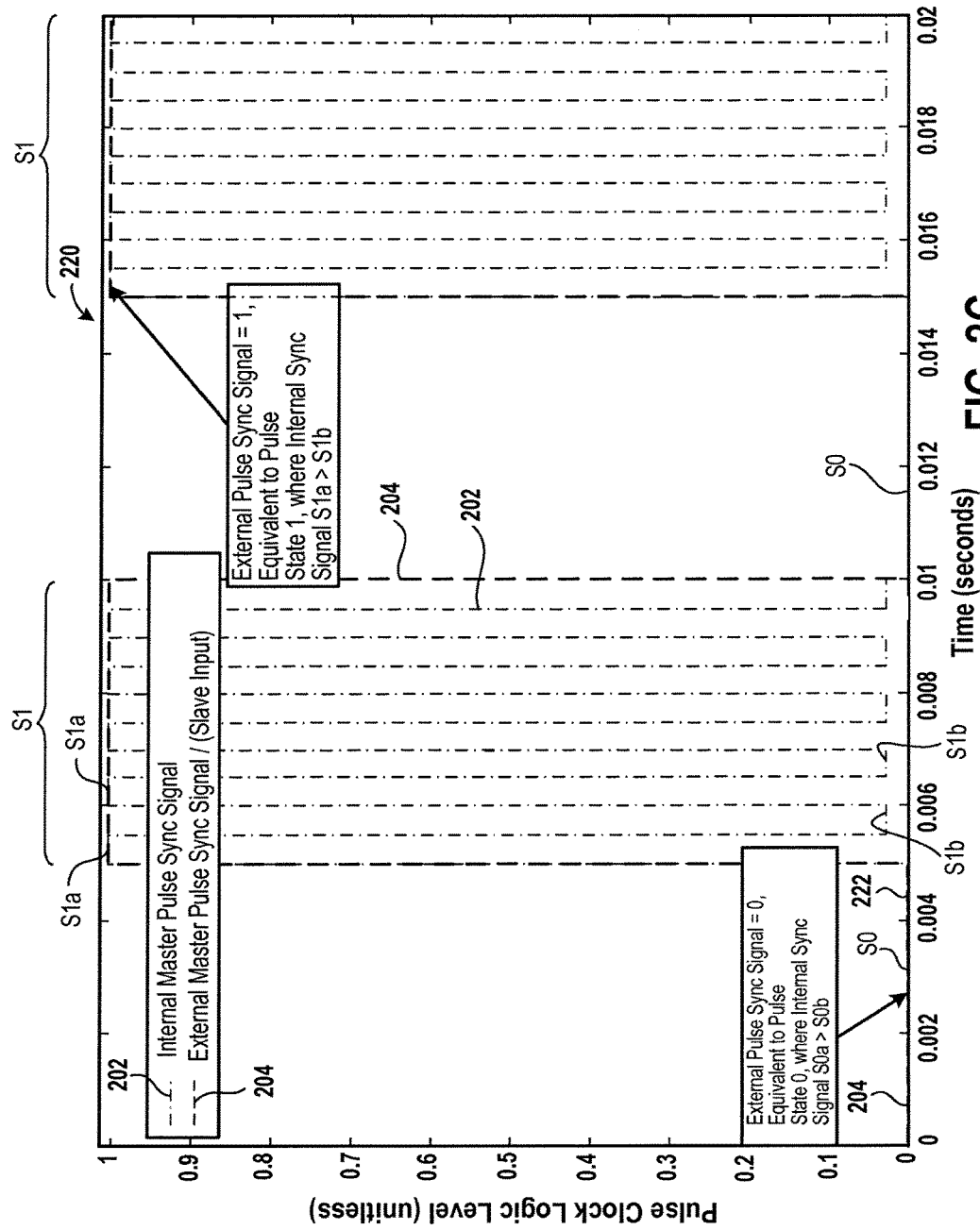
FIG. 2C is a graph to illustrate a signal having a non-zero logic level during a sub-pulsing state S1$b$, in accordance with several embodiments described in the present disclosure.

FIG. 2C is a diagram of an embodiment of a graph 220 to illustrate a pulsed signal 222 having a non-zero logic level during the state S1b. The pulsed signal 222 is similar to the pulsed signal 202 (FIG. 2B) except that the pulsed signal 222 has the non-zero logic level during the state S1b. For example, the pulsed signal 222 is generated in a manner similar to the pulsed signal 202 except that the pulsed signal 222 drops from the state S1a to the state S1b, which has a level greater than a level of the state S0 of the pulsed signal 204. The pulsed signal 222 then drops from the level of the state S1b to a level as that of the state S0 to transition from the state S1b to the state S0. The pulsed signal 222 has the same frequency as that of the digital pulsed signal TTL3.

Figure 2D:
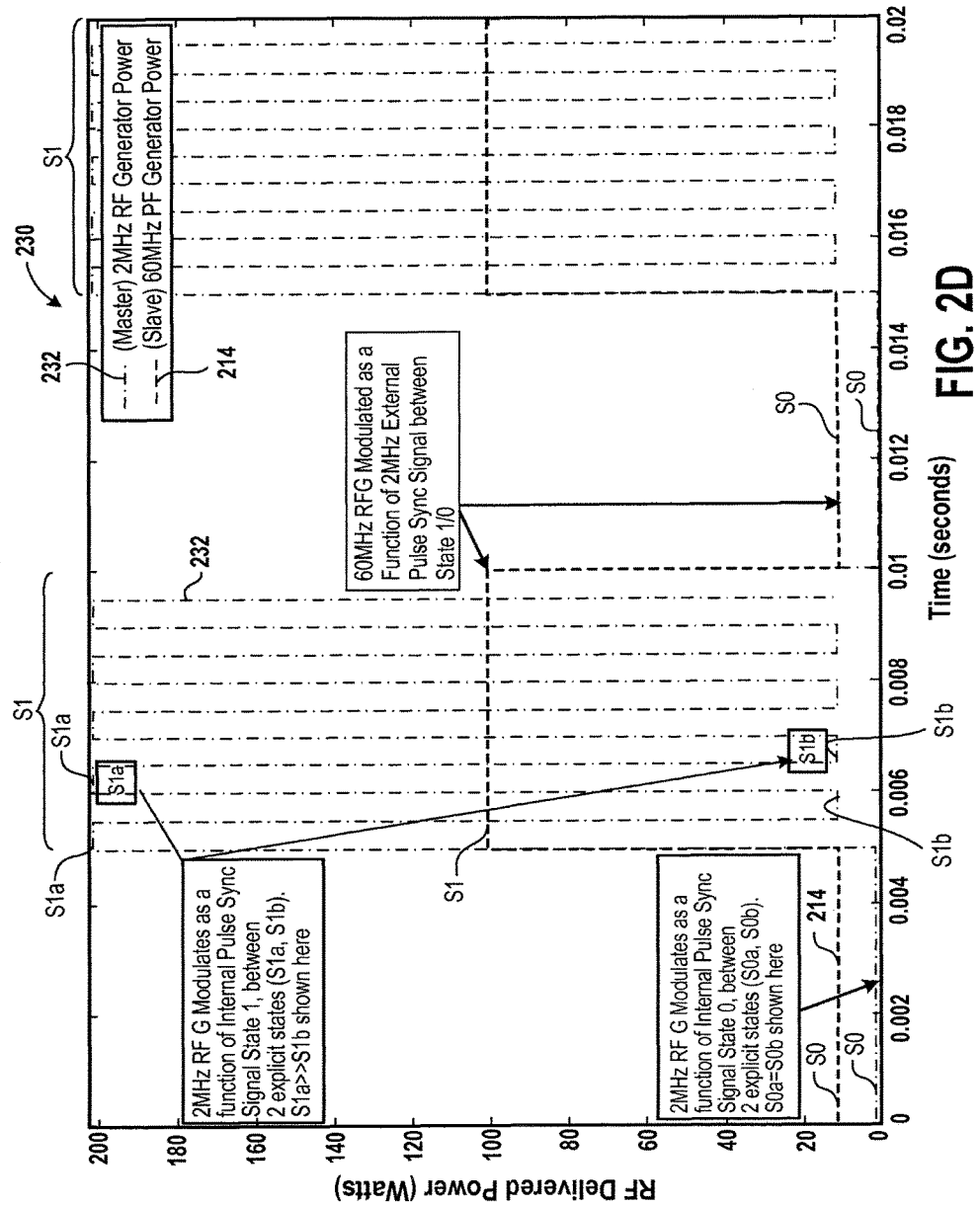
FIG. 2D is a graph to illustrate use of a signal having a non-zero logic level during the sub-pulsing state S1$b$ in conjunction with a pulsed signal that is generated by the y MHz RF generator, in accordance with some embodiments described in the present disclosure.

FIG. 2D is a diagram of an embodiment of a graph 230 to illustrate a use of a pulsed signal 232 having a non-zero logic level during the state S1b in conjunction with the pulsed signal 214 that is generated by the y MHz RF generator. The pulsed signal 232 is similar to the pulsed signal 212 (FIG. 2B) except that the pulsed signal 232 has the non-zero logic level during the state S1b. For example, the pulsed signal 232 is generated in a manner similar to that of the pulsed signal 212 except that the pulsed signal 232 transitions from the state S1a to a level that is higher than a delivered power level of the state S0 of the pulsed signal 214. The higher level is achieved during the state S1b. After achieving the higher level during the state S1b, the pulsed signal 232 transitions to the level of the pulsed signal 214 during the state S0. The pulsed signal 232 has the same frequency as that of the digital pulsed signal TTL3.

It should be noted that although the pulsed signal 214 that is generated based on an RF signal supplied by the y MHz RF generator is shown as having a high amount of a delivered power level of about 100 watts and a low amount of a delivered power level of about 10 watts, in some embodiments, the pulsed signal 214 has a high power level, during the state S1, between 60 watts and 160 watts, and has a low power level, during the state S0, between 1 watt and 55 watts. In various embodiments, a highest power level of a pulsed delivered power signal that is generated based on an RF signal supplied by the x MHz RF generator during the state S1a is greater than a highest power level of a pulsed delivered power signal generated based on an RF signal supplied by the y MHz RF generator during the state S1. In some embodiments, a lowest power level of a delivered power pulsed signal generated based on an RF signal supplied by the x MHz RF generator during the state S0 is lower than a lowest power level of a delivered power pulsed signal generated based on an RF signal that is supplied by the y MHz RF generator during the state S0.

In various embodiments, a time period of the occurrence of the state S0 is the same as a time period of occurrence of both the states S1a and S1b. For example, the state S0 occurs for half a clock cycle of the clock signal TTL1 and the states S1a and S1b occur for the remaining half of the clock cycle. In several embodiments, a time period of occurrence of the state S0 is for less than or greater than half a clock cycle of the clock signal TTL1 and the states S1a and S1b occur for the remaining period of the clock cycle.

Figure 2E:
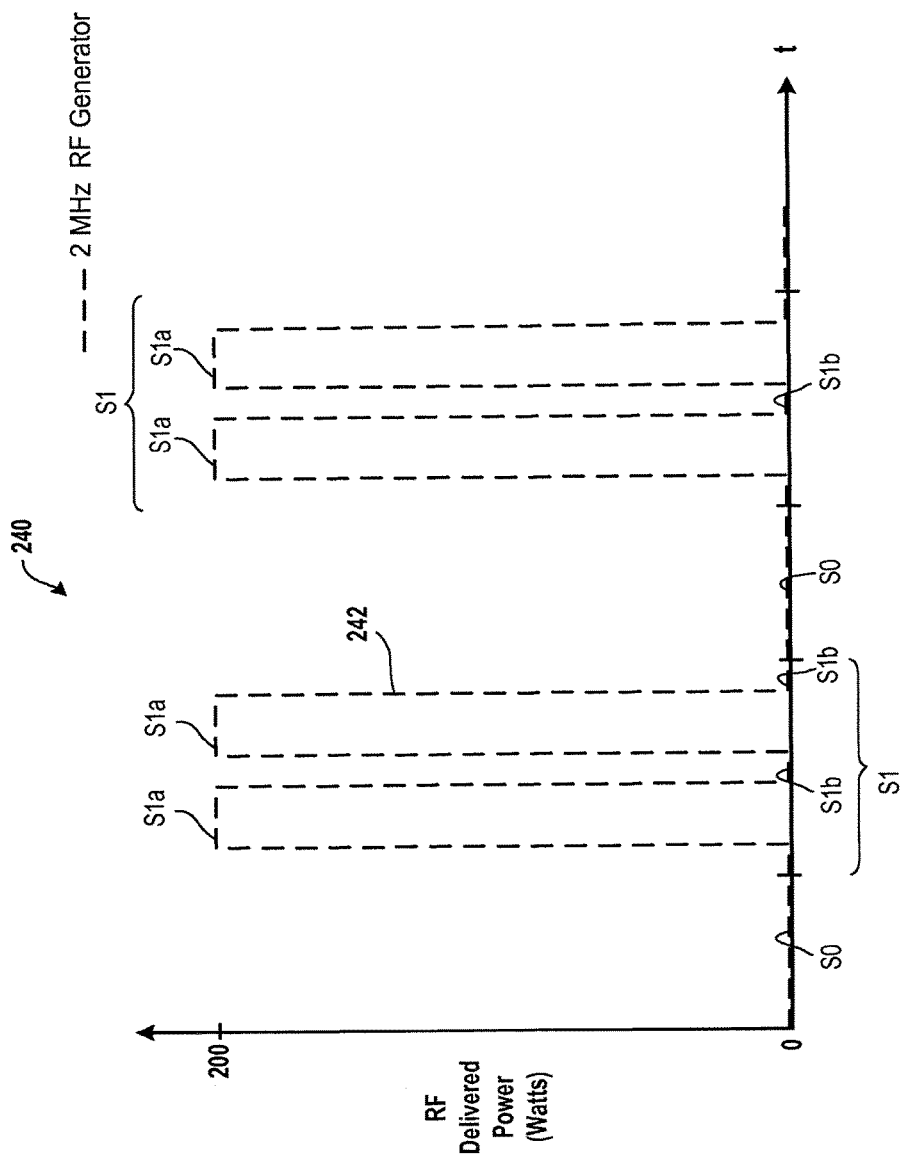
FIG. 2E is a diagram of a graph for illustrating a different duty cycle during a state S1 than a duty cycle of 50%, in accordance with several embodiments described in the present disclosure.

FIG. 2E is a diagram of an embodiment of a graph 240 for illustrating a different duty cycle during the state S1 than a 50% duty cycle. The graph 240 plots power delivered by the 2 MHz RF generator versus time t. The power delivered is shown as a pulsed signal 242. It should be noted that a duty cycle of the signal 242 during the state S1 is greater than 50% and that a time during which the state S1 occurs is the same as that during which the state S0 occurs. For example, the signal 242 occupies a greater amount of time during the state S1a than that occupied during the state S1b. In some embodiments, a duty cycle of the signal 242 during the state S1 is less than 50%. For example, a delivered RF signal occupies a less amount of time during the state S1a than that occupied during the state S1b.

It should further be noted that a duty cycle of each signal 202, 212, 222, and 232 (FIGS. 2A thru 2D) during the state S1 is 50%.

In several embodiments, a time during which the state S1 occurs for power delivered by the x MHz RF generator is lesser than or greater than a time during which the state S0 occurs for the power delivered by the x MHz RF generator. In these embodiments, a duty cycle of the delivered power during the state S1 is 50%.

In various embodiments, a time during which the state S1 occurs for power delivered by the x MHz RF generator is lesser than or greater than a time during which the state S0 occurs for the power delivered by the x MHz RF generator. In these embodiments, a duty cycle of the delivered power during the state S1 is greater than or less than 50%.

In some embodiments, a TTL signal has the same frequency as that of the pulsed signal 242 during the state S1. The TTL signal is generated by a device that generates the TTL3 signal. For example, a digital signal processor (DSPx) of an x MHz RF generator, which is described below, generates the TTL signal from the TTL1 signal and a modulating signal. The modulating signal modulates the TTL1 signal to generate the TTL signal.

Figure 3A:
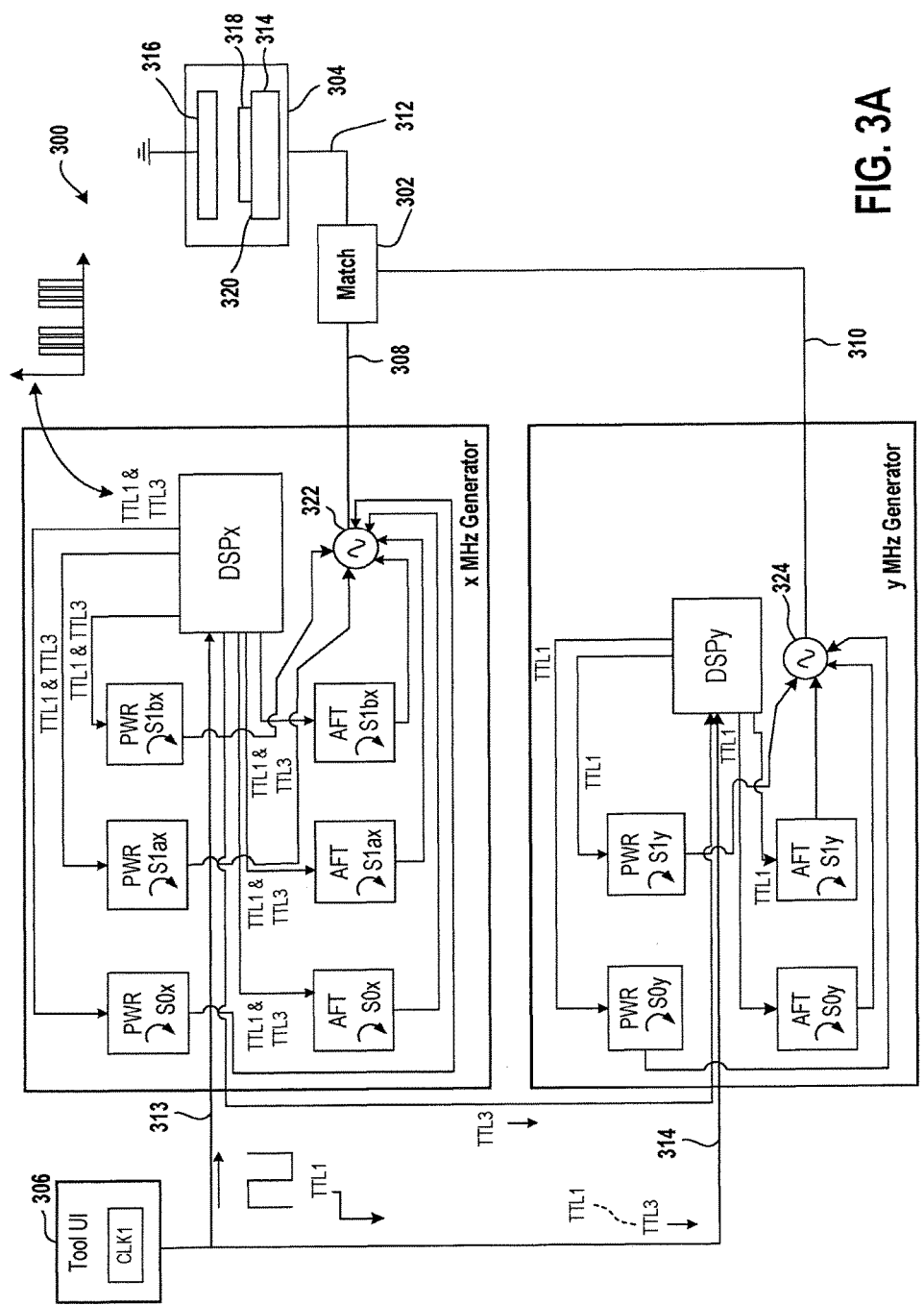
FIG. 3A is a diagram of a system for controlling an energy of ions during states S0, S1$a$ and S1$b$, in accordance with various embodiments described in the present disclosure.

FIG. 3A is a diagram of an embodiment of a system 300 for controlling an energy of ions during the state S1 of the TTL1 signal. The system 300 includes the x MHz RF generator and the y MHz RF generator. The system 300 further includes an impedance matching circuit 302, a plasma chamber 304, and a tool user interface (UI) system 306. Examples of the tool UI system 306 include a desktop computer, a server, a virtual machine, a laptop computer, a tablet, a cell phone, smart phone, etc. In various embodiments, the tool UI system 306 includes a processor and a memory device, examples of which are provided below. In some embodiments, the tool UI system 306 is coupled to the x and y MHz RF generators via a computer network, e.g., a wide area network (WAN), a local area network (LAN), the Internet, an Intranet, etc.

The impedance matching circuit 302 is coupled to an output of the x MHz RF generator via an RF cable 308. Similarly, the impedance matching circuit 302 is coupled to an output of the y MHz RF generator via an RF cable 310. The impedance matching circuit 302 matches an impedance of a load coupled to the impedance matching circuit 302 at one side with an impedance of a source coupled to the impedance matching circuit 302 at another side. For example, the impedance matching circuit 302 matches an impedance of an RF transmission line 312 and the plasma chamber 304 with an impedance of the x MHz RF generator, the y MHz RF generator, the RF cable 308, and the RF cable 310.

The plasma chamber 304 is coupled to the impedance matching circuit 302 via the RF transmission line 312. The plasma chamber 304 includes a chuck 314, an upper electrode 316, and other parts (not shown), e.g., an upper dielectric ring surrounding the upper electrode 316, an upper electrode extension surrounding the upper dielectric ring, a lower dielectric ring surrounding a lower electrode of the chuck 314, a lower electrode extension surrounding the lower dielectric ring, an upper plasma exclusion zone (PEZ) ring, a lower PEZ ring, etc. The upper electrode 316 is located opposite to and facing the chuck 314. A wafer 318, e.g., a dummy wafer, a semiconductor wafer, etc., is supported on an upper surface 320 of the chuck 314. Various processes, e.g., chemical vapor deposition, cleaning, deposition, sputtering, etching, ion implantation, resist stripping, etc., are performed on the semiconductor wafer during production. Integrated circuits, e.g., an application specific integrated circuit (ASIC), a programmable logic device (PLD), etc. are developed on the semiconductor wafer and the integrated circuits are used in a variety of electronic items, e.g., cell phones, tablets, smart phones, computers, laptops, networking equipment, etc.

Each of the lower electrode and the upper electrode 316 is made of a metal, e.g., aluminum, alloy of aluminum, copper, etc. The chuck 314 may be an electrostatic chuck (ESC) or a magnetic chuck.

The tool UI system 306 includes a clock source that generates a clock signal, e.g., a digital pulsed signal, the TTL1 signal, etc., that is supplied via a cable 313 to the DSPx of the x MHz RF generator. As used herein, a processor may be a central processing unit (CPU), a microprocessor, an ASIC, a PLD, a controller, etc. The clock signal TTL1 is also supplied by the tool UI system 306 via a cable 314 to a DSP (DSPy) of the y MHz RF generator. Examples of each cable 313 and 314 include a universal serial bus (USB) cable, a serial cable, a parallel cable, an Ethernet cable, etc.

The tool UI system 306 provides a recipe, e.g., a data file, etc., that includes performance parameters, e.g., a duty cycle, a time interval for occurrence and existence of a state, a power level, a frequency level, etc., to each of the x and y MHz RF generators. For example, the tool UI system 306 provides a recipe that is used to operate the x MHz RF generator to the DSPx and a recipe that is used to operate the y MHz RF generator to the DSPy. The recipe is stored in each of the DSPx and the DSPy.

The DSPx receives the clock signal TTL1 and generates a digital pulsed signal, e.g., a TTL3 signal, etc., from the clock signal TTL1. For example, the DSPx receives the clock signal TTL1 and modifies the clock signal TTL1 during the state S1 to add sub-pulses during the state S1 of the TTL1 signal. As another example, the DSPx receives the clock signal TTL1 and modifies the clock signal TTL1 during the state S1 to increase a frequency of the clock signal TTL1 during the state S1 to generate the digital pulsed signal TTL3. In this example, the DSPx does not modify the clock signal TTL1 during the state S0. As yet another example, the DSPx receives the clock signal TTL1 and includes a clock source that generates the clock signal TTL2. The clock signal TTL2 has the same frequency as that of the digital pulsed signal TTL3 during the state S1. Also, the clock signal TTL1 has the same frequency as that of the clock signal TTL3 during the state S0. The DSPx multiplies the clock signal TTL1 with the clock signal TTL2 to generate the clock signal TTL3.

In several embodiments, instead of receiving the clock signal TTL1 from the tool UI system 306, the DSPx includes a clock source that generates the clock signal TTL1. In various embodiments, instead of receiving the clock signal TTL1 from the tool UI system 306, the x MHz RF generator includes a clock source that generates the clock signal TTL1.

In various embodiments, the clock signal TTL2 is received from a clock source located within the tool UI system 306. In some embodiments, the clock signal TTL2 is generated by a clock source within the x MHz RF generator.

During the state S1b, the digital pulsed signal TTL3 and the clock signal TTL1 are provided from the DSPx to a power controller PWRS1bx for the state S1b and to an auto frequency tuner (AFT) AFTS1bx for the state S1b. For example, a portion of the TTL3 signal having the state S1b is provided from the DSPx to the power controller PWRS1*bx* and to the tuner AFTS1*bx*.

In some embodiments, a power controller of an RF generator and an AFT of the RF generator are parts of a DSP of the RF generator. For example, auto frequency tuners AFTS0*x*, AFTS1*ax*, and AFTS1*bx*, and power controllers PWRS1*ax*, PWRS1*bx*, and PWRS0*x* of the x MHz RF generator are circuits that are integrated within a circuit of the DSPx. As another example, the tuners AFTS0*x*, AFTS1*ax*, and AFTS1*bx*, and the power controllers PWRS1*ax*, PWRS1*bx*, and PWRS0*x* are portions of a computer program that is executed by the DSPx.

The power controller PWRS1*bx* receives the digital pulsed signal TTL3 for the state S1*b* and receives the clock signal TTL1 for the state S1, and determines or identifies a power level of an RF signal that is to be generated and supplied by the x MHz RF generator. The power level of the RF signal to be generated and supplied by the x MHz RF generator has the same frequency as that of the digital pulsed signal TTL3 during the state S1*b*. In some embodiments, the power level corresponding to, e.g., mapped to, linked to, etc., the state S1*b* of the TTL3 signal and corresponding to the state S1 of the TTL1 clock signal is stored in a memory device of the power controller PWRS1*bx*. Examples of a memory device include a read-only memory (ROM), a random access memory (RAM), or a combination thereof. In some embodiments, a memory device is a flash memory, a redundant array of storage disks (RAID), a hard disk, etc.

In various embodiments, the power level for the state S1*b* of the TTL3 signal and for the state S1 of the TTL1 signal is determined based on a processing rate to be achieved, e.g., an etch rate to be achieved, a deposition rate to be achieved, a cleaning rate to be achieved, a sputtering rate to be achieved, etc. The etch rate is a rate of etching the wafer 318. The deposition rate is a rate of depositing materials, e.g., polymers, photo-mask, monomers, etc., on the wafer 318. The cleaning rate is a rate of cleaning the wafer 318, e.g., via etching, via depositing, via depositing and etching, etc. The sputtering rate is a rate of sputtering the wafer 318 or of materials deposited on the wafer 318.

Moreover, the tuner AFTS1*bx* receives the digital pulsed signal TTL3 for the state S1*b* and receives the clock signal TTL1 for the state S1, and determines or identifies an amount of a radio frequency or a set of amounts of radio frequencies of the RF signal that is to be generated by the x MHz RF generator. In some embodiments, the amount of radio frequency or the set of amounts of radio frequencies corresponding to the state S1*b* of the TTL3 signal and corresponding to the state S1 of the TTL1 clock signal is stored in a memory device of the tuner AFTS1*bx*.

The power level corresponding to the state S1*b* of the TTL3 signal and to the state S1 of the TTL1 clock signal is provided from the power controller PWRS1*bx* to an RF power supply 322 of the x MHz RF generator. Moreover, the amount of radio frequency or the set of amounts of radio frequencies is provided by the tuner AFTS1*bx* to the RF power supply 322. Upon receiving the power level for the state S1*b* of the TTL3 signal and for the state S1 of the TTL1 clock signal and the amount of radio frequency or the set of amounts of radio frequencies, the RF power supply 322 generates the RF signal having the power level and the amount of radio frequency or the set of amounts of radio frequencies. The RF signal that is generated by the RF power supply 322 is supplied via the RF cable 308 to the impedance matching circuit 302.

Furthermore, during the state S1 of the TTL1 signal, the DSPy of the y MHz RF generator provides the clock signal TTL1 to a power controller PWRS1*y* of the y MHz RF generator. Moreover, the DSPy of the y MHz RF generator provides the clock signal TTL1 to a tuner AFTS1*y* of the y MHz RF generator. Upon receiving the clock signal TTL1, the power controller PWRS1*y* determines or identifies a power level of an RF signal to be generated by the y MHz RF generator. For example, a correspondence, e.g., a matching, a link, a one-to-one relationship, etc., between a state of the clock signal TTL1 and a power level of the RF signal to be generated by the y MHz RF generator is stored in a memory device of the power controller PWRS1*y*.

Moreover, upon receiving the clock signal TTL1, the tuner AFTS1*y* determines or identifies an amount of a radio frequency or a set of amounts of radio frequencies of the RF signal to be generated by the y MHz RF generator. For example, a correspondence between a state of the clock signal TTL1 and an amount of a radio frequency or a set of amounts of radio frequencies of the RF signal to be generated by the y MHz RF generator is stored in a memory device of the tuner AFTS1*y*.

The power level corresponding to the state S1 is provided from the power controller PWRS1*y* to an RF power supply 324 of the y MHz RF generator. Moreover, the amount of radio frequency or the set of amounts of radio frequencies is provided by the tuner AFTS1*y* to the RF power supply 324. Upon receiving the power level for the state S1 and the amount of radio frequency or the set of amounts of radio frequencies, the RF power supply 324 generates the RF signal having the power level and the amount of radio frequency or the set of amounts of radio frequencies. The RF signal that is generated by the RF power supply 324 is supplied via the RF cable 310 to the impedance matching circuit 302.

It should be noted that in some embodiments, the DSPx provides the TTL3 signal via a cable to the DSPy. During the state S1, the DSPy determines, based on the TTL3 signal, a time of transition from the state S1*a* to the state S1*b* and a time of transition from the state S1*b* to the state S1*a*. Moreover, during the state S1, the DSPy sends a signal to the power controller PWRS1*y* to adjust power determined by the power controller PWRS1*y* at a time of transition from the state S1*a* to the state S1*b* or at a transition from the state S1*b* to the state S1*a*. The determined power is adjusted based on a change in plasma impedance that occurs when power delivered or supplied by the x MHz RF generator transitions between the states S1*a* and S1*b*. To compensate for the adjustment of the power delivered or supplied by the x MHz RF generator during the transitions between the states S1*a* and S1*b*, the TTL3 signal is sent from the DSPx to the DSPy. The adjustment in power delivered or supplied by the x MHz RF generator creates the change in the plasma impedance.

Moreover, during the state S1, the DSPy sends a signal to the tuner AFTS1*y* to adjust frequency determined by the tuner AFTS1*y* at a time of transition from the state S1*a* to the state S1*b*, or at a transition from the state S1*b* to the state S1*a*. The determined frequency is adjusted based on a change in plasma impedance that occurs when power supplied by the x MHz RF generator transitions between the states S1*a* and S1*b*. To compensate for the adjustment of the frequency of an RF signal that is generated by the x MHz RF generator during the transitions between the states S1*a* and S1*b*, the TTL3 signal is sent from the DSPx to the DSPy. The adjustment in frequency of an RF signal supplied by the x MHz RF generator creates the change in the plasma impedance.

It should further be noted that in some embodiments, instead of sending the TTL3 signal from the DSPx to the DSPy via a cable, information regarding the TTL3 signal, e.g., a frequency of the TTL3 signal, a duty cycle of the TTL3 signal during the state S1, a time for which the state S1a is to occur in the TTL3 signal, a time for which the state S1b is to occur in the TTL3 signal, etc., is provided by the tool UI system 306 to the DSPy via the cable 314 or another cable, similar to the cable 314. The other cable connects the tool UI system 306 to the DSPy. For example, the information regarding the TTL3 signal is provided within a data file from the tool UI system 306 to the DSPy. The DSPy includes virtual phase-locked loops that generates a signal that is locked to a frequency of the TTL3 signal and the signal is used to adjust the power determined by the power controller PWRS1y and/or to adjust the frequency determined by the tuner AFTS1y.

The impedance matching circuit 302 matches an impedance of the load with the source to generate a modified RF signal from the RF signal received from the x MHz RF generator during the state S1b of the TTL3 signal and the state S1 of the TTL1 clock signal and from the RF signal received from the y MHz RF generator during the state S1. For example, a portion of the modified RF signal corresponding to the state S1b the TTL3 signal and the state S1 of the TTL1 clock signal is generated by the impedance matching circuit 302 during the state S1b of the TTL3 signal and the state S1 of the TTL1 clock signal. The modified RF signal generated during the state S1b of the TTL3 signal and the state S1 of the TTL1 clock signal is sent via the RF transmission line 312 to a lower electrode of the chuck 314. The upper electrode 316 includes one or more gas inlets, e.g., holes, etc., that are coupled to a central gas feed (not shown). The central gas feed receives one or more process gases from a gas reservoir (not shown). An example of a process gas includes an oxygen-containing gas, such as $O_2$. Other examples of the process gas include a fluorine-containing gas, e.g., tetrafluoromethane ($CF_4$), sulfur hexafluoride ($SF_6$), hexafluoroethane ($C_2F_6$), etc. The upper electrode 316 is grounded. The chuck 314 is coupled to the x MHz RF generator via the RF transmission line 312, the impedance matching circuit 302, and the RF cable 308. Moreover, the chuck 314 is coupled to the y MHz RF generator via the RF transmission line 312, the impedance matching circuit 302, and the RF cable 310.

In some embodiments, when the process gas is supplied between the upper electrode 316 and the chuck 314 and when the x MHz RF generator and/or the y MHz RF generator supply the RF signals for the state S1b via the impedance matching circuit 302 and the RF transmission line 312 to the chuck 314, impedance of plasma within the plasma chamber 304 is affected, e.g., increased, decreased, etc. The plasma that is affected during the state S1b of the TTL3 signal and the state S1 of the TTL1 clock signal has ion energy of plasma ions. The ion energy during the state S1b of the TTL3 signal and the state S1 of the TTL1 clock signal is used to increase a deposition rate compared to that during the state S0 or the state S1a or is used to perform an etch rather than performing a deposition during the state S0 or is used to perform etching rather than not processing the wafer 318 during the state S0 or is used to decrease an etch rate compared to that during the state S1a or is used to perform a deposition compared to performing an etch during the state S1a.

Furthermore, during the state S1a of the TTL3 signal and the state S1 of the TTL1 signal, the DSPx provides the digital pulsed signal TTL3 and the clock signal TTL1 to the power controller PWRS1ax of the x MHz RF generator. For example, the DSPx provides a portion of the digital pulsed signal TTL3 for the state S1a and provides the clock signal TTL1 for the state S1 to the power controller PWRS1ax. The power controller PWRS1ax determines or identifies a power level of the RF signal to be generated by the x MHz RF generator upon receiving the digital pulsed signal TTL3 for the state S1a and the clock signal TTL1 for the state S1. The power level of the RF signal corresponding to the state S1a of the TTL3 signal and the state S1 of the clock signal TTL1 is stored in a memory device of the power controller PWRS1ax. The power level is provided to the RF power supply 322 during the state S1a of the digital pulsed signal TTL3 and the state S1 of the clock signal TTL1.

Moreover, during the state S1a of the TTL3 signal and the state S1 of the TTL1 signal, the DSPx provides the digital pulsed signal TTL3 and the clock signal TTL1 to the tuner AFTS1ax of the x MHz RF generator. Upon receiving the digital pulsed signal TTL3 for the state S1a and the clock signal TTL1 for the state S1, the frequency controller AFTS1ax determines or identifies an amount of a radio frequency or a set of amounts of radio frequencies corresponding to the state S1a of the digital pulsed signal TTL3 and to the state S1 of the clock signal TTL1. For example, a correspondence between the state S1a of the digital pulsed signal TTL3, the state S1 of the clock signal TTL1 and the amount of radio frequency or the set of amounts of radio frequencies is stored in a memory device of the tuner AFTS1ax.

The tuner AFTS1ax provides the amount of radio frequency or the set of amounts of radio frequencies to the RF power supply 322. Upon receiving the power level for the state S1a of the digital pulsed signal TTL3 and the state S1 of the clock signal TTL1 and upon receiving the amount of radio frequency or the set of amounts of radio frequencies for the state S1a of the digital pulsed signal TTL3 and the state S1 of the clock signal TTL1, the RF power supply 322 generates the RF signal having the power level and the amount of radio frequency or the set of amounts of radio frequencies for the state S1a of the digital pulsed signal TTL3 and the state S1 of the clock signal TTL1.

The impedance matching circuit 302 receives the RF signal generated by the x MHz RF generator for the state S1a of the digital pulsed signal TTL3 and the state S1 of the clock signal TTL1 and receives the RF signal that is generated by the y MHz RF generator for the state S1, and matches an impedance of the load with the source during the state S1a to generate the modified RF signal from the RF signals for the state S1a. For example, a portion of the modified RF signal corresponding to the state S1a of the digital pulsed signal TTL3 and the state S1 of the clock signal TTL1 is generated by the impedance matching circuit 302 during the state S1a. The modified RF signal associated with the state S1a of the digital pulsed signal TTL3 and the state S1 of the clock signal TTL1 is sent from the impedance matching circuit 302 via the RF transmission line 312 to the chuck 314.

Upon receiving the modified RF signal corresponding to the state S1a of the digital pulsed signal TTL3 and the state S1 of the clock signal TTL1, the plasma ions within the plasma chamber 304 are excited to perform processes, e.g., increasing an etch rate compared to that during the state S0 or S1b, decreasing a deposition rate compared to that during the state S0 or S1b, increasing a cleaning rate than that during the state S0 or S1b, increasing a sputtering rate than that during the state S0 or S1b, etc., on the wafer 318.

During the state S0, the DSPx provides the digital pulsed signal TTL3 to the power controller PWRS0x of the x MHz RF generator. For example, the DSPx sends a portion of the digital pulsed signal TTL3 corresponding to the state S0 to the power controller PWRS0x. It should be noted that during the state S0, the TTL3 signal is the same as the TTL1 signal. Upon receiving the digital pulsed signal TTL3 associated with the state S0, the power controller PWRS0x determines or identifies a power level for the state S0. For example, the power level corresponding to the state S0 is stored in a memory device of the power controller PWRS0x and identified from the memory device. The power level is provided by the power controller PWRS0x to the RF power supply 322. Upon receiving the power level for the state S0, the RF power supply 322 generates the RF signal having the power level associated with the state S0.

Moreover, during the state S0, the DSPx provides the digital pulsed signal TTL3 to the tuner AFTS0x of the x MHz RF generator. For example, the DSPx provides a portion of the digital pulsed signal TTL3 having the state S0 to the tuner AFTS0x. Upon receiving the digital pulsed signal TTL3 corresponding to the state S0, the tuner AFTS0x determines or identifies an amount of a radio frequency or a set of amounts of radio frequencies. For example, the tuner AFTS0x identifies from a memory device of the tuner AFTS0x the amount of radio frequency or the set of amounts of radio frequencies. The tuner AFTS0x provides the amount of radio frequency or the set of amounts of radio frequencies to the RF power supply 322.

During the state S0, upon receiving the amount of power and the amount of radio frequency or the set of amounts of radio frequencies associated with the state S0, the RF power supply 322 generates the RF signal corresponding to the state S0. The RF signal corresponding to the state S0 has the power level and the amount of radio frequency or the set of amounts of radio frequencies associated with the state S0.

Also, during the state S0, the DSPy provides the clock signal TTL1 to a power controller PWRS0y and to a tuner AFTS0y of the y MHz RF generator. For example, the DSPy sends a portion of the clock signal TTL1 having the state S0 to the power controller PWRS0x and to the tuner AFTS0y. Upon receiving the clock signal TTL1 associated with the state S0, the power controller PWRS0y determines or identifies a power level of the RF signal to be generated by the y MHz RF generator and the tuner AFTS0y determines or identifies an amount of a radio frequency or a set of amounts of radio frequencies of the RF signal. The power level associated with the state S0 is provided from the power controller PWRS0y to the RF power supply 324 and the amount of radio frequency or the set of amounts of radio frequencies are provided from the tuner AFTS0y to the RF power supply 324. Upon receiving the power level for the state S0 from the power controller PWRS0y and receiving the amount of radio frequency or the set of amounts of radio frequencies from the tuner AFTS0y, the RF power supply 324 generates the RF signal having the power level and the amount of radio frequency or the set of amounts of radio frequencies.

The impedance matching circuit 302 receives the RF signal supplied by the RF power supply 322 during the state S0 via the RF cable 308 and receives the RF signal supplied by the RF power supply 324 during the state S0 via the RF cable 310, and based on the RF signals, matches an impedance of the load with that of the source to generate the modified RF signal for the state S0. The modified RF signal associated with the state S0 is provided via the RF transmission line 312 to the chuck 304.

In some embodiments, the modified RF signal corresponding to the state S0 increases a deposition rate of depositing materials on the wafer 318 compared to that during the state S1a or the state S1b. In various embodiments, the modified RF signal corresponding to the state S0 decreases an etch rate of etching layers of or on the wafer 318 compared to that during the state S1a or the state S1b. In several embodiments, the modified RF signal corresponding to the state S0 is used to deposit materials on the wafer 318 and the modified RF signal generated during the state S1a or the modified RF signal generated during the state S1b is used to etch layers of or on the wafer 318. In some embodiments, a portion of the modified RF signal generated during the state S0 is used to generate, e.g., strike plasma, etc., within the plasma chamber 304. For example, when the process gas is supplied to the plasma chamber 304 and one or more of the RF signals are supplied by one or more of the x and y MHz RF generators, the process gas is ignited to generate plasma within the plasma chamber 304.

In various embodiments, instead of coupling each power controller PWRS0x, PWRS1ax, and PWRS1bx of the x MHz RF generator to a different output of the DSPx, the power controllers PWRS0x, PWRS1ax, and PWRS1bx are connected to one and the same output of the DSPx via a switch, e.g., a multiplexer, etc. The switch connects the DSPx to the power controller PWRS0x during the state S0, connects the DSPx to the power controller PWRS1ax during the state S1a, and connects the DSPx to the power controller PWRS1bx during the state S1b.

Similarly, in several embodiments, instead of coupling each power controller PWRS0y and PWRS1y of the y MHz RF generator to a different output of the DSPy, power controllers PWRS0y and PWRS1y are connected to one and the same output of the DSPy via a switch. The switch connects the DSPy to the power controller PWRS0y during the state S0 and connects the DSPy to the power controller PWRS1y during the state S1.

Also, in various embodiments, instead of coupling each tuner AFTS0x, AFTS1ax, and AFTS1bx of the x MHz RF generator to a different output of the DSPx, the tuners AFTS0x, AFTS1ax, and AFTS1bx are connected to one and the same output of the DSPx via a switch, e.g., a multiplexer, etc. The switch connects the DSPx to the tuner AFTS0x during the state S0, connects the DSPx to the tuner AFTS1ax during the state S1a, and connects the DSPx to the tuner AFTS1bx during the state S1b.

Similarly, in several embodiments, instead of coupling each tuner AFTS0y and AFTS1y of the y MHz RF generator to a different output of the DSPy, the tuners AFTS0y and AFTS1y are connected to one and the same output of the DSPy via a switch. The switch connects the DSPy to the tuner AFTS0y during the state S0 and connects the DSPy to the tuner AFTS1y during the state S1.

Figure 3B:
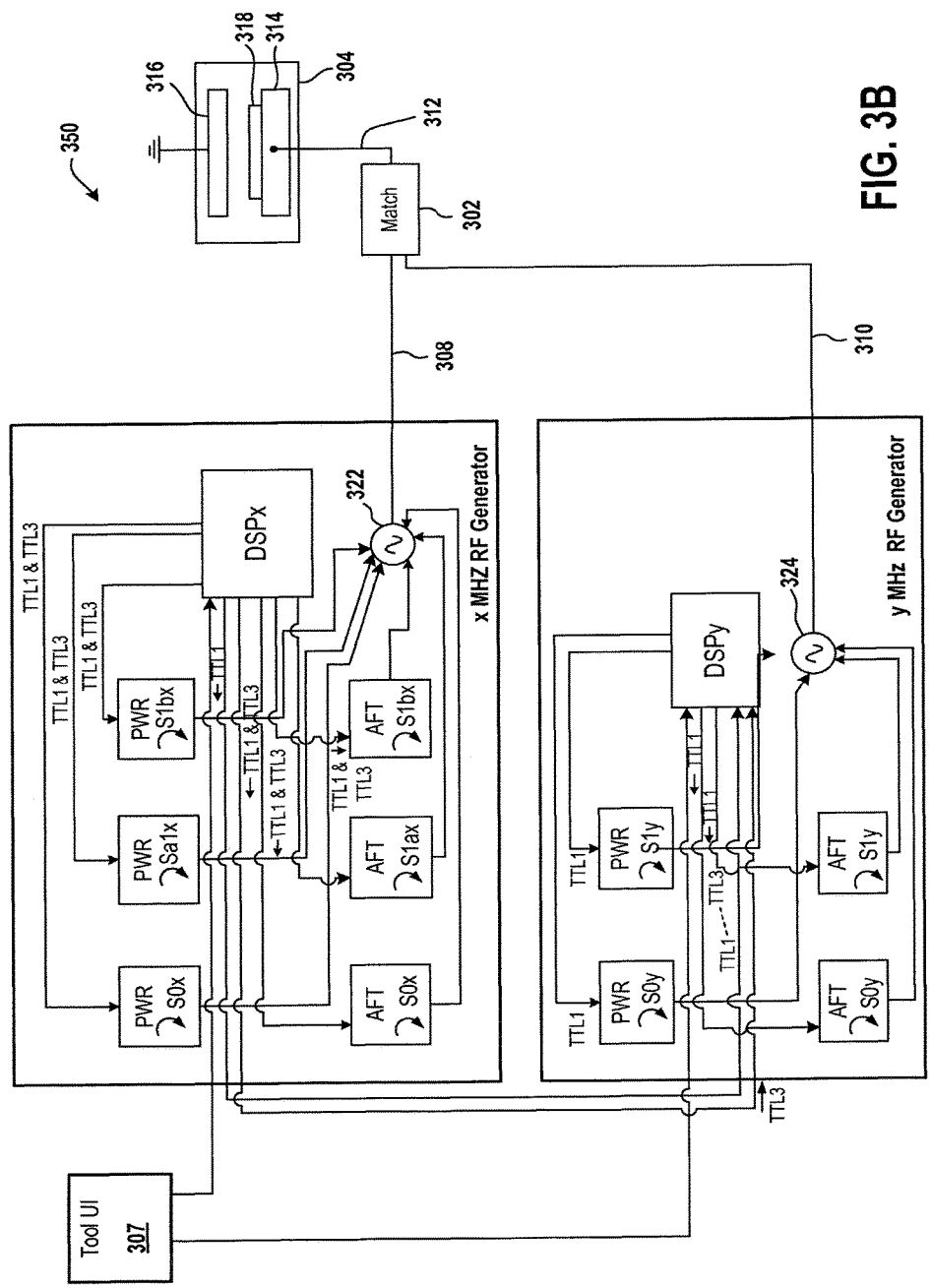
FIG. 3B is a diagram of another system for controlling ion energy during the states S0, S1$a$ and S1$b$ when the x MHz RF generator is a master generator, in accordance with several embodiments described in the present disclosure.

FIG. 3B is a diagram of an embodiment of a system 350 for controlling ion energy during the state S1. The system 350 includes the x MHz RF generator, the y MHz RF generator, the impedance matching circuit 302, the plasma chamber 304, and a tool UI system 307. The system 350 operates in a manner similar to the system 300 (FIG. 3A) except in the system 350, the DSPx generates the clock signal TTL1 and the digital pulsed signal TTL3. The x MHz RF generator is a master RF generator and the y MHz RF generator is a slave RF generator. The clock signal TTL1 and the TTL3 signal are sent from the DSPx of the x MHz RF generator to the DSPy of the y MHz RF generator via cables.

The tool UI system 307 provides the corresponding recipe that includes the performance parameters to each of the x and y MHz RF generators. The corresponding recipe is stored in each of the DSPx and the DSPy.

In some embodiments, power of the RF signal that is supplied by the x MHz RF generator has the same frequency as that of the signal 202 (FIG. 2A) or the signal 212 (FIG. 2B) or the signal 222 (FIG. 2C) or the signal 232 (FIG. 2D).

In various embodiments, instead of sending the TTL3 signal from the DSPx to the DSPy via a cable, the information regarding the TTL3 signal is provided from the DSPx to the DSPy via a cable that connects the DSPx to the DSPy. For example, the information regarding the TTL3 signal is provided within a data file from the DSPx to the DSPy. The DSPy includes virtual phase-locked loops that generates a signal that is locked to a frequency of the TTL3 signal and the signal is used to adjust the power determined by the power controller PWRS1y and/or to adjust the frequency determined by the tuner AFTS1y.

FIG. 4A is a diagram of an embodiment of a graph 400 illustrating the x MHz RF generator operating in the two states S1 and S0, and the y MHz RF generator operating in the state S1, a state S0a, and a state S0b. The graph 400 includes a delivered power signal 402 that is generated from an RF signal supplied by the x MHz RF generator and a delivered power signal 404 that is generated from an RF signal supplied by the y MHz RF generator. The graph 400 plots delivered power versus time. The delivered power signal 404 has the same frequency as that of the digital pulsed signal TTL3.

The delivered power signal 404 transitions, e.g., alternates, etc., between the states S0a and S0b during a period of time the delivered power signal 402 is in the state S0. The delivered power signal 404 does not transition between two states during a period of time the delivered power signal 402 is in the state S1. During the period of time the delivered power signal 402 is in the state S1, the delivered power signal 404 is also in the state S1.

A power level, e.g., a zero power level, a power level less than 5 watts, etc., of the delivered power signal 402 during the state S0 facilitates an increase in a deposition rate, or a decrease in an etch rate, or a decrease in a sputtering rate, etc. The power level of the delivered power signal 402 during the state S0 is less than a power level of the delivered power signal 402 during the state S1.

Moreover, the transitioning between the states S0a and S0b of the delivered power signal 404 during the state S0 of the delivered power signal 402 facilitates a control, e.g., increase, decrease, etc., of impedance of plasma that is generated in the plasma chamber 304 (FIG. 3A). The control in impedance increases stability of the plasma. For example, when the x MHz RF generator generates the RF signal to further provide the delivered power signal 402 to the plasma chamber 304 for achieving a coarse etch rate, the y MHz RF generator generates the RF signal to further provide the delivered power signal 404 that transitions between the states S0a and S0b. The transitioning between the states S0a and S0b by the delivered power signal 404 is performed to achieve a fine etch rate. As another example, when the x MHz RF generator generates the RF signal to further provide the delivered power signal 402 to the plasma chamber 304 for achieving a coarse deposition rate, the y MHz RF generator generates the RF signal to further provide the delivered power signal 404 that transitions between the states S0a and S0b. The transitioning between the states S0a and S0b by the delivered power signal 404 is performed to achieve a fine deposition rate. As another example, when the x MHz RF generator generates the RF signal to further provide the delivered power signal 402 to the plasma chamber 304 for achieving a coarse sputtering rate, the y MHz RF generator generates the RF signal to further provide the delivered power signal 404 that transitions between the states S0a and S0b. The transitioning between the states S0a and S0b by the delivered power signal 404 is performed to achieve a fine sputtering rate.

In some embodiments, a rate that is coarse had a broader range than a rate that is fine. For example, the coarse etch rate has a range of etching between D angstroms/minute and E angstroms/minute and the fine etch rate has a range of etching between F angstroms/minute and G angstroms/minutes. The range between F angstroms/minute and G angstroms/minute lies between the range that is between D angstroms/minute and E angstroms/minute. In various embodiments, the range between F angstroms/minute and G angstroms/minute is smaller than the range between D angstroms/minute and E angstroms/minute.

In various embodiments, during the state S0b of the delivered power signal 404, an amount of ion energy within the plasma chamber 304 (FIG. 3A) is lower than an amount of ion energy within the plasma chamber 304 during the state S0a of the delivered power signal 404. The lower amount of ion energy that is generated by the RF signal that is generated by the y MHz RF generator facilitates a control of the plasma within the plasma chamber 304 to further achieve repeatability of a rate and to achieve stability of the plasma. Moreover, the generation of the lower amount of ion energy during a time period in which the delivered power signal 402 is in the state S0 allows a majority of power supplied by the RF signals that are generated by the x and y MHz RF generators to be reflected towards the generators. The reflection of the majority of power improves stability of plasma within the plasma chamber 304.

Figure 4B:
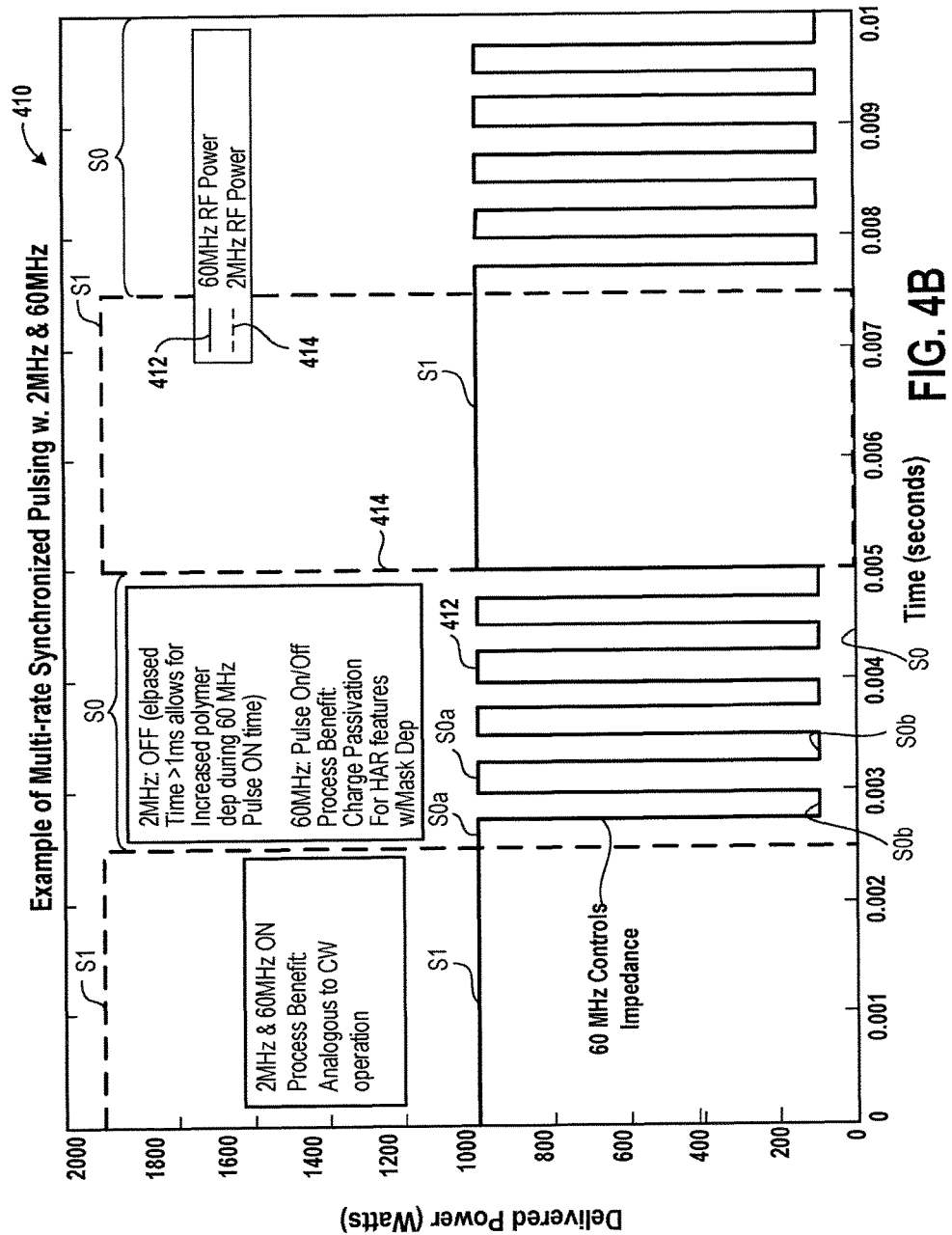
FIG. 4B is a graph to illustrate the y MHz RF generator operating in the state S1, a state S0$a$, and a state S0$b$, and a level of a power signal during the state S0$b$ is different than that illustrated in FIG. 4A, in accordance with various embodiments described in the present disclosure.

FIG. 4B is a diagram of an embodiment of a graph 410 to illustrate a level of a delivered power signal 412 that is derived based on the RF signal that is generated by the y MHz RF generator. The graph 410 plots delivered power versus time. During the state S0a, the delivered power signal 412 has a higher level than that of the delivered power signal 404 (FIG. 4A) during the state S0b. The delivered power signal 412 has the same frequency as that of digital pulsed signal TTL3.

In various embodiments, during the state S0a, the delivered power signal 412 has a higher level than that of the delivered power signal 404. In various embodiments, during the state S0a, the delivered power signal 412 has a lower level than that of the delivered power signal 404.

Figure 4C:
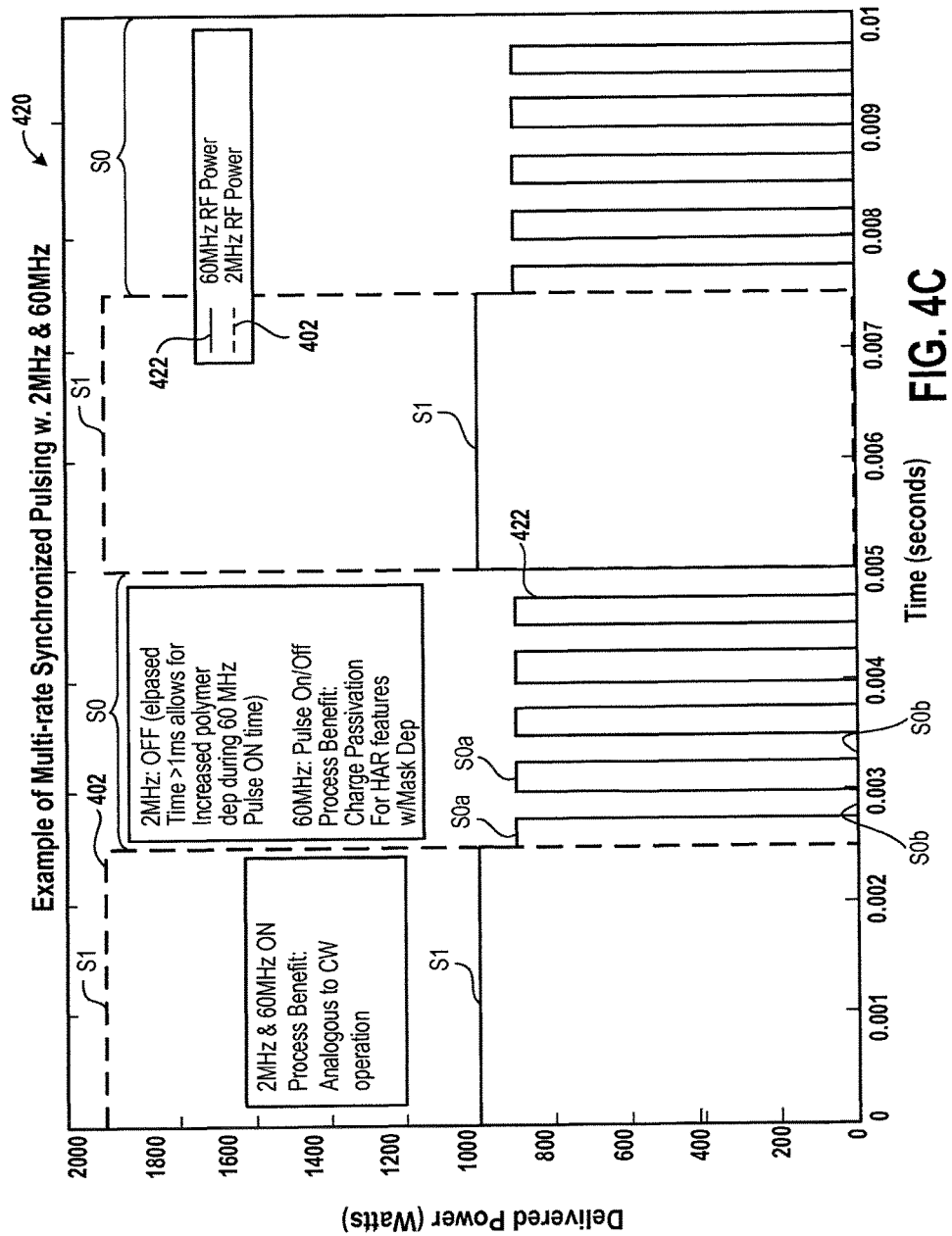
FIG. 4C is a graph to illustrate the y MHz RF generator operating in the state S1, a state S0$a$, and a state S0$b$, and a level of the state S0$a$ is different than that illustrated in FIG. 4A, in accordance with some embodiments described in the present disclosure.

FIG. 4C is a diagram of an embodiment of a graph 420 to illustrate a level of a delivered power signal 422 that is derived based on the RF signal that is generated by the y MHz RF generator. The graph 420 plots delivered power versus time. During the state S0b, the delivered power signal 422 has a lower level than that of the delivered power signal 404 (FIG. 4A) during the state S0a. Moreover, during the state S0a, the delivered power signal 422 has a lower level than that of the delivered power signal 422 during the state S1. The delivered power signal 422 has the same frequency as that of digital pulsed signal TTL3.

Figure 4D:
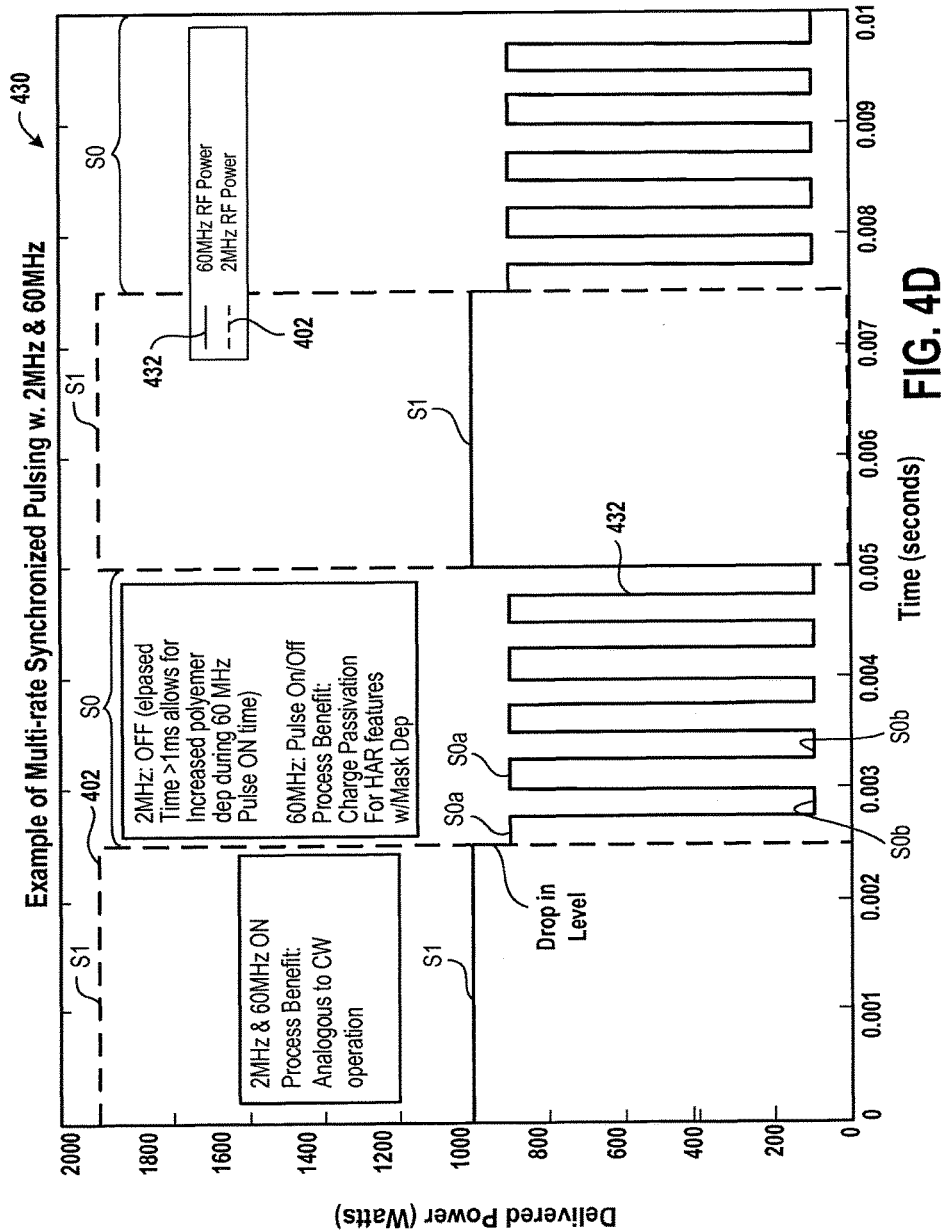
FIG. 4D is a graph to illustrate use of different levels of a delivered power signal during the states S0$a$ and S0$b$ compared to levels of a delivered power signal shown in the graph of FIG. 4A, in accordance with various embodiments described in the present disclosure.

FIG. 4D is a diagram of an embodiment of a graph 430 to illustrate use of different levels of a delivered power signal 432 compared to the levels shown in the graph 400 (FIG. 4A). The delivered power signal 432 has the same frequency as that of digital pulsed signal TTL3. The delivered power signal 432 is a function of the RF signal that is supplied by the y MHz RF generator and an RF signal that is reflected towards the y MHz RF generator from the plasma chamber 304 via the RF transmission line 312, the impedance matching circuit 302, and the RF cable 310 (FIG. 3A). A power level of the delivered power signal 432 during the state S0a is less than a power level of the delivered power signal 404 (FIG. 4A) during the state S0*a*. Moreover, a power level of the delivered power signal 432 during the state S0*a* is less than a power level of the delivered power signal 402 during the state S1. Also, a power level of the delivered power signal 432 during the state S0*b* is higher than a power level of the delivered power signal 402 during the state S0*b*. A power level of the delivered power signal 432 during the state S0*b* is less than a power level of the delivered power signal 402 during the state S1 and is greater than a power level of the delivered power signal 402 during the state S0.

In various embodiments, a power level of the delivered power signal 402 during the state S0 is greater than a power level of the delivered power signal 432 during the state S0*b*. In some embodiments, a power level of the delivered power signal 402 during the state S1 is less than a power level of the delivered power signal 432 during the state S0*a*.

In some embodiments, a time period of the occurrence of the state S1 is the same as a time period of occurrence of the states S0*a* and S0*b*. For example, the state S1 occurs for half a clock cycle of the clock signal TTL1 and the states S0*a* and S0*b* occur for the remaining half of the clock cycle. In several embodiments, a time period of occurrence of the state S1 is for less than or greater than half a clock cycle of the clock signal TTL1 and the states S0*a* and S0*b* occur for the remaining period of the clock cycle.

Figure 4E:
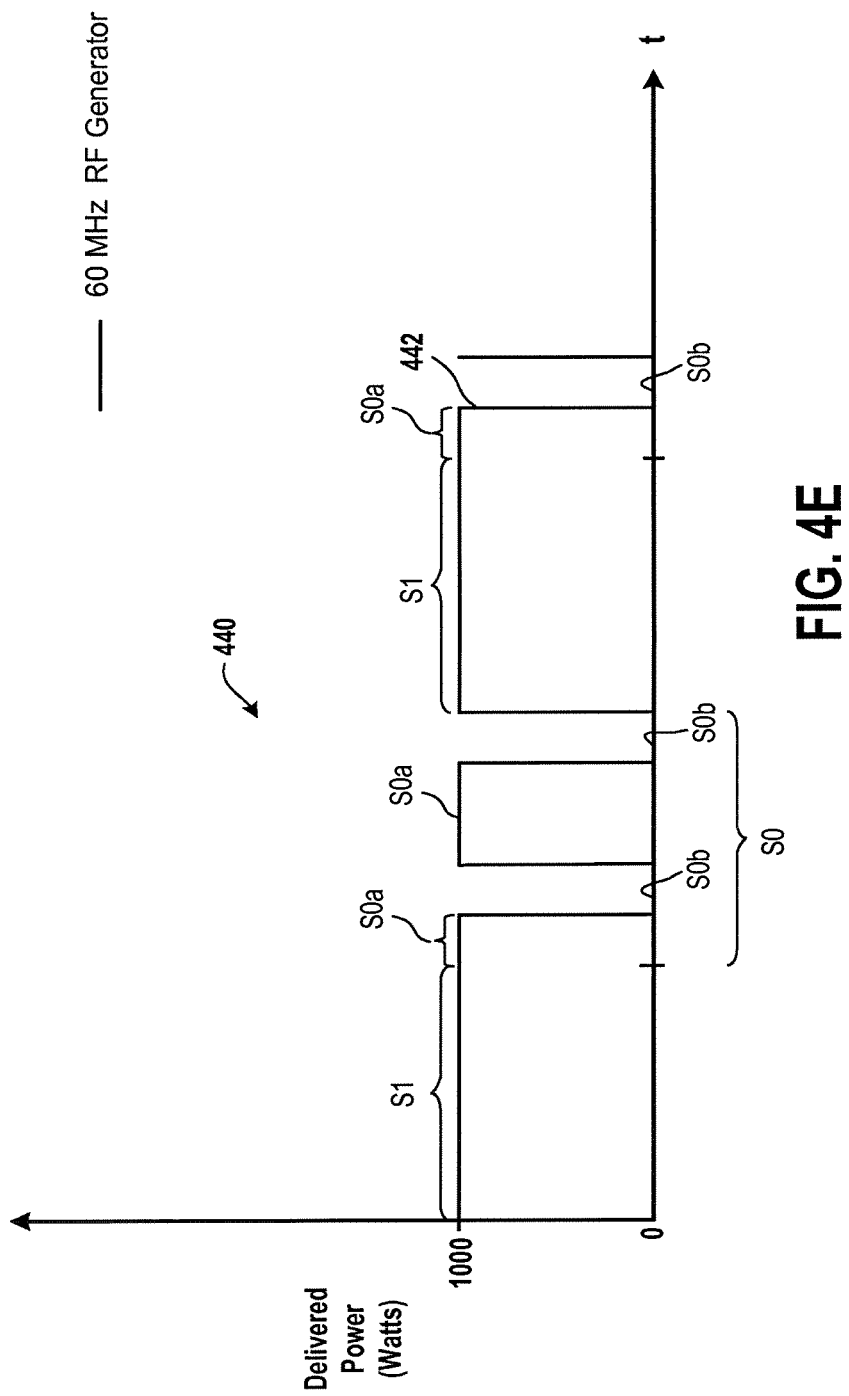
FIG. 4E is a graph for illustrating a different duty cycle during the state S0 than a duty cycle of 50%, in accordance with various embodiments described in the present disclosure.

FIG. 4E is an embodiment of a graph 440 for illustrating a different duty cycle during the state S0 than a duty cycle of 50%. The graph 440 plots power delivered by the 60 MHz RF generator versus time t. The power delivered is shown as a pulsed signal 442. It should be noted that a duty cycle of the signal 442 during the state S0 is greater than 50% and that a time during which the state S1 occurs is the same as that during which the state S0 occurs. For example, the signal 442 occupies a greater amount of time during the state S0*a* than that occupied during the state S0*b*. In some embodiments, a duty cycle of the signal 442 during the state S0 is less than 50%. For example, a delivered signal occupies a less amount of time during the state S0*a* than that occupied during the state S0*b*.

It should further be noted that a duty cycle of each signal 404, 412, 422, and 432 (FIGS. 4A thru 4D) during the state S0 is 50%.

In several embodiments, a time during which the state S0 occurs for power delivered by the y MHz RF generator is lesser than or greater than a time during which the state S1 occurs for the power delivered by the y MHz RF generator. In these embodiments, a duty cycle of the delivered power during the state S0 is 50%.

In various embodiments, a time during which the state S0 occurs for power delivered by the y MHz RF generator is lesser than or greater than a time during which the state S1 occurs for the power delivered by the y MHz RF generator. In these embodiments, a duty cycle of the delivered power during the state S0 is greater than or less than 50%.

In some embodiments, a TTL signal has the same frequency as that of the pulsed signal 442. The TTL signal is generated by a device that generates the TTL3 signal. For example, the DSPx generates the TTL signal from the TTL1 signal and a modulating signal. The modulating signal modulates the TTL1 signal to generate the TTL signal.

Figure 5A:
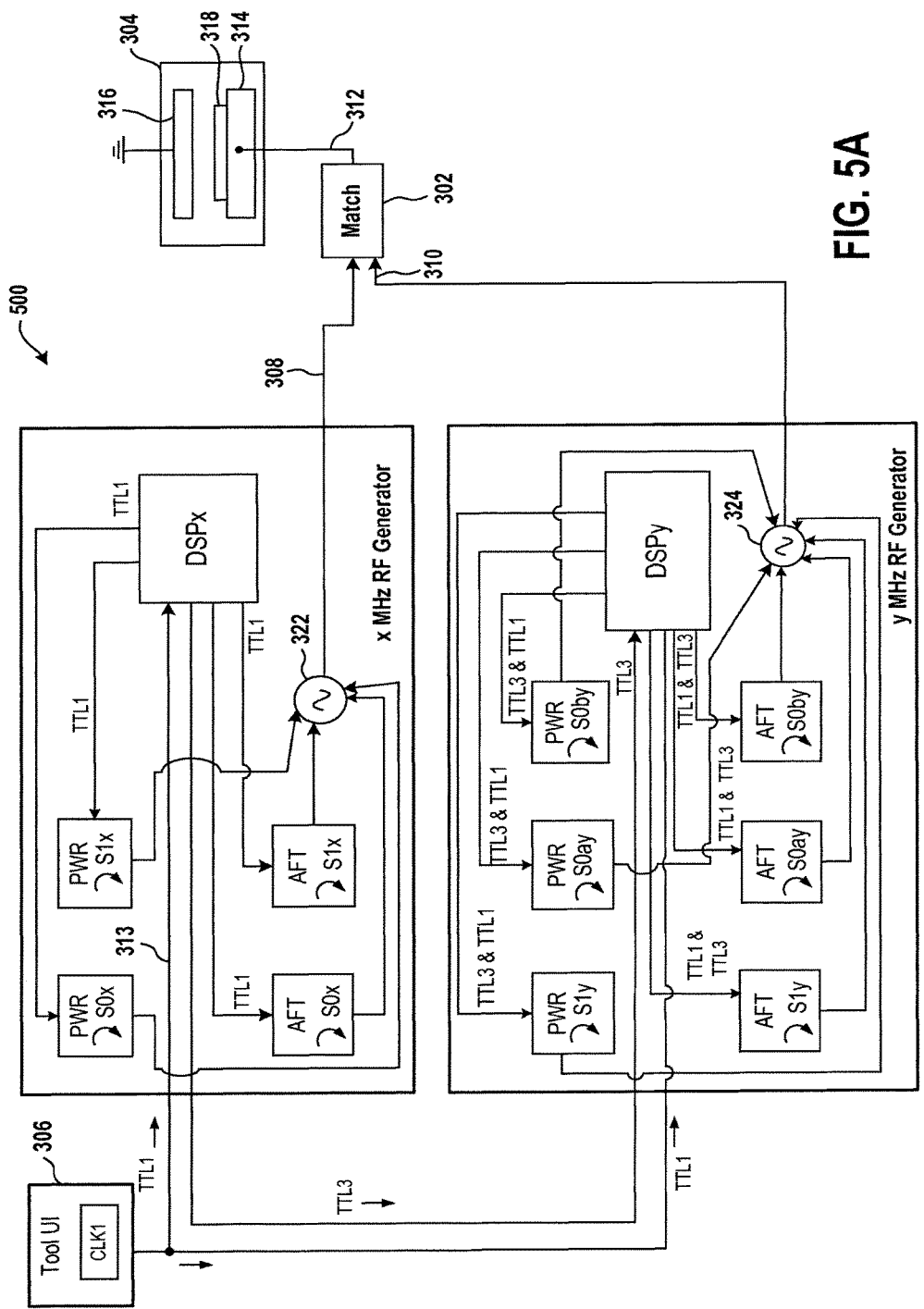
FIG. 5A is a diagram of a system for illustrating generation by the y MHz RF generator of an RF signal having states S1, S0$a$, and S0$b$, in accordance with some embodiments described in the present disclosure.

FIG. 5A is a diagram of an embodiment of a system 500 for illustrating generation by the y MHz RF generator of the RF signal having the states S1, S0*a*, and S0*b*. The system 500 includes the plasma chamber 304, the x MHz RF generator, the y MHz RF generator, and the tool UI system 306. The clock source of the tool UI system 306 provides the clock signal TTL1 to the DSPx of the x MHz RF generator and to the DSPy of the y MHz RF generator. The DSPx generates the digital pulsed signal TTL3 signal based on the clock signal TTL1 and provides the TTL3 signal to the DSPy. For example, the DSPx provides a portion of the digital pulsed signal TTL3 having the state S0*b* to the DSPy.

In some embodiments, instead of the DSPx generating the TTL3 signal and providing the TTL3 signal to the DSPy, the DSPy generates the TTL3 signal based on the clock signal TTL1. For example, the DSPy generates the TTL3 signal from the clock signal that is received either from the clock source of the tool UI system 306 or from the clock source that is internal to the DSPx. As another example, the DSPy generates the TTL3 signal from the clock signal TTL1 that is generated by a clock source that is internal to the DSPy. As yet another example, the DSPy generates the TTL3 signal from the clock signal TTL1 that is generated by a clock source that is internal to the y MHz RF generator.

During the state S0*b*, the DSPx provides the digital pulsed signal TTL3 to the DSPy via a cable. The DSPy provides the digital pulsed signal TTL3 and the clock signal TTL1 to a power controller PWRS0*by* of the y MHz RF generator during the state S0*b*. For example, the DSPy provides a portion of the digital pulsed signal TTL3 having the state S0*b* and the clock signal TTL1 having the state S0. The power controller PWRS0*by* determines or identifies a power level of the RF signal to be generated by the y MHz RF generator in response to receiving the digital pulsed signal TTL3 and the clock signal TTL1. For example, the power controller PWRS0*by* identifies, within a memory device, of the power controller PWRS0*by* a power level that is mapped to the state S0*b* of the digital pulsed signal TTL3 and to the state S0 of the clock signal TTL1. The power controller PWRS0*by* sends the power level to the RF power supply 324.

Moreover, during the state S0*b* of the digital pulsed signal TTL3 and the state S0 of the clock signal TTL1, the DSPy provides the digital pulsed signal TTL3 and the clock signal TTL1 to a tuner AFTS0*by* of the y MHz RF generator. The tuner AFTS0*by* determines or identifies a frequency level of the RF signal to be generated by the y MHz RF generator in response to receiving the digital pulsed signal TTL3 and the clock signal TTL1. For example, the tuner AFTS0*by* identifies, from a memory device of the tuner AFTS0*by*, the frequency level that is mapped to the state S0*b* of the digital pulsed signal TTL3 and to the state S0 of the clock signal TTL1. The tuner AFTS0*by* provides the frequency level to the RF power supply 324. Upon receiving the power level from the power controller PWRS0*by* during the state S0*b* and the frequency level from the tuner AFTS0*by* during the state S0*b* of the digital pulsed signal TTL3 and the state S0 of the clock signal TTL1, the RF power supply 324 generates the RF signal having the frequency level and the power level.

The power level and the frequency level during the state S0*b* of the digital pulsed signal TTL3 and the state S0 of the clock signal TTL1 are associated with achieving a rate, e.g., an etch rate, or a deposition rate, or a cleaning rate, or a sputtering rate, etc. For example, the RF signal generated by the y MHz RF generator during the state S0*b* of the digital pulsed signal TTL3 and the state S0 of the clock signal TTL1 helps achieve a balance between multiple etch rates during fine tuning of etching the wafer 318 or a material deposited on the wafer 318. One of the multiple etch rates is associated with the state S0*b* and another one of the multiple rates is associate with the state S0*a*.

Moreover, during the state S0b of the y MHz RF generator, the x MHz RF generator operates in the state S0. During the state S0, the DSPx sends the clock signal TTL1 to the power controller PWRS0x and to the tuner AFTS0x of the x MHz RF generator. Upon receiving the clock signal TTL1, the power controller PWRS0x determines or identifies a power level. The power level is identified from a memory device of the power controller PWRS0x. The power level is provided to the RF power supply 322.

Furthermore, upon receiving the clock signal TTL1, the tuner AFTS0x determines or identifies a frequency level. The frequency level is identified from a memory device of the tuner AFTS0x. The tuner AFTS0x provides the frequency level to the RF power supply 322. Upon receiving the power level and the frequency level during the state S0, the RF power supply 322 generates the RF signal having the frequency level and the power level.

It should be noted that the frequency level and the power level during the state S0 of the RF signal that is generated by the x MHz RF generator help achieve a processing rate, e.g., a deposition rate, an etch rate, a cleaning rate, a sputtering rate, etc. For example, during the state S0, the RF signal having the power level that maps to a coarse etch level and/or that maps to a coarse frequency level is generated by the x MHz RF generator.

The impedance matching circuit 302 receives the RF signal that is generated by the x MHz RF generator during the state S0 and the RF signal that is generated by the y MHz RF generator during the state S0b, and matches an impedance of the load with the source to generate the modified RF signal. The modified RF signal is provided by the impedance matching circuit 302 to the chuck 314 to generate or modify the plasma to process the wafer 318 to achieve a rate.

Moreover, during the state S0a, the DSPx provides the digital pulsed signal TTL3 to the DSPy via a cable and the clock signal TTL1 to the DSPy via a cable. The DSPy provides the digital pulsed signal TTL3 and the clock signal TTL1 to a power controller PWRS0ay of the y MHz RF generator during the state S0a. For example, the DSPy provides a portion of the digital pulsed signal TTL3 having the state S0a and provides the clock signal TTL1 having the state S0. The power controller PWRS0ay determines or identifies a power level of the RF signal to be generated by the y MHz RF generator in response to receiving the digital pulsed signal TTL3 and the clock signal TTL1. For example, the power controller PWRS0ay identifies, within a memory device, of the power controller PWRS0ay a power level that is mapped to the state S0a of the digital pulsed signal TTL3 and to the state S0 of the clock signal TTL1. The power controller PWRS0ay sends the power level to the RF power supply 324.

Moreover, during the state S0a of the digital pulsed signal TTL3 and the state S0 of the clock signal TTL1, the DSPy provides the digital pulsed signal TTL3 to a tuner AFTS0ay of the y MHz RF generator. The tuner AFTS0ay determines or identifies a frequency level of the RF signal to be generated by the y MHz RF generator in response to receiving the digital pulsed signal TTL3 having the state S0a and the clock signal TTL1 having the state S0. For example, the tuner AFTS0ay identifies, from a memory device of the tuner AFTS0ay, the frequency level that is mapped to the state S0a of the digital pulsed signal TTL3 and the state S0 of the clock signal TTL1. The tuner AFTS0ay provides the frequency level to the RF power supply 324. Upon receiving the power level from the power controller PWRS0ay during the state S0a and the frequency level from the tuner AFTS0ay during the state S0a, the RF power supply 324 generates the RF signal having the frequency level and the power level.

The power level and the frequency level during the state S0a of the digital pulsed signal TTL3 and the state S0 of the clock signal TTL1 are associated with achieving a processing rate, e.g., an etch rate, or a deposition rate, or a sputtering rate, or a cleaning rate, etc. For example, the RF signal generated by the y MHz RF generator during the state S0a of the digital pulsed signal TTL3 and the state S0 of the clock signal TTL1 helps achieve the balance during fine tuning of etching the wafer 318 or a material deposited on the wafer 318. The illustrate, the RF signal generated by the y MHz RF generator during the state S0a of the digital pulsed signal TTL3 and the state S0 of the clock signal TTL1 helps increase an etch rate of etching the wafer 318 or materials deposited on the wafer 318 to further achieve the balance between the increased etch rate and a decreased etch rate during the state S0b.

Furthermore, during the state S0a of the y MHz RF generator, the x MHz RF generator operates in the state S0. The operations of the x MHz RF generator during the state S0 are described above. The impedance matching circuit 302 receives the RF signal that is generated by the x MHz RF generator during the state S0 and the RF signal that is generated by the y MHz RF generator during the state S0a, and matches an impedance of the load with the source to generate the modified RF signal. The modified RF signal is provided by the impedance matching circuit 302 to the chuck 314 to modify the plasma to process, e.g., etch, deposit materials on, etc., the wafer 318 or to process materials deposited on the wafer 318.

During the state S1, the DSPy provides the TTL3 signal to the power controller PWRS1y. For example, the DSPy provides a portion of the TTL3 signal during the state S1 to the power controller PWRS1y. It should be noted that the TTL3 signal is the same as the TTL1 signal during the state S1. Upon receiving the TTL3 signal, the power controller PWRS1y determines or identifies a power level and provides the power level to the RF power supply 324. Moreover, during the state S1, the DSPy provides the TTL3 signal to the tuner AFTS1y. Upon receiving the TTL3 signal, the tuner AFTS1y determines or identifies a frequency level and provides the frequency level to the RF power supply 324. The RF power supply 324 generates the RF signal having the power level and the frequency level during the state S1 and provides the RF signal to the impedance matching circuit 302.

Moreover, during the state S1, the DSPx provides the TTL3 signal to the power controller PWRS1x and to the tuner AFTS1x. Upon receiving the TTL3 signal, the power controller PWRS1x determines or identifies a power level associated with the state S1. For example, the power controller PWRS1x identifies a power level that is stored in a memory device of the power controller PWRS1x. The power controller PWRS1x provides the power level to the RF power supply 322. Also, upon receiving the TTL3 signal, the tuner AFTS1x determines or identifies a frequency level associated with the state S1. As an example, the tuner AFTS1x identifies a frequency level that is mapped to the state S1 and that is stored in a memory device of the tuner AFTS1x. The frequency level is provided from the tuner AFTS1x to the power supply 322. During the state S1, the power supply 322 generates the RF signal having the frequency level and the power level associated with the state S1.

The impedance matching circuit 302 receives the RF signals from the RF power supplies 322 and 324 during the state S1, and matches an impedance of the load with the source to generate a modified RF signal. In some embodiments, an impedance of the source is based on one or more RF signals that are received by the impedance matching circuit 302 from corresponding one or more of RF generators that generate the one or more RF signals. The modified RF signal generated during the state S1 is sent from the impedance matching circuit 302 via the RF transmission line 312 to the chuck 314.

In various embodiments, during the state S1, an etch rate achieved is higher than an etch rate during the state S0, or a deposition rate achieved is lower than that during the state S0, or a sputtering rate achieved is higher than that during the state S0, or a cleaning rate achieved is higher than that during the state S0.

It should be noted that in some embodiments, the power controllers and tuners of the y MHz RF generator are parts of the DSPy. For example, the power controllers PWRS0ay, PWRS0by, and PWRS1y and the tuners AFTS1y, AFTS0ay, and AFTS0by are portions of a computer program that is executed by the DSPy. As another example, the power controllers PWRS0ay, PWRS0by, and PWRS1y and the tuners AFTS1y, AFTS0ay, and AFTS0by are circuits that are integrated within a circuit of the DSPy.

In various embodiments, instead of coupling each power controller PWRS0ay, PWRS0by, and PWRS1y of the y MHz RF generator to a different output of the DSPy, power controllers PWRS0ay, PWRS0by, and PWRS1y are connected to one and the same output of the DSPy via a switch, e.g., a multiplexer, etc. The switch connects the DSPy to the power controller PWRS1y during the state S1, connects the DSPy to the power controller PWRS0ay during the state S0a, and connects the DSPy to the power controller PWRS0by during the state S0b.

Similarly, in several embodiments, instead of coupling each power controller PWRS0x and PWRS1x of the x MHz RF generator to a different output of the DSPx, the power controllers PWRS0x and PWRS1x are connected to one and the same output of the DSPx via a switch. The switch connects the DSPx to the power controller PWRS0x during the state S0 and connects the DSPx to the power controller PWRS1x during the state S1.

In various embodiments, instead of coupling each tuner AFTS1y, AFTS0ay, and AFTS0by of the y MHz RF generator to a different output of the DSPy, the tuners AFTS1y, AFTS0ay, and AFTS0by are connected to one and the same output of the DSPy via a switch, e.g., a multiplexer, etc. The switch connects the DSPy to the tuner AFTS1y during the state S1, connects the DSPy to the tuner AFTS0ay during the state S0a, and connects the DSPy to the tuner AFTS0by during the state S0b.

Similarly, in several embodiments, instead of coupling each tuner AFTS0x and AFTS1x of the x MHz RF generator to a different output of the DSPx, the tuners AFTS0x and AFTS1x are connected to one and the same output of the DSPx via a switch. The switch connects the DSPx to the tuner AFTS0x during the state S0 and connects the DSPx to the tuner AFTS1x during the state S1.

Figure 5B:
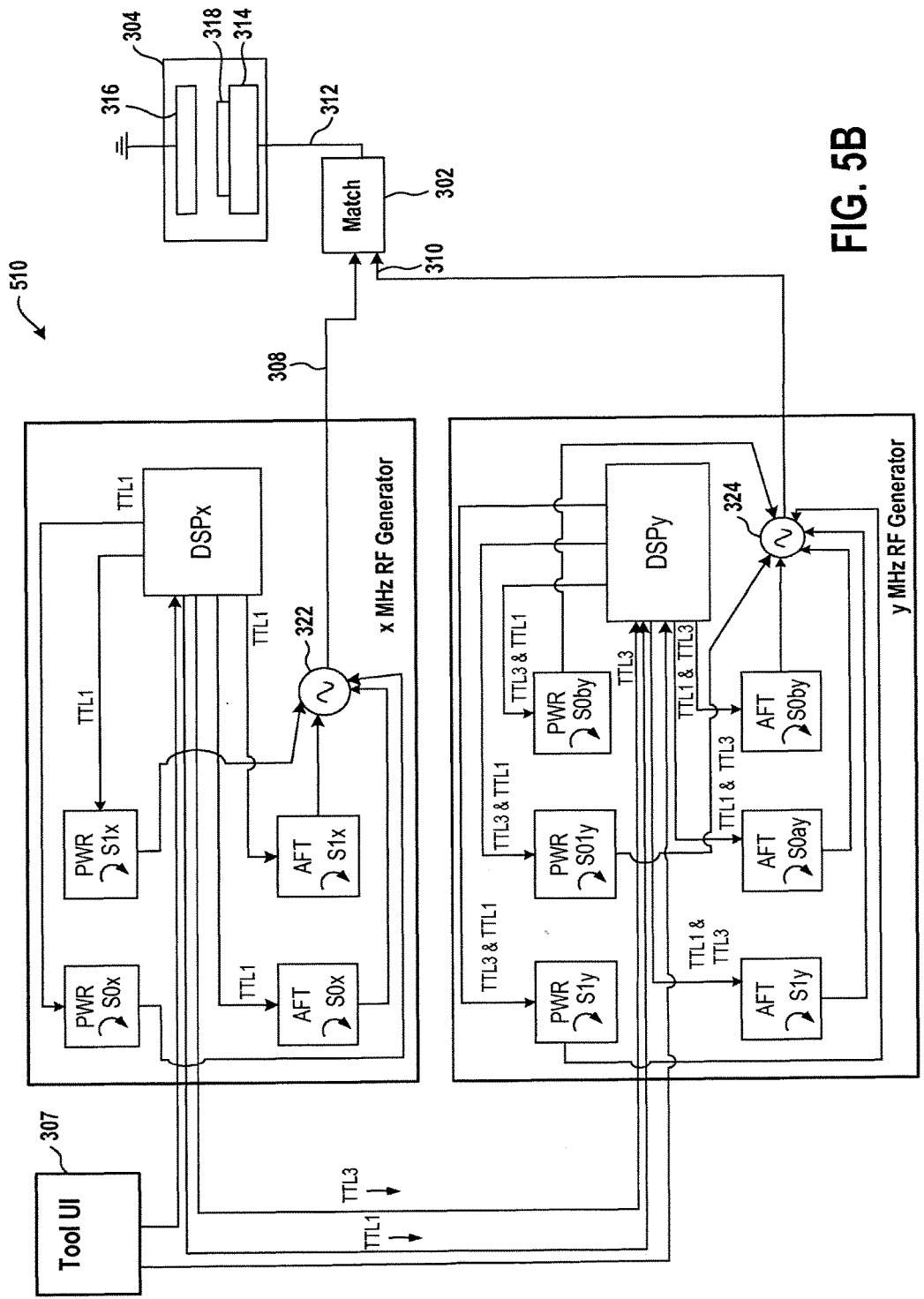
FIG. 5B is a diagram of a system for illustrating generation by the y MHz RF generator of an RF signal having states S1, S0$a$, and S0$b$ when the x MHz RF generator is a master generator, in accordance with various embodiments described in the present disclosure.

FIG. 5B is a diagram of an embodiment of a system 510 for illustrating generation of the TTL1 and TTL3 signals by the DSPx of the x MHz RF generator. Instead of receiving the clock signal TTL1 from the clock source of the tool UI system 306, the clock signal TTL1 is generated by a clock source that is internal to the DSPx. The clock signal TTL1 is used to generate the digital pulsed signal TTL3 by the DSPx. The TTL3 signal and the clock signal TTL1 are provided by the DSPx to the DSPy. Moreover, the tool UI system 307 provides the recipe associated with the x MHz RF generator to the DSPx and the recipe associated with the y MHz RF generator to the DSPy.

For example, the power of the RF signal that is supplied by the y MHz RF generator has the same frequency as that of the signal 404 (FIG. 4A) or the signal 412 (FIG. 4B) or the signal 432 (FIG. 4C) or the signal 432 (FIG. 4D).

Figure 6A:
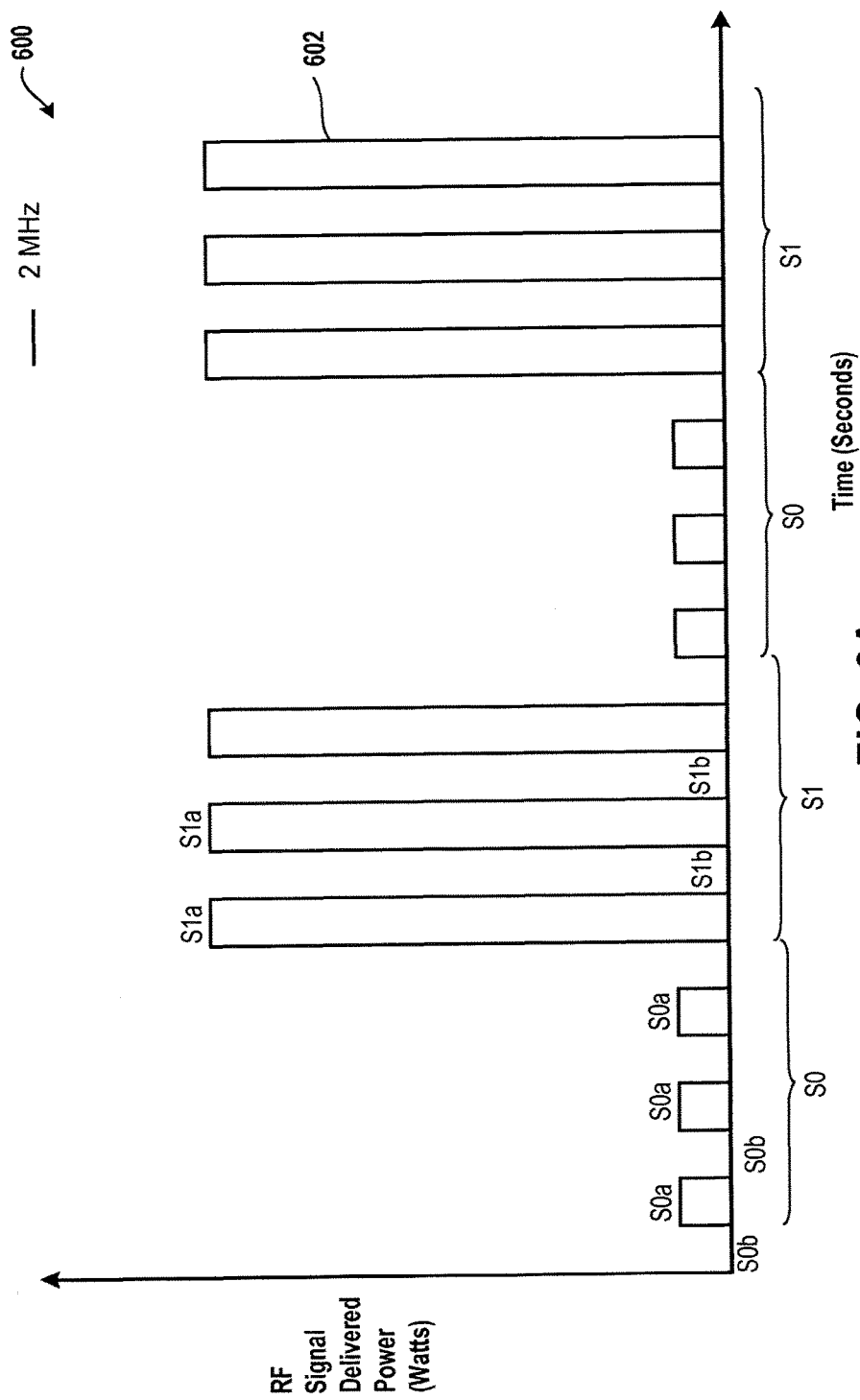
FIG. 6A is a graph to illustrate sub-pulsing of an RF signal that is generated by the x MHz RF generator during both the states S1 and S0, in accordance with some embodiments described in the present disclosure.

FIG. 6A is a diagram of an embodiment of a graph 600 to illustrate pulsing of the RF signal that is generated by the x MHz RF generator during both the states S1 and S0. The pulsing of the RF signal that is generated by the x MHz RF generator results in the two sub-states S1a and S1b during the state S1 and also results in the two sub-states S0a and S0b during the state S0. The graph 600 plots a power level of a delivered RF signal 602 that is a function of an RF signal that is generated by the x MHz RF generator and that is reflected towards the RF generator versus time.

During the state S0 of the TTL1 signal, the RF signal 602 fluctuates between the states S0a and S0b. Moreover, during the state S1 of the TTL1 signal, the RF signal 602 fluctuates between the states S1a and S1b.

In some embodiments, a power level of the RF signal 602 during the state S0b is less than or greater than a power level of the RF signal 602 during the state S1b.

It should be noted that the use of the states S0a and S0b of the RF signal 602 helps coarse tune a processing rate, e.g., an etch rate or a deposition rate or a sputtering rate or a cleaning rate, etc., during the state S0 of the TTL1 signal.

Figure 6B:
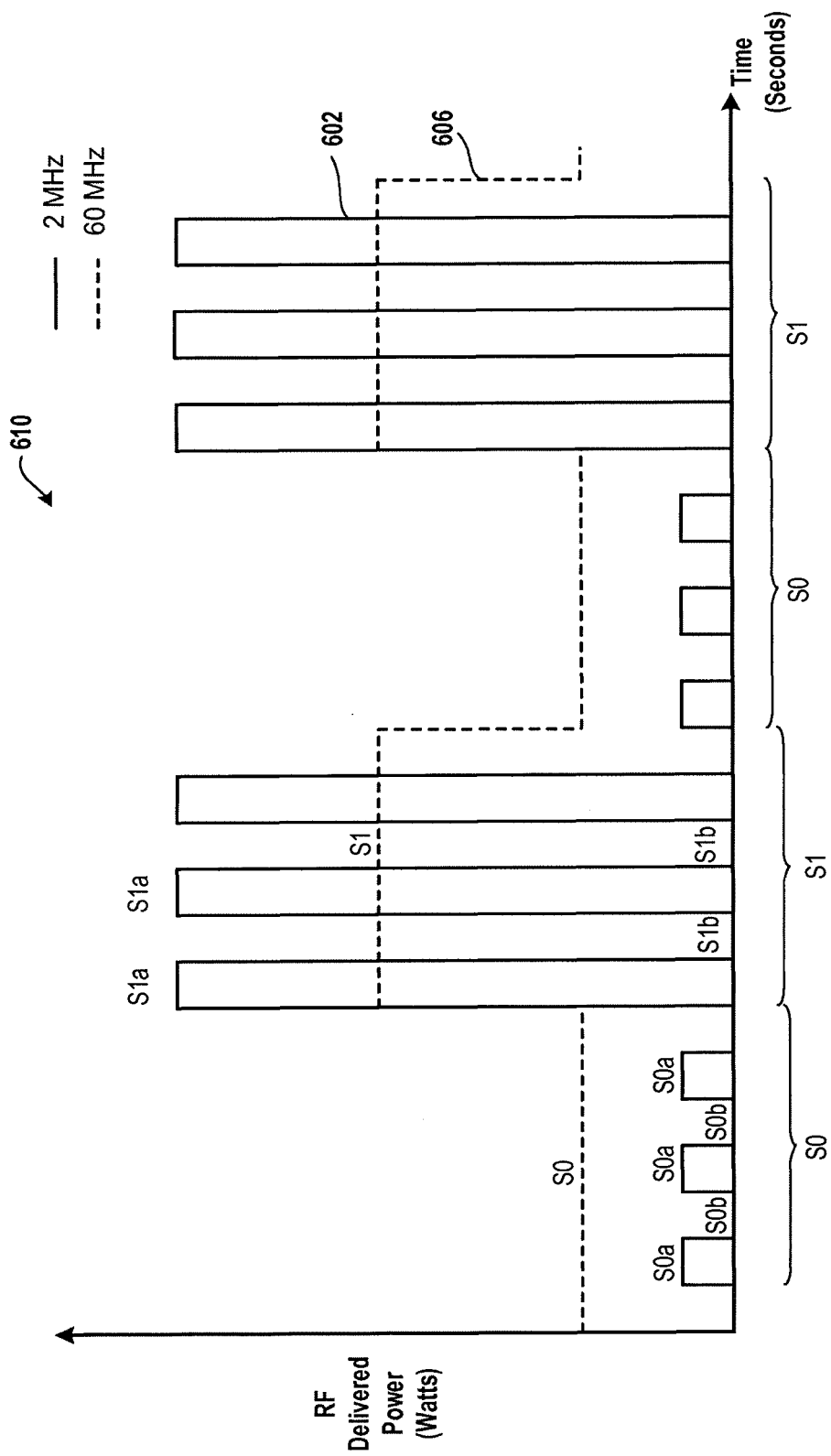
FIG. 6B is a graph to illustrate use of the y MHz RF generator in conjunction with use of the x MHz RF generator that generates an RF signal having four sub-states states S0$a$, S0$b$, S1$a$, and S1$b$, in accordance with various embodiments described in the present disclosure.

FIG. 6B is a diagram of an embodiment of a graph 610 to illustrate use of the y MHz RF generator in conjunction with use of the x MHz RF generator that generates the RF signal 602 having the four sub-states S0a, S0b, S1a, and S1b. The y MHz RF generator generates an RF signal to further provide a delivered power RF signal 604 having the state S0 when the x MHz RF generator generates an RF signal to further provide the RF signal 602 having the states S0a and S0b. In some embodiments, the use of the states S0a and S0b of the RF signal 602 that is generated by the x MHz RF generator allow a coarse control of a rate, e.g., an etch rate, a deposition rate, a sputtering rate, etc. when a fine control of the rate is constant or is substantially constant. In some embodiments, the fine control of the rate is substantially constant when the y MHz RF generator is operated at the power level corresponding to the state S0. Moreover, the y MHz RF generator facilitates provision of the RF signal 604 having the state S1 when the x MHz RF generator facilitates provision of the RF signal 602 having the states S1a and S1b.

Figure 6C:
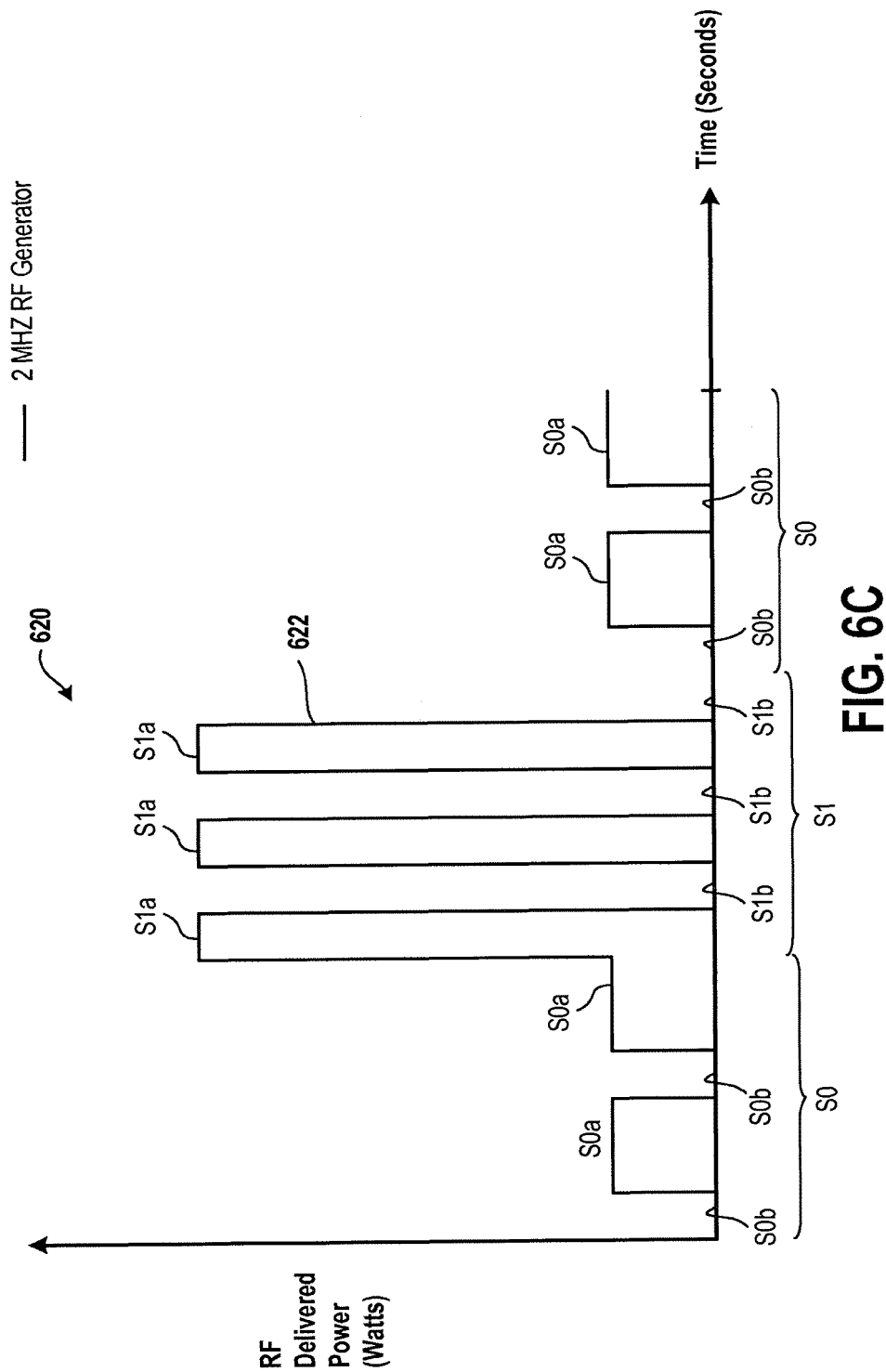
FIG. 6C is a diagram of a graph to illustrate a different duty cycle during the state S0 than during the state S1, in accordance with several embodiments described in the present disclosure.

FIG. 6C is a diagram of an embodiment of a graph 620 to illustrate a different duty cycle during the state S0 of the TTL1 signal than during the state S1 of the TTL1 signal. The graph 620 plots power delivered by the 2 MHz RF generator versus time t. The power delivered is shown as a pulsed signal 622. It should be noted that a duty cycle of the pulsed signal 622 during the state S0 is greater than 50% and that a time during which the state S1 occurs is the same as that during which the state S0 occurs. For example, the signal 622 occupies a greater amount of time during the state S0a than that occupied during the state S0b. It should be noted that a duty cycle of the delivered power signal 622 during the state S1 is 50%.

In some embodiments, a duty cycle of the signal 622 during the state S0 is less than 50%. For example, a delivered signal occupies a less amount of time during the state S0a than that occupied during the state S0b.

It should further be noted that a duty cycle of the signal 602 (FIGS. 6A thru 6B) during each state S0 and S1 is 50%. For example, the signal 622 occupies the same amount of time during the state S0a as that occupied during the state S0b.

In some embodiments, a duty cycle of a pulsed power signal that is delivered by the 2 MHz RF generator during the state S1 is greater than or less than 50% and a duty cycle of the pulsed delivered power signal during the state S0 is 50%.

In various embodiments, a duty cycle of a pulsed delivered power signal that is generated by the 2 MHz RF generator during the state S1 is greater than or less than 50% and a duty cycle of the pulsed delivered power signal during the state S0 is greater than or less than 50%.

In several embodiments, a time during which the state S0 occurs for power delivered by the x MHz RF generator is lesser than or greater than a time during which the state S1 occurs for the power delivered by the x MHz RF generator. In these embodiments, a duty cycle of the delivered power during each state S0 and S1 is 50%.

In various embodiments, a time during which the state S0 occurs for power delivered by the x MHz RF generator is lesser than or greater than a time during which the state S1 occurs for the power delivered by the x MHz RF generator. In these embodiments, a duty cycle of the delivered power during the state S0 is greater than or less than 50% and a duty cycle of the delivered power during the state S1 is equal to 50%.

In some embodiments, a time during which the state S0 occurs for power delivered by the x MHz RF generator is lesser than or greater than a time during which the state S1 occurs for the power delivered by the x MHz RF generator. In these embodiments, a duty cycle of the delivered power during the state S0 is equal to 50% and a duty cycle of the delivered power during the state S1 is greater than or less than to 50%.

In various embodiments, a time during which the state S0 occurs for power delivered by the x MHz RF generator is lesser than or greater than a time during which the state S1 occurs for the power delivered by the x MHz RF generator. In these embodiments, a duty cycle of the delivered power during the state S0 is greater than or less than 50% and a duty cycle of the delivered power during the state S1 is greater than or less than to 50%.

In some embodiments, a TTL signal has the same frequency as that of the pulsed signal 622. The TTL signal is generated by a device that generates the TTL5 signal. For example, the DSPx generates the TTL signal from the TTL1 signal and a modulating signal. The modulating signal modulates the TTL1 signal to generate the TTL signal.

Figure 7A:
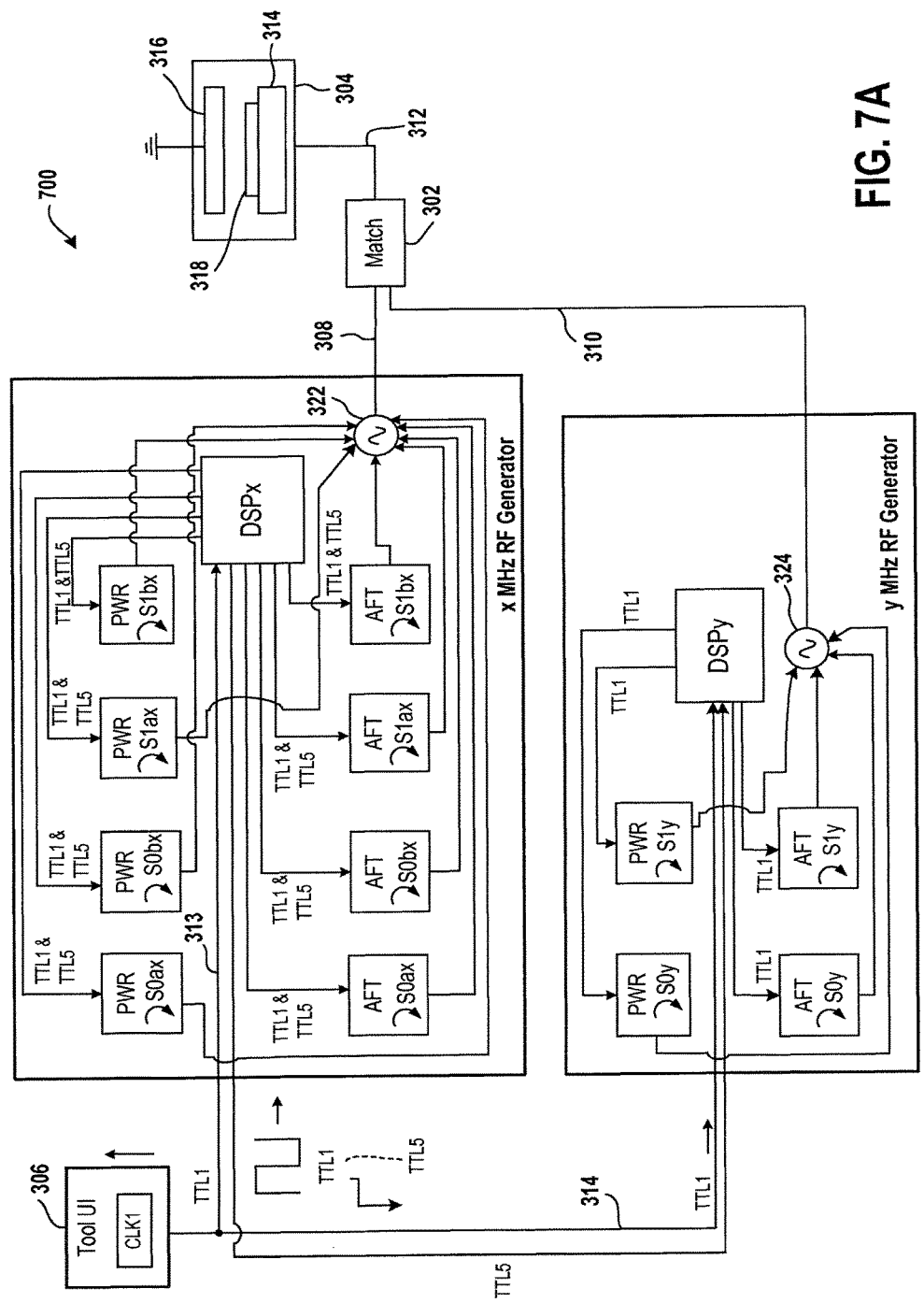
FIG. 7A is a diagram of a system for illustrating use of the four sub-states S0$a$, S0$b$, S1$a$, and S1$b$ in the x MHz RF generator, in accordance with some embodiments described in the present disclosure.

FIG. 7A is a diagram of an embodiment of a system 700 for illustrating use of four sub-states S0a, S0b, S1a, and S1b in the x MHz RF generator. The system 700 includes the plasma chamber 304, the x MHz RF generator, the y MHz RF generator, and the tool UI system 306. The clock source of the tool UI system 306 generates the clock signal TTL1 and provides the clock signal TTL1 via the cable 313 to the DSPx and to the DSPy.

During the state S0a, the DSPx generates the TTL5 signal from the TTL1 signal and provides the TTL5 signal to the DSPy. For example, the DSPx generates the TTL5 signal by modulating the TTL1 signal with a TTL4 signal. As another example, the DSPx generates the TTL5 signal by multiplying a logic level of the clock signal TTL1 with a logic level of the TTL4 signal. In various embodiments, the RF signal 602 (FIGS. 6A and 6B) has the same frequency as that of the TTL5 signal. In some embodiments, the RF signal 602 has the same frequency as that of the TTL4 signal.

During the state S0b, the DSPx provides the TTL5 signal and the TTL1 signal to a power controller PWRS0bx of the x MHz RF generator and to a tuner AFTS0bx of the x MHz RF generator. For example, during the state S0b, the DSPx provides a portion of the TTL5 signal having the state S0b and provides the clock signal TTL1 having the state S0 to the power controller PWRS0bx and the tuner AFTS0bx. The power controller PWRS0bx determines or identifies a power level corresponding to the state S0b of the TTL5 signal and the state S0 of the clock signal TTL1 upon receiving the TTL5 signal. For example, the power controller PWRS0bx identifies from a memory device of the power controller PWRS0bx the power level that maps to the state S0b of the TTL5 signal and the state S0 of the clock signal TTL1. The power controller PWRS0bx provides the power level associated with the state S0b of the TTL5 signal and the state S0 of the clock signal TTL1 to the RF power supply 322.

Moreover, during the state S0b of the TTL5 signal and the state S0 of the clock signal TTL1, the tuner AFTS0bx determines or identifies a frequency level upon receiving the TTL5 signal and the TTL1 signal. For example, the tuner AFTS0bx identifies from a memory device of the tuner AFTS0bx the frequency level that maps to the state S0b of the TTL5 signal and the state S0 of the TTL1 signal. The tuner AFTS0bx provides the frequency level to the RF power supply 322.

Upon receiving the power level and the frequency level corresponding to the state S0b of the TTL5 signal and the state S0 of the clock signal TTL1, the RF power supply 322 generates an RF signal having the power level and the frequency level for the state S0b. The RF signal generated during the state S0b of the TTL5 signal and the state S0 of the clock signal TTL1 is supplied via the RF cable 308 to the impedance matching circuit 302.

It should be noted that in some embodiments, the power level and/or the frequency level during the state S0b of the TTL5 signal and the state S0 of the clock signal TTL1 are used to control, in a coarse manner, a processing rate, e.g. a rate of depositing materials on the wafer 318, or a rate of etching the wafer 318 or of etching materials on the wafer 318, or a rate of sputtering the wafer 318 or materials deposited on the wafer 318, or a rate of cleaning the wafer 318 or materials deposited on a substrate, etc.

Moreover, during the state S0, the DSPy receives the TTL1 signal from the tool UI system 306 and provides the TTL1 signal to the power controller PWRS0y. The remaining operation of the y MHz RF generator is similar to that described above with reference to FIG. 3A for generation of the RF signal.

During the state S0 of the y MHz RF generator and the state S0b of the x MHz RF generator, the impedance matching circuit 302 receives the RF signals via the RF cables 308 and 310 from the x and y MHz RF generators, matches an impedance of the load with the source to generate a modified RF signal. The modified RF signal is provided via the RF transmission line 312 to the chuck 314. In some embodiments, the modified RF signal that is generated during the state S0b allows control of a processing rate, e.g., a rate of deposition of materials on the wafer 318 or a rate of etching the wafer 318 or material deposited on the wafer 318 or a rate of sputtering the wafer 318 or materials deposited on the wafer 318 or a rate of cleaning the wafer 318 or of materials deposited on a substrate, etc.

Furthermore, during the state S0a, the DSPx provides the TTL5 signal and the TTL1 signal to a power controller PWRS0ax of the x MHz RF generator and to a tuner AFTS0ax of the x MHz RF generator. For example, during the state S0a, the DSPx provides a portion of the TTL5 signal having the state S0a and provides the TTL1 signal having the state S0 to the power controller PWRS0ax and the tuner AFTS0ax. The power controller PWRS0ax determines or identifies a power level upon receiving the TTL5 signal and the TTL1 signal. For example, the power controller PWRS0ax identifies from a memory device of the power controller PWRS0ax the power level that maps to the state S0a of the TTL5 signal and the state S0 of the clock signal TTL1. The power controller PWRS0ax provides the power level to the RF power supply 322.

Moreover, during the state S0a of the TTL5 signal and the state S0 of the clock signal TTL1, the tuner AFTS0ax determines or identifies a frequency level upon receiving the TTL5 signal. For example, the tuner AFTS0ax identifies from a memory device of the tuner AFTS0ax the frequency level that maps to the state S0a of the TTL5 signal and the state S0 of the clock signal TTL1. The tuner AFTS0ax provides the frequency level to the RF power supply 322.

Upon receiving the power level and the frequency level corresponding to the state S0a, the RF power supply 322 generates an RF signal having the power level and the frequency level for the state S0a of the TTL5 signal and the state S0 of the clock signal TTL1. The RF signal generated during the state S0a of the TTL5 signal and the state S0 of the clock signal TTL1 is supplied via the RF cable 308 to the impedance matching circuit 302.

It should be noted that in some embodiments, the power level and/or the frequency level during the state S0a of the TTL5 signal and the state S0 of the clock signal TTL1 is used to control, in a coarse manner, a processing rate, e.g., a rate of depositing materials on the wafer 318, or a rate of etching the wafer 318 or of etching materials on the wafer 318, or a rate of sputtering the wafer 318 or materials deposited on the wafer 318, or a rate of cleaning the wafer 318 or cleaning materials deposited on the wafer 318, etc.

Moreover, the operation of the y MHz RF generator during the state S0 is described above.

During the state S0 of the y MHz RF generator and the state S0a of the x MHz RF generator, the impedance matching circuit 302 receives the RF signals via the RF cables 308 and 310 from the x and y MHz RF generators and matches an impedance of the load with the source to generate a modified RF signal. The modified RF signal is provided via the RF transmission line 312 to the chuck 314. In some embodiments, the modified RF signal that is generated during the state S0b allows control of a rate of deposition of materials on the wafer 318 or a rate of etching the wafer 318 or material deposited on the wafer 318 or a rate of sputtering the wafer 318 or materials deposited on the wafer 318.

During the state S0, the DSPy sends a signal to the power controller PWRS0y to adjust power determined by the power controller PWRS0y at a time of transition of the x MHz RF generator from the state S0a to the state S0b or at a time of transition of the x MHz RF generator from the state S0b to the state S0a. The determined power is adjusted based on a change in plasma impedance that occurs when power delivered by the x MHz RF generator transitions between the states S0a and S0b. To compensate for the adjustment of the power delivered by the x MHz RF generator during the transitions between the states S0a and S0b, the TTL5 signal is sent from the DSPx to the DSPy. The adjustment in power delivered by the x MHz RF generator creates the change in the plasma impedance.

Moreover, during the state S0, the DSPy sends a signal to the tuner AFTS0y to adjust frequency determined by the tuner AFTS0y at a time of transition of the x MHz RF generator from the state S0a to the state S0b, or at a transition of the x MHz RF generator from the state S0b to the state S0a. The determined frequency is adjusted based on a change in plasma impedance that occurs when frequency of the x MHz RF generator transitions between the states S0a and S0b. To compensate for the adjustment of the frequency of an RF signal that is generated by the x MHz RF generator during the transitions between the states S0a and S0b, the TTL5 signal is sent from the DSPx to the DSPy. The adjustment in frequency of an RF signal supplied by the x MHz RF generator creates the change in the plasma impedance.

It should further be noted that in some embodiments, instead of sending the TTL5 signal from the DSPx to the DSPy via a cable, information regarding the TTL5 signal, e.g., a frequency of the TTL5 signal during the state S1, a duty cycle of the TTL5 signal during the state S1, a time for which the state S1a is to occur in the TTL5 signal, a time for which the state S1b is to occur in the TTL5 signal, a frequency of the TTL5 signal during the state S0, a duty cycle of the TTL5 signal during the state S0, a time for which the state S0a is to occur in the TTL5 signal, a time for which the state S0b is to occur in the TTL5 signal, etc., is provided by the tool UI system 306 to the DSPy via the cable 314 or another cable, similar to the cable 314. The other cable connects the tool UI system 306 to the DSPy. For example, the information regarding the TTL5 signal is provided within a data file from the tool UI system 306 to the DSPy. The DSPy includes virtual phase-locked loops that generates a signal that is locked to a frequency of the TTL5 signal and the signal is used to adjust the power determined by the power controller PWRS0y and/or to adjust the frequency determined by the tuner AFTS0y.

Furthermore, the operation of the x MHz RF generator during the states S1a and S1b and the operation of the y MHz RF generator during the state S1 is similar to that described above with reference to FIG. 3A.

Figure 7B:
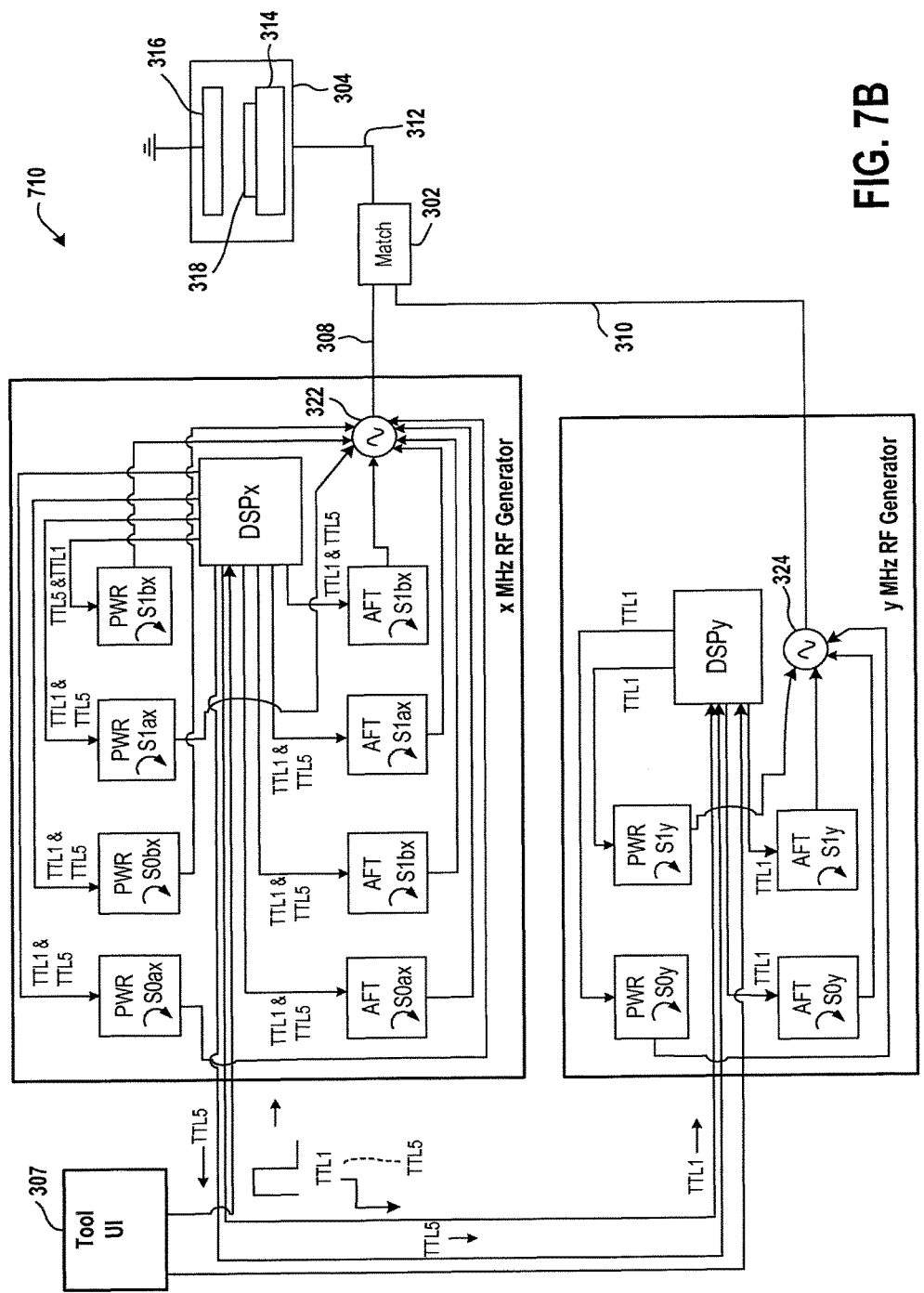
FIG. 7B is a diagram of a system for illustrating use of the four sub-states S0$a$, S0$b$, S1$a$, and S1$b$ in the x MHz RF generator when the x MHz RF generator is a master generator, in accordance with various embodiments described in the present disclosure.

FIG. 7B is a diagram of an embodiment of a system 710 in which the DSPx generates the clock signal TTL1 instead of the tool UI system 306 (FIG. 7A). The system 710 includes the tool UI system 307. The DSPx includes a clock source that generates the clock signal TTL1 and provides the clock signal TTL1 and the TTL5 signal to the DSPy of the y MHz RF generator. The remaining operation of the system 710 is similar to the system 700 of FIG. 7A.

In some embodiments, power of the RF signal that is supplied by the x MHz RF generator during the states S1a, S1b, S0a, and S0b has the same frequency as that of the signal 602 (FIG. 6A).

In various embodiments, instead of sending the TTL5 signal from the DSPx to the DSPy via a cable, the information regarding the TTL5 signal is provided from the DSPx to the DSPy via a cable that connects the DSPx to the DSPy. For example, the information regarding the TTL5 signal is provided within a data file from the DSPx to the DSPy. The DSPy includes virtual phase-locked loops that generates a signal that is locked to a frequency of the TTL5 signal and the signal is used to adjust the power determined by the power controller PWRS0y and/or to adjust the frequency determined by the tuner AFTS0y.

FIG. 8A is a diagram of an embodiment of a graph 800 to illustrate pulsing of the RF signal that is generated by the y MHz RF generator during both the states S1 and S0. The pulsing of the RF signal that is generated by the y MHz RF generator results in the two sub-states S1a and S1b during the state S1 and also results in the two sub-states S0a and S0b during the state S0. The graph 800 plots delivered power, e.g., a power level, etc., of an RF signal 802 that is a function of an RF signal generated by the y MHz RF generator and an RF signal that is reflected towards the y MHz RF generator versus time.

During the state S0 of the TTL1 signal, the RF signal 802 alternates between the states S0a and S0b. Moreover, during the state S1 of the TTL1 signal, the RF signal 802 alternates between the states S1a and S1b.

In some embodiments, a power level of the RF signal 802 during the state S0b is less than or greater than a power level of the RF signal 802 during the state S1b.

It should be noted that the use of the states S1a and S1b of the RF signal 802 during the state S1 of the TTL1 signal helps fine tune an etch rate or a deposition rate or a sputtering rate or a cleaning rate during the state S1.

Figure 8B:
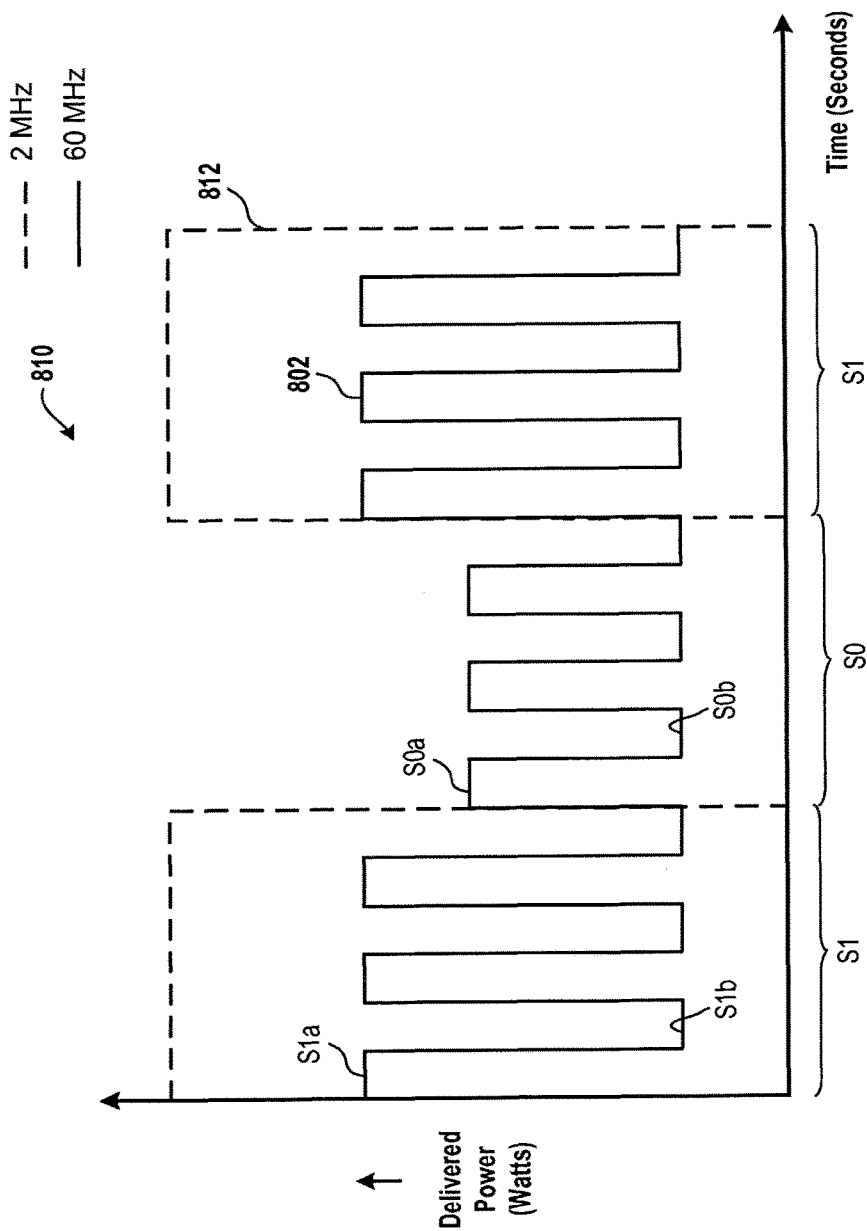
FIG. 8B is a graph to illustrate use of the x MHz RF generator in conjunction with use of the y MHz RF generator that generates an RF signal having the four sub-states S0$a$, S0$b$, S1$a$, and S1$b$, in accordance with various embodiments described in the present disclosure.

FIG. 8B is a diagram of an embodiment of a graph 810 to illustrate use of the x MHz RF generator in conjunction with use of the y MHz RF generator that generates the RF signal 802 having the four sub-states S0a, S0b, S1a, and S1b. The x MHz RF generator generates an RF signal 812 having the state S1 when the y MHz RF generator generates the RF signal 802 having the states S1a and S1b. In some embodiments, the use of the states S1a and S1b of the RF signal 802 that is generated by the y MHz RF generator allows fine control of a processing rate, e.g., an etch rate, a cleaning rate, a deposition rate, a sputtering rate, etc. when a coarse control of the rate is constant or is substantially constant. In some embodiments, a coarse control of the processing rate is substantially constant when the x MHz RF generator is operated at the power level corresponding to the state S1. Moreover, the x MHz RF generator generates the RF signal 812 having the state S0 when the y MHz RF generator generates the RF signal 802 having the states S0a and S0b.

FIG. 8C is a diagram of an embodiment of a graph 820 to illustrate a different duty cycle during the state S0 of the TTL1 signal than during the state S1 of the TTL1 signal. The graph 820 plots power delivered by the 60 MHz RF generator versus time t. The power delivered is shown as a pulsed signal 822. It should be noted that a duty cycle of the pulsed signal 822 during the state S1 is greater than 50% and that a time during which the state S1 occurs is the same as that during which the state S0 occurs. For example, the signal 822 occupies a greater amount of time during the state S1 a than that occupied during the state S1b. It should be noted that a duty cycle of the delivered power signal 822 during the state S0 is 50%.

In some embodiments, a duty cycle of the signal 822 during the state S1 is less than 50%. For example, a delivered power signal occupies a less amount of time during the state S1a than that occupied during the state S1b.

It should further be noted that a duty cycle of the signal 802 (FIGS. 8A thru 8B) during each state S0 and S1 is 50%.

In some embodiments, a duty cycle of a pulsed delivered power signal that is generated by the 60 MHz RF generator during the state S0 is greater than or less than 50% and a duty cycle of the pulsed delivered power signal during the state S1 is 50%.

In various embodiments, a duty cycle of a pulsed delivered power signal that is generated by the 60 MHz RF generator during the state S0 is greater than or less than 50% and a duty cycle of the pulsed delivered power signal during the state S1 is greater than or less than 50%.

In several embodiments, a time during which the state S1 occurs for power delivered by the y MHz RF generator is lesser than or greater than a time during which the state S0 occurs for the power delivered by the y MHz RF generator. In these embodiments, a duty cycle of the delivered power during each state S0 and S1 is 50%.

In various embodiments, a time during which the state S1 occurs for power delivered by the y MHz RF generator is lesser than or greater than a time during which the state S0 occurs for the power delivered by the y MHz RF generator. In these embodiments, a duty cycle of the delivered power during the state S1 is greater than or less than 50% and a duty cycle of the delivered power during the state S0 is equal to 50%.

In some embodiments, a time during which the state S1 occurs for power delivered by the y MHz RF generator is lesser than or greater than a time during which the state S0 occurs for the power delivered by the y MHz RF generator. In these embodiments, a duty cycle of the delivered power during the state S1 is equal to 50% and a duty cycle of the delivered power during the state S0 is greater than or less than to 50%.

In various embodiments, a time during which the state S1 occurs for power delivered by the y MHz RF generator is lesser than or greater than a time during which the state S0 occurs for the power delivered by the y MHz RF generator. In these embodiments, a duty cycle of the delivered power during the state S1 is greater than or less than 50% and a duty cycle of the delivered power during the state S0 is greater than or less than to 50%.

In some embodiments, a TTL signal has the same frequency as that of the pulsed signal 822. The TTL signal is generated by a device that generates the TTL5 signal. For example, the DSPx generates the TTL signal from the TTL1 signal and a modulating signal. The modulating signal modulates the TTL1 signal to generate the TTL signal.

Figure 9A:
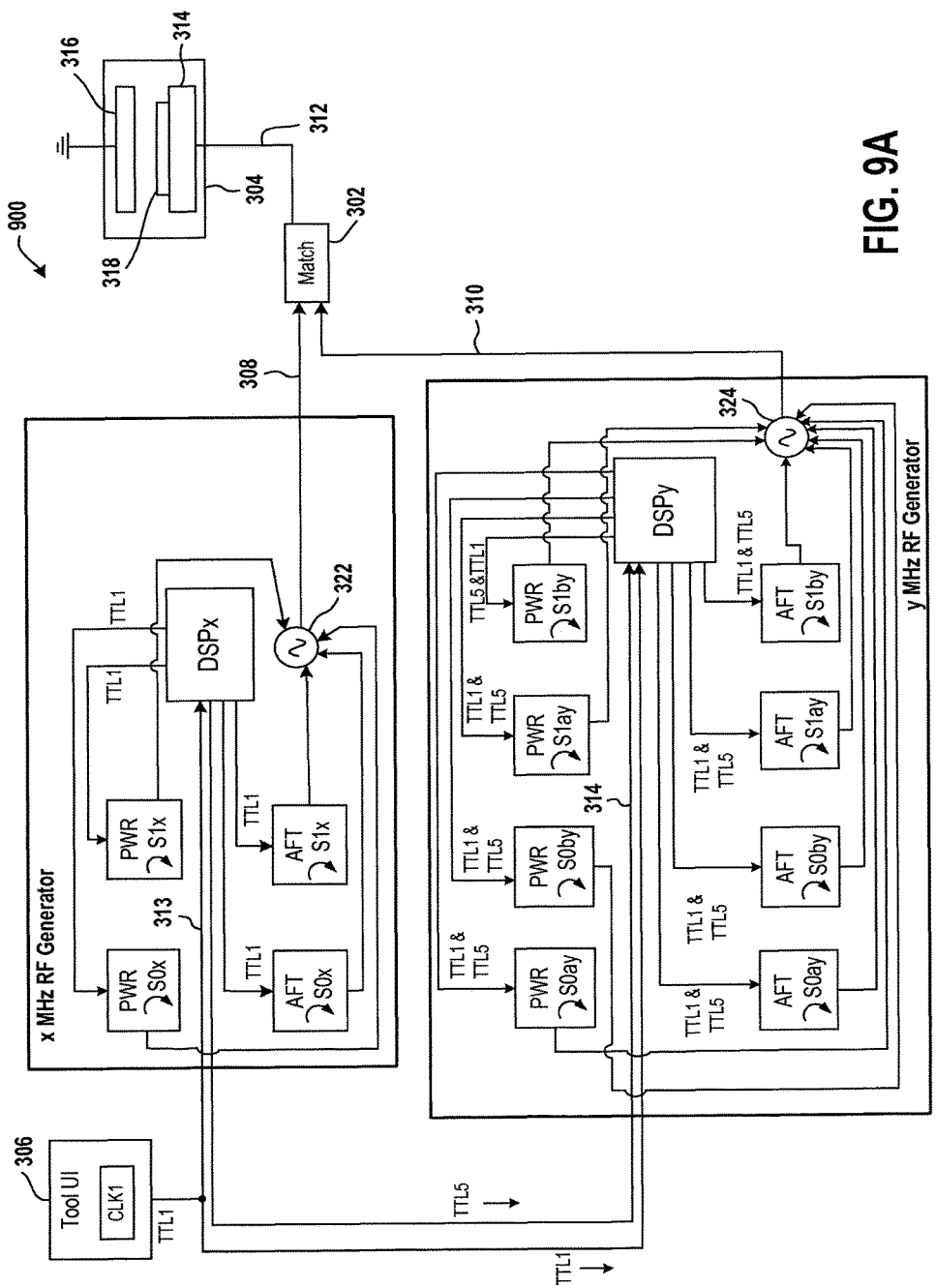
FIG. 9A is a diagram of a system for illustrating use of four sub-states S0$a$, S0$b$, S1$a$, and S1$b$ in the y MHz RF generator, in accordance with some embodiments described in the present disclosure.

FIG. 9A is a diagram of an embodiment of a system 900 for illustrating use of four sub-states S0a, S0b, S1a, and S1b in the y MHz RF generator. The system 900 includes the plasma chamber 304, the x MHz RF generator, the y MHz RF generator, and the tool UI system 306. The clock source of the tool UI system 306 generates the clock signal TTL1 and provides the clock signal TTL1 via the cable 313 to the DSPx and to the DSPy.

During the state S1b, the DSPx generates the TTL5 signal from the TTL1 signal. In various embodiments, the RF signal 802 (FIGS. 8A and 8B) has the same frequency as that of the TTL5 signal. In some embodiments, the RF signal 802 has the same frequency as that of the TTL4 signal.

Moreover, during the state S1b, the DSPx provides the TTL5 signal to the DSPy. The DSPy provides the received TTL5 signal and the received TTL1 signal to a power controller PWRS1by of the y MHz RF generator and to a tuner AFTS1by of the y MHz RF generator. For example, during the state S1b, the DSPy provides a portion of the TTL5 signal having the state S1b and the TTL1 signal having the state S1 to the power controller PWRS1by and the tuner AFTS1by. The power controller PWRS1by determines or identifies a power level upon receiving the TTL5 signal and the TTL1 signal. For example, the power controller PWRS1by identifies from a memory device of the power controller PWRS1by the power level that maps to the state S1b of the TTL5 signal and the state S1 of the TTL1 signal. The power controller PWRS1by provides the power level to the RF power supply 324.

Moreover, during the state S1b of the TTL5 signal and the state S1 of the TTL1 signal, the tuner AFTS1by determines or identifies a frequency level upon receiving the TTL5 signal. For example, the tuner AFTS1by identifies from a memory device of the tuner AFTS1by the frequency level that maps to the state S1b of the TTL5 signal and the state S1 of the TTL1 signal. The tuner AFTS1by provides the frequency level to the RF power supply 324.

Upon receiving the power level and the frequency level corresponding to the state S1b of the TTL5 signal and the state S1 of the TTL1 signal, the RF power supply 324 generates an RF signal having the power level and the frequency level for the state S1b. The RF signal generated during the state S1b of the TTL5 signal and the state S1 of the TTL1 signal is supplied via the RF cable 310 to the impedance matching circuit 302.

It should be noted that in some embodiments, the power level and/or the frequency level during the state S1b of the TTL5 signal and the state S1 of the TTL1 signal is used to control, in a fine manner, a processing rate, e.g., a rate of depositing materials on the wafer 318, or a rate of etching the wafer 318 or of etching materials on the wafer 318, or a rate of sputtering the wafer 318 or materials deposited on the wafer 318, or a rate of cleaning the wafer 318 or materials on the wafer 318, etc.

Moreover, during the state S1, the DSPx receives the TTL1 signal from the Tool UI system 306 and provides the TTL1 signal to the power controller PWRS1x. The remaining operation of the x MHz RF generator is similar to that described above with reference to FIG. 5A for generation of the RF signal.

During the state S1 of the x MHz RF generator and the state S1b of the y MHz RF generator, the impedance matching circuit 302 receives the RF signals via the RF cables 308 and 310 from the x and y MHz RF generators, matches an impedance of the load with the source to generate a modified RF signal. The modified RF signal is provided via the RF transmission line 312 to the chuck 314. In some embodiments, the modified RF signal that is generated during the state S1b allows control of a processing rate, e.g., a rate of deposition of materials on the wafer 318 or a rate of etching the wafer 318 or material deposited on the wafer 318 or a rate of sputtering the wafer 318 or materials deposited on the wafer 318 or a rate of cleaning the wafer 318 or materials on the wafer 318, etc.

Furthermore, during the state S1a of the TTL5 signal and the state S1 of the TTL1 signal, the DSPy provides the received TTL5 signal and the TTL1 signal to a power controller PWRS1ay of the y MHz RF generator and to a tuner AFTS1ay of the y MHz RF generator. For example, during the state S1a of the TTL5 signal and the state S1 of the TTL1 signal, the DSPy provides a portion of the TTL5 signal having the state S1a and the TTL1 signal having the state S1 to the power controller PWRS1ay and the tuner AFTS1ay. The power controller PWRS1ay determines or identifies a power level upon receiving the TTL5 signal and the TTL1 signal. For example, the power controller PWRS1ay identifies from a memory device of the power controller PWRS1ay the power level that maps to the state S1a of the TTL5 signal and the state S1 of the TTL1 signal. The power controller PWRS1ay provides the power level to the RF power supply 324.

Moreover, during the state S1a of the TTL5 signal and the state S1 of the TTL1 signal, the tuner AFTS1ay determines or identifies a frequency level upon receiving the TTL5 signal. For example, the tuner AFTS1ay identifies from a memory device of the tuner AFTS1ay the frequency level that maps to the state S1a of the TTL5 signal and the state S1 of the TTL1 signal. The tuner AFTS1ay provides the frequency level to the RF power supply 324.

Upon receiving the power level and the frequency level corresponding to the state S1a of the TTL5 signal and the state S1 of the TTL1 signal, the RF power supply 324 generates an RF signal having the power level and the frequency level for the state S1a. The RF signal generated during the state S1a of the TTL5 signal and the state S1 of the TTL1 signal is supplied via the RF cable 310 to the impedance matching circuit 302.

It should be noted that in some embodiments, the power level and/or the frequency level during the state S1a of the TTL5 signal and the state S1 of the TTL1 signal is used to control, in a fine manner, a processing rate associated with the wafer 318, e.g., a rate of depositing materials on the wafer 318, or a rate of etching the wafer 318 or of etching materials on the wafer 318, or a rate of sputtering the wafer 318 or materials deposited on the wafer 318, or a rate of cleaning the wafer 318 or materials on the wafer 318, etc.

Moreover, the operation of the x MHz RF generator during the state S1 is described above.

During the state S1 of the x MHz RF generator and the state S1a of the y MHz RF generator, the impedance matching circuit 302 receives the RF signals via the RF cables 308 and 310 from the x and y MHz RF generators and matches an impedance of the load with the source to generate a modified RF signal. The modified RF signal is provided via the RF transmission line 312 to the chuck 314. In some embodiments, the modified RF signal that is generated during the state S1a allows control of a processing rate, e.g., a rate of deposition of materials on the wafer 318 or a rate of etching the wafer 318 or material deposited on the wafer 318 or a rate of sputtering the wafer 318 or materials deposited on the wafer 318 or a rate of cleaning the wafer 318 or materials on the wafer 318, etc.

Furthermore, the operation of the y MHz RF generator during the states S0a and S0b and the operation of the x MHz RF generator during the state S0 is similar to that described above with reference to FIG. 5A.

Figure 9B:
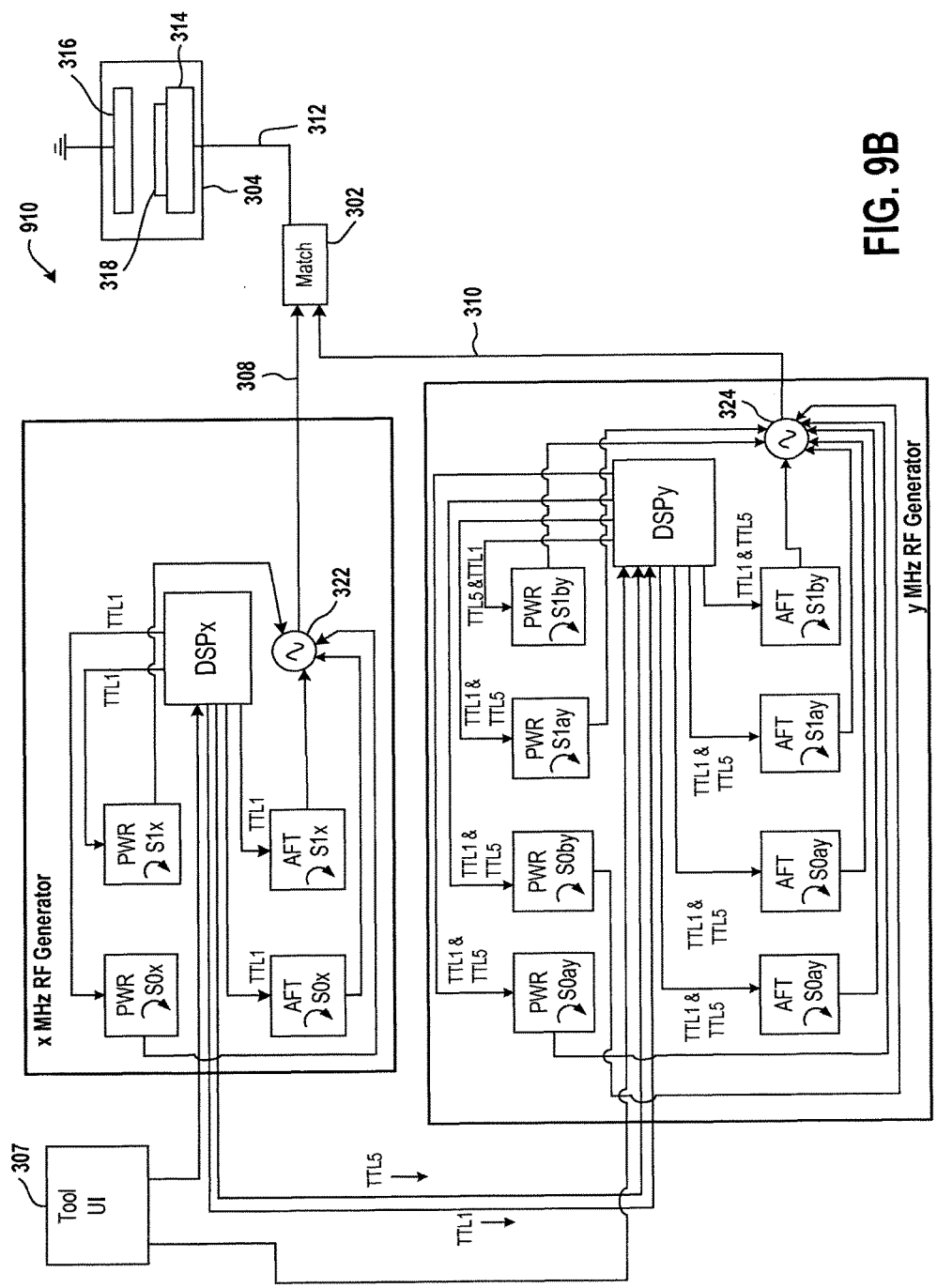
FIG. 9B is a diagram of a system for illustrating use of four sub-states S0$a$, S0$b$, S1$a$, and S1$b$ in the y MHz RF generator when the x MHz RF generator is a master generator, in accordance with various embodiments described in the present disclosure.

FIG. 9B is a diagram of an embodiment of a system 910 in which the DSPx generates the clock signal TTL1 instead of the tool UI system 306 (FIG. 7A). The system 910 includes the tool UI system 307. The DSPx includes a clock source that generates the clock signal TTL1. The DSPx generates the digital pulsed signal TTL5 from the clock signal TTL1, provides the digital pulsed signal TTL5 to the DSPy of the y MHz RF generator via a cable, and provides the TTL1 signal to the DSPy via a cable. The remaining operation of the system 910 is similar to the system 900 of FIG. 9A.

In some embodiments, power of the RF signal that is supplied by the y MHz RF generator during the states S1a, S1b, S0a, and S0b has the same frequency as that of the signal 802 (FIG. 8A).

Figure 10A:
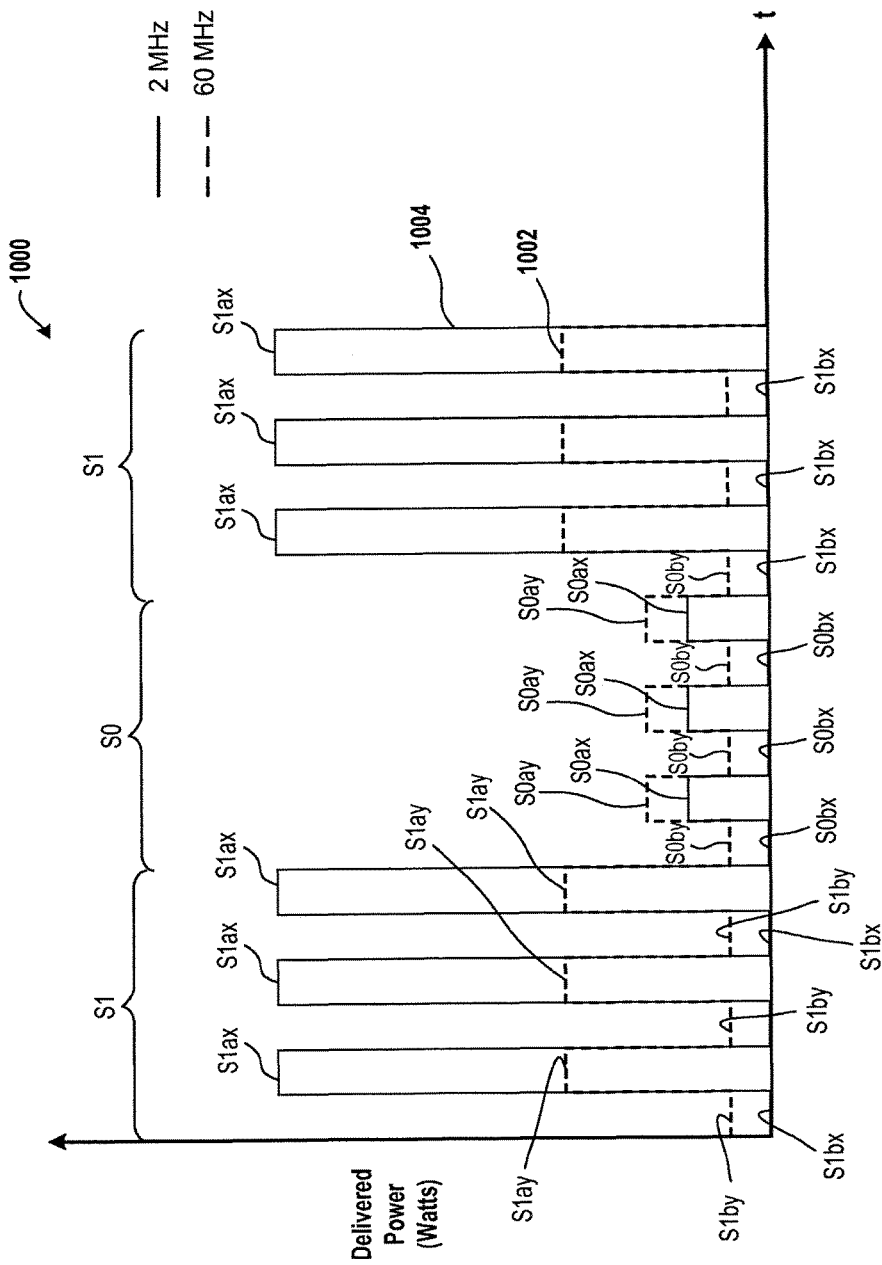
FIG. 10A is a diagram of a graph for illustrating multiple sub-states of both the x and y MHz RF generators, in accordance with various embodiments described in the present disclosure.

FIG. 10A is a diagram of an embodiment of a graph 1000 for illustrating multiple sub-states of both the x and y MHz RF generators. The graph 1000 plots delivered power versus time. The power is delivered by the x and y MHz RF generators in the graph 1000. When the x MHz RF generator transitions during the state S1 of the TTL1 signal from the state S1bx to the state S1ax, the y MHz generator transitions from the state S1by to the state S1ay. Moreover, when the x MHz RF generator transitions during the state S1 of the TTL1 signal from the state S1ax to the state S1bx, the y MHz generator transitions from the state S1ay to the state S1by. Furthermore, when the x MHz RF generator is in the state S1ax during the state S1 of the TTL1 signal, the y MHz RF generator is in the state S1ay. Also, when the x MHz RF generator is in the state S1*bx* during the state S1 of the TTL1 signal, the y MHz RF generator is in the state S1*by*.

When the x MHz RF generator transitions during the state S0 of the TTL1 signal from the state S0*bx* to the state S0*ax*, the y MHz generator transitions from the state S0*by* to the state S0*ay*. Moreover, when the x MHz RF generator transitions during the state S0 of the TTL1 signal from the state S0*ax* to the state S0*bx*, the y MHz generator transitions from the state S0*ay* to the state S0*by*. Furthermore, when the x MHz RF generator is in the state S0*ax* during the state S0 of the TTL1 signal, the y MHz RF generator is in the state S0*ay*. Also, when the x MHz RF generator is in the state S0*bx* during the state S0 of the TTL1 signal, the y MHz RF generator is in the state S0*by*.

It should be noted that a delivered power level of a power signal 1002 that is delivered by the y MHz RF generator is greater during the state S1*ay* than that during the state S1*by*. Moreover, a delivered power level of a power signal 1004 that is delivered by the x MHz RF generator is greater during the state S1*ax* than that during the state S1*bx*.

Moreover, it should be noted that a delivered power level of the power signal 1002 that is delivered by the y MHz RF generator is greater during the state S0*ay* than that during the state S0*by*. Moreover, a delivered power level of the power signal 1004 that is delivered by the x MHz RF generator is greater during the state S0*ax* than that during the state S0*bx*.

In some embodiments, a delivered power level of the power signal 1002 that is delivered by the y MHz RF generator is less during the state S0*by* than a delivered power level of the power signal 1004 that is delivered by the x MHz RF generator during the state S0*bx*.

In several embodiments, a delivered power level of the power signal 1002 that is delivered by the y MHz RF generator is less during the state S1*by* than a delivered power level of the power signal 1004 that is delivered by the x MHz RF generator during the state S1*bx*.

Figure 10B:
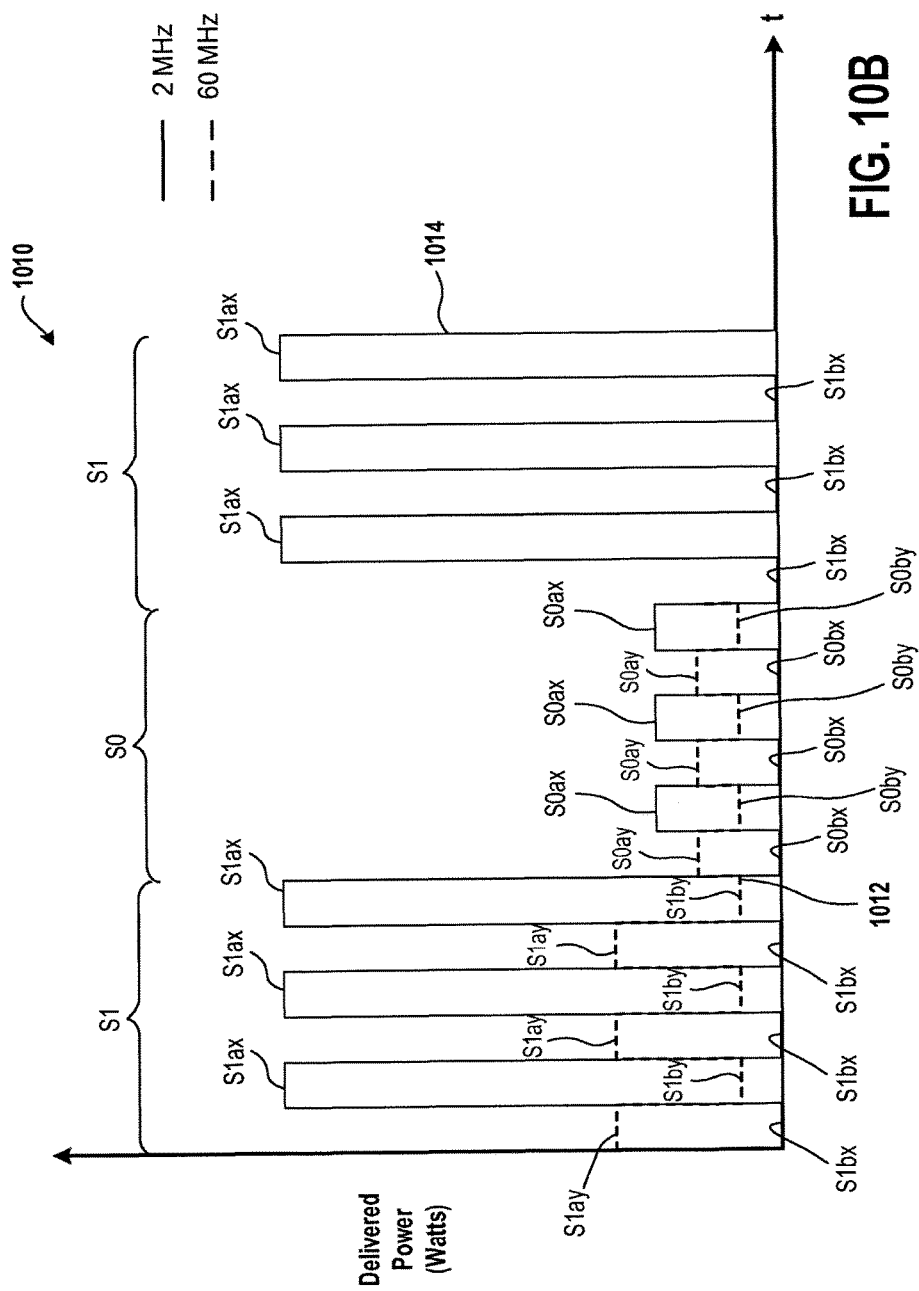
FIG. 10B is a diagram of a graph for illustrating multiple sub-states of both the x and y MHz RF generators, in accordance with several embodiments described in the present disclosure.

FIG. 10B is a diagram of an embodiment of a graph 1010 for illustrating multiple sub-states of both the x and y MHz RF generators. The graph 1010 plots delivered power versus time. The power is delivered by the x and y MHz RF generators in the graph 1010. When the x MHz RF generator transitions during the state S1 of the TTL1 signal from the state S1*bx* to the state S1*ax*, the y MHz generator transitions from the state S1*ay* to the state S1*by*. Moreover, when the x MHz RF generator transitions during the state S1 of the TTL1 signal from the state S1*ax* to the state S1*bx*, the y MHz generator transitions from the state S1*by* to the state S1*ay*. Furthermore, when the x MHz RF generator is in the state S1*ax* during the state S1 of the TTL1 signal, the y MHz RF generator is in the state S1*by*. Also, when the x MHz RF generator is in the state S1*bx* during the state S1 of the TTL1 signal, the y MHz RF generator is in the state S1*ay*.

When the x MHz RF generator transitions during the state S0 of the TTL1 signal from the state S0*bx* to the state S0*ax*, the y MHz generator transitions from the state S0*ay* to the state S0*by*. Moreover, when the x MHz RF generator transitions during the state S0 of the TTL1 signal from the state S0*ax* to the state S0*bx*, the y MHz generator transitions from the state S0*by* to the state S0*ay*. Furthermore, when the x MHz RF generator is in the state S0*ax* during the state S0 of the TTL1 signal, the y MHz RF generator is in the state S0*by*. Also, when the x MHz RF generator is in the state S0*bx* during the state S0 of the TTL1 signal, the y MHz RF generator is in the state S0*ay*.

It should be noted that a delivered power level of a delivered power signal 1012 that is generated by the y MHz RF generator is greater during the state S1*ay* than that during the state S1*by*. Moreover, a delivered power level of a delivered power signal 1014 that is generated by the x MHz RF generator is greater during the state S1*ax* than that during the state S1*bx*.

Moreover, it should be noted that a delivered power level of the delivered power signal 1012 that is generated by the y MHz RF generator is greater during the state S0*ay* than that during the state S0*by*. Moreover, a delivered power level of the delivered power signal 1014 that is generated by the x MHz RF generator is greater during the state S0*ax* than that during the state S0*bx*.

In some embodiments, a delivered power level of the delivered power signal 1012 that is generated by the y MHz RF generator is less during the state S0*by* than a delivered power level of the delivered power signal 1014 that is generated by the x MHz RF generator during the state S0*bx*.

In several embodiments, a delivered power level of the delivered power signal 1012 that is generated by the y MHz RF generator is less during the state S1*by* than a delivered power level of the delivered power signal 1014 that is generated by the x MHz RF generator during the state S1*bx*.

Figure 11A:
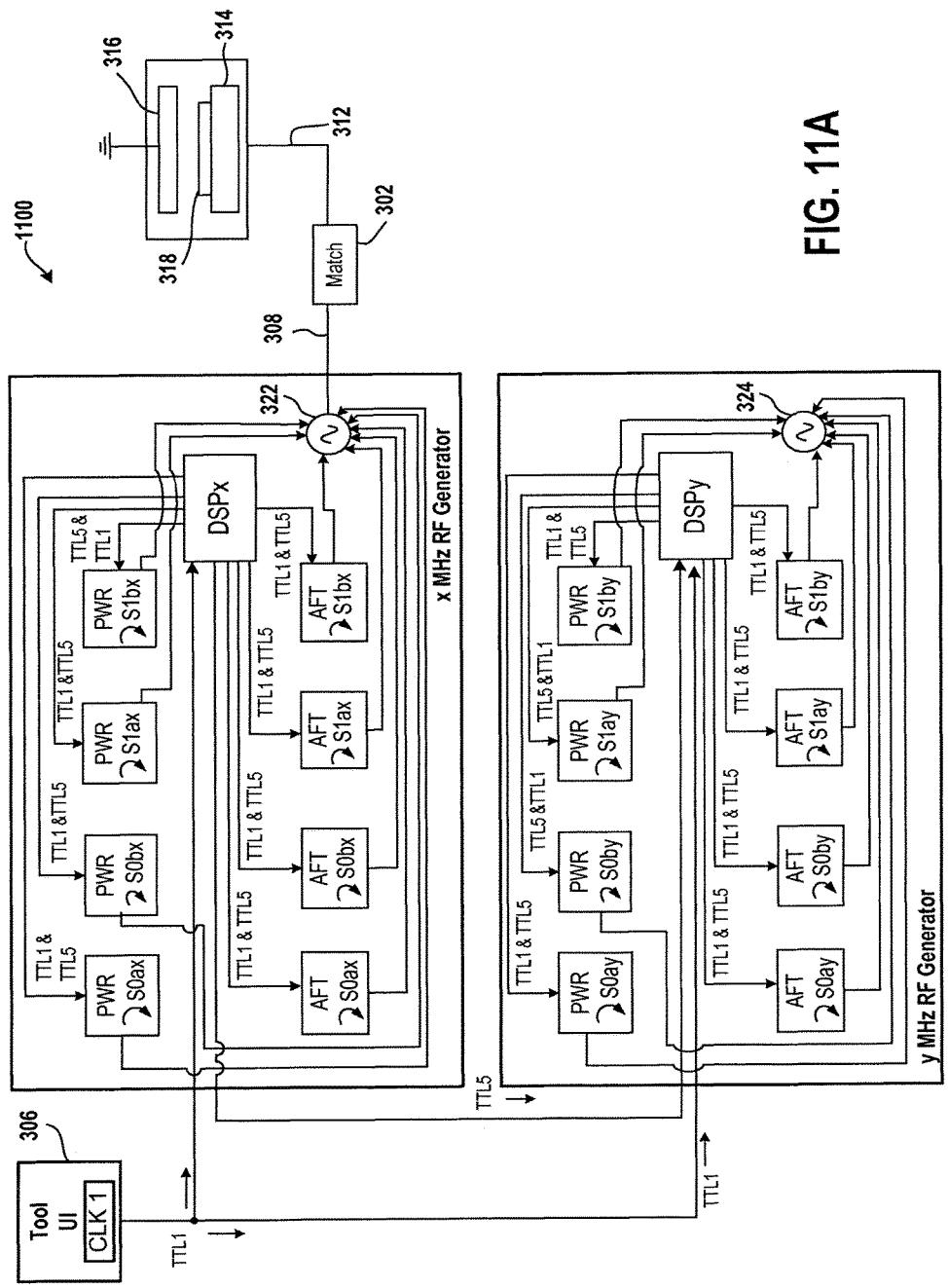
FIG. 11A is a diagram of a system for illustrating use of sub-pulsing in both the x and y MHz RF generators at the same time, in accordance with some embodiments described in the present disclosure.

FIG. 11A is a diagram of an embodiment of a system 1100 for illustrating use of sub-pulsing in both the x and y MHz RF generators at the same time. The tool UI system 306 includes a clock source that generates and provides the TTL1 signal to both the DSPx and the DSPy via corresponding cables. The DSPx generates the TTL5 signal upon receiving the clock signal TTL1 and provides the clock signal TTL5 to the DSPy. The remaining operation of the x MHz RF generator is similar to that described above with respect to FIG. 7A. Moreover, the remaining operation of the y MHz RF generator is similar to that described above with respect to FIG. 9A.

Figure 11B:
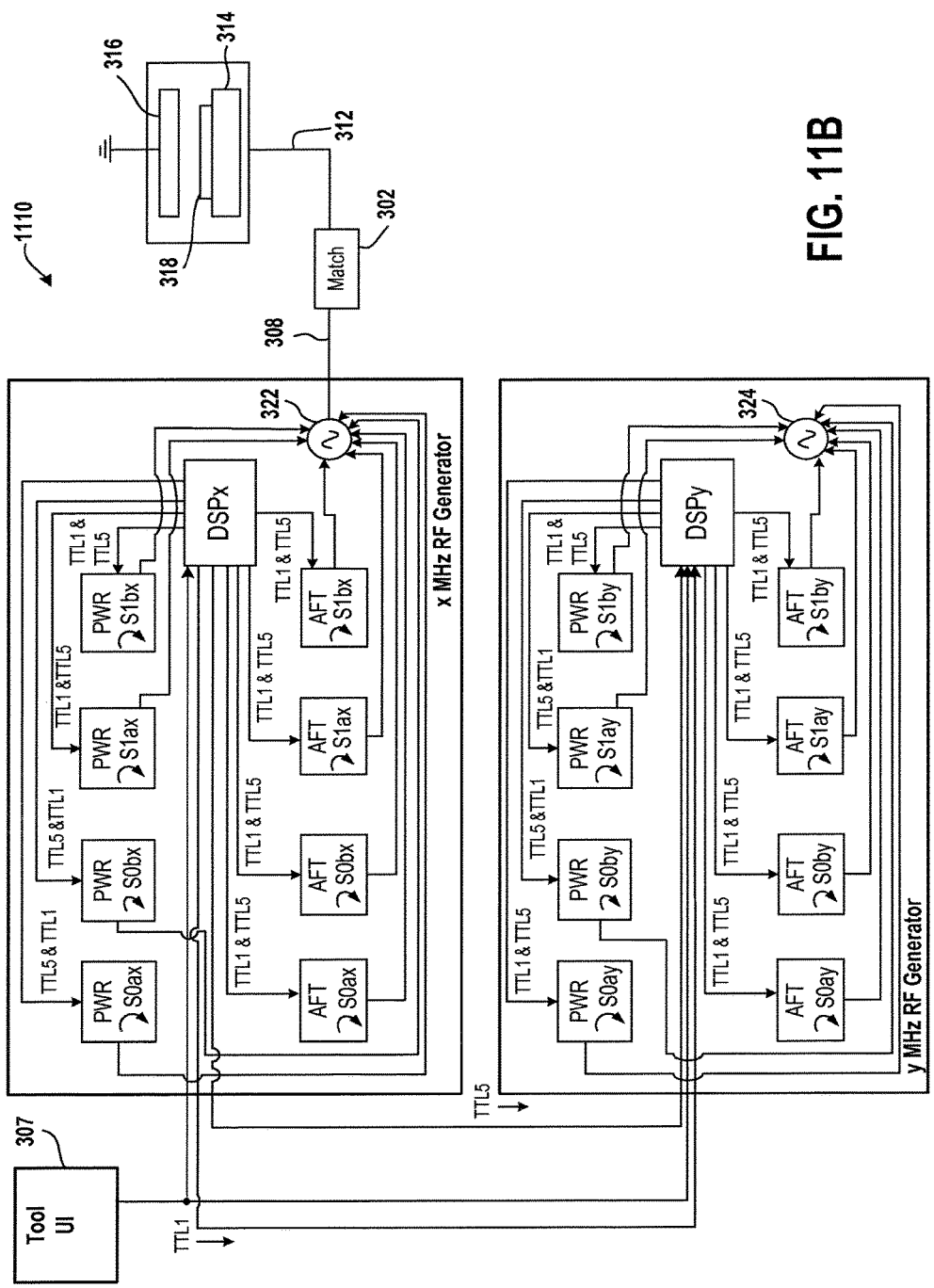
FIG. 11B is a diagram of a system for illustrating use of sub-pulsing in both the x and y MHz RF generators at the same time when the x MHz RF generator acts as a master generator, in accordance with various embodiments described in the present disclosure.

FIG. 11B is a diagram of an embodiment of a system 1110 for illustrating use of sub-pulsing in both the x and y MHz RF generators at the same time when the x MHz RF generator acts as a master generator. The DSPx generates the TTL1 and TTL5 signals, and provides both the signals TTL1 and TTL5 to the DSPy via corresponding cables. The remaining operation of the x MHz RF generator is similar to that described above with respect to FIG. 7B. Moreover, the remaining operation of the y MHz RF generator is similar to that described above with respect to FIG. 9B.

Figure 12:
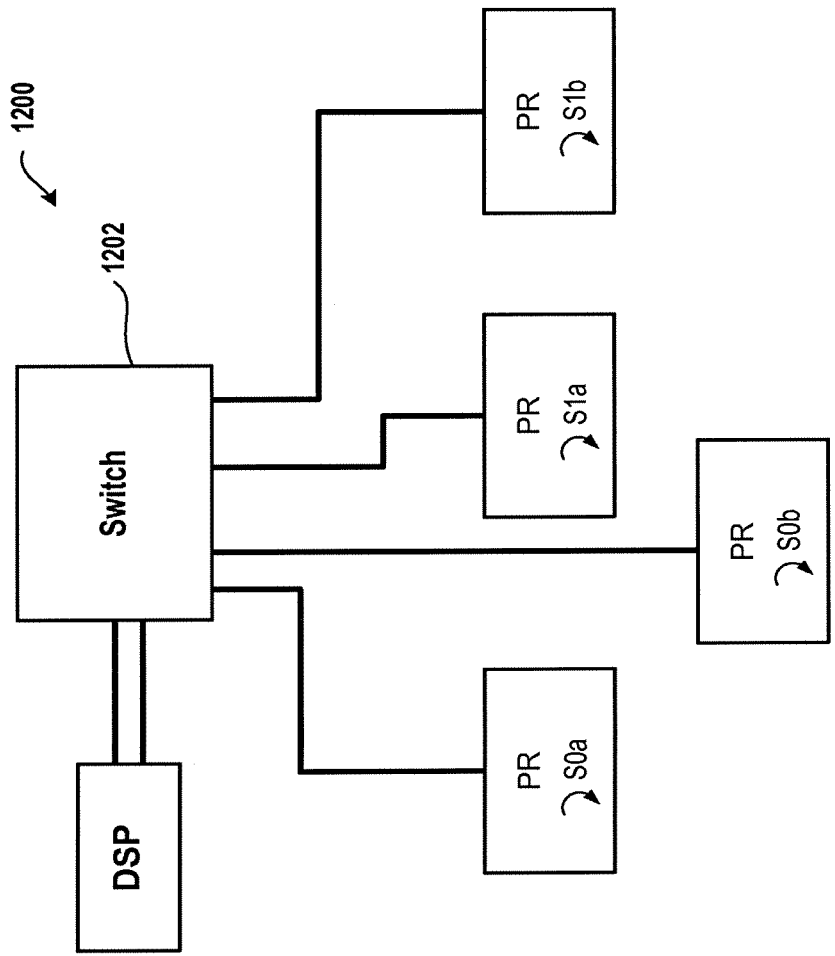
FIG. 12 is a diagram of a system for illustrating use of a switch to select one of the four sub-states S1a, S1b, S0a, and S0b in either the x MHz RF generator or the y MHz RF generator, in accordance with several embodiments described in the present disclosure.

FIG. 12 is a diagram of an embodiment of a system 1200 for illustrating use of a switch 1202 to select one of the four sub-states S1*a*, S1*b*, S0*a*, and S0*b* in either the x MHz RF generator or the y MHz RF generator. An example of the switch 1202 includes a multiplexer. In some embodiments, the switch 1202 is implemented as a computer program or as hardware within a DSP, e.g., the DSPx or the DSPy. The switch 1202 is connected to the DSP. For example, when the switch 1202 is located within the x MHz RF generator, the switch 1202 is connected to the DSPx and when the switch 1202 is located within the y MHz RF generator, the switch 1202 is connected to the DSPy.

The DSP generates bits "00" when a state of a TTL signal, e.g., the digital pulsed signal TTL3, the digital pulsed signal TTL5, etc., is S0*a*, generates bits "01" when a state of the TTL signal is S0*b*, generates bits "10" when a state of the TTL signal is S1*a*, and generates bits "11" when a state of the TTL signal is S1*b*. The TTL signal is generated by the DSP or is received by the DSP. For example, the DSPx generates the digital pulsed signal TTL3 or the TTL signal TTL5 and the DSPy receives the digital pulsed signal TTL3 or the digital pulsed signal TTL5.

When the switch 1202 of an RF generator receives the bits "00", the switch 1202 sends a signal to a parameter controller, e.g., a power controller, an auto frequency tuner, etc., PRS0a of the RF generator. Upon receiving the signal indicating the bits "00" from the switch 1202, the parameter controller PRS0a identifies a parameter level, e.g., a frequency level, a power level, etc., from a mapping between the bits "00" and the parameter level.

Similarly, when the switch 1202 of an RF generator receives the bits "01", the switch 1202 sends a signal to a parameter controller PRS0b of the RF generator. Upon receiving the signal indicating the bits "01" from the switch 1202, the parameter controller PRS0b identifies a parameter level from a mapping between the bits "01" and the parameter level.

Furthermore, when the switch 1202 of an RF generator receives the bits "10", the switch 1202 sends a signal to a parameter controller PRS1a of the RF generator. Upon receiving the signal indicating the bits "10" from the switch 1202, the parameter controller PRS1a identifies a parameter level from a mapping between the bits "10" and the parameter level.

Moreover, when the switch 1202 of an RF generator receives the bits "11", the switch 1202 sends a signal to a parameter controller PRS1b of the RF generator. Upon receiving the signal indicating the bits "11" from the switch 1202, the parameter controller PRS1b identifies a parameter level from a mapping between the bits "11" and the parameter level.

Figure 13A:
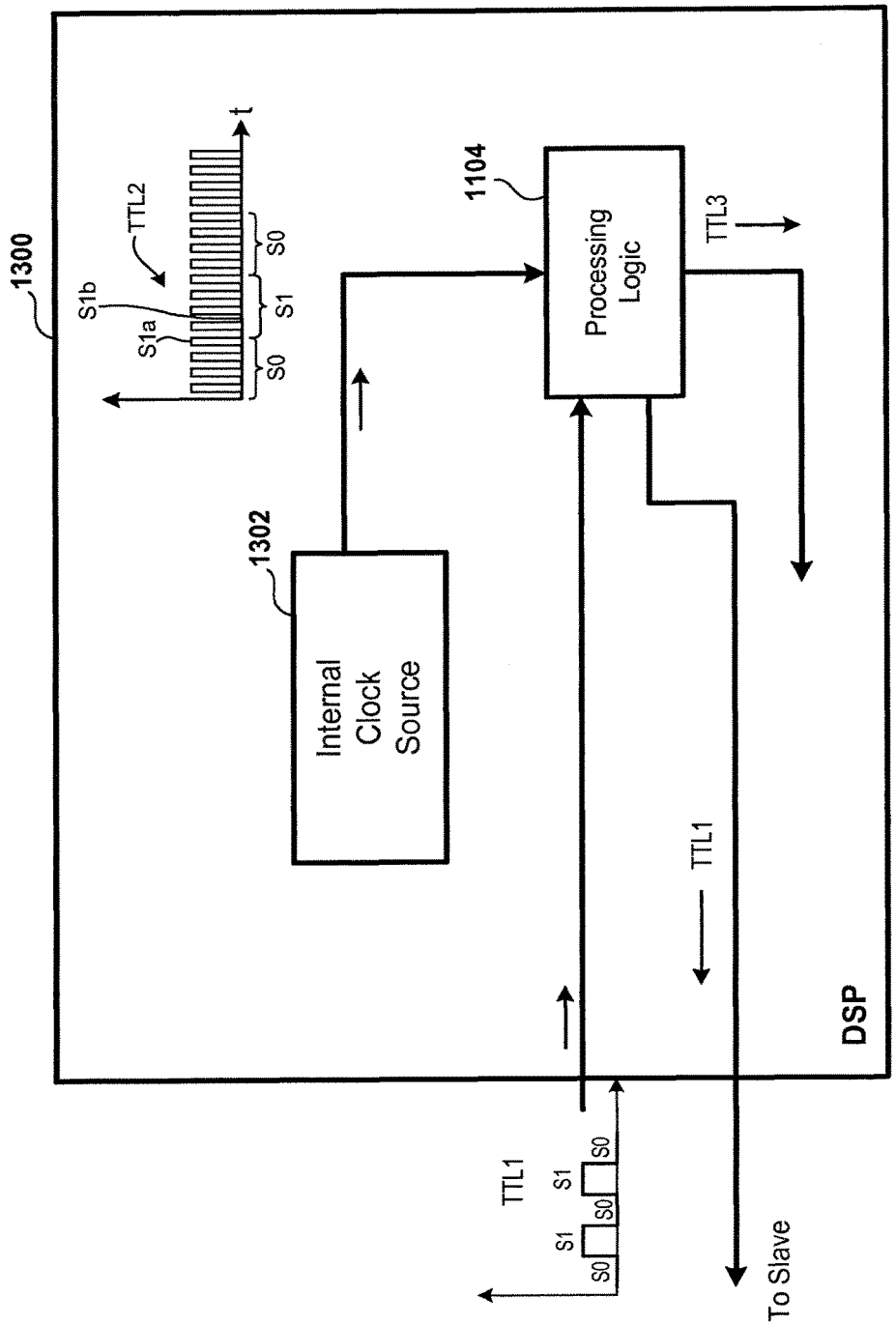
FIG. 13A is a diagram of a digital signal processor (DSP) to illustrate use of an internal clock source to generate a digital pulsed signal, in accordance with some embodiments described in the present disclosure.

FIG. 13A is a diagram of an embodiment of a DSP 1300 to illustrate generation of the TTL3 digital pulsed signal. The DSP 1300 includes an internal clock source 1302 and a processing logic 1104, e.g., a computer program, an ASIC, a PLD, etc. In some embodiments, the DSP 1300 includes a memory device for storing the processor logic 1104.

The TTL1 signal is generated by an external clock source, e.g., the clock source of the tool UI system 306 (FIG. 3A), another clock source outside the tool UI system 306, etc. Moreover, the TTL2 signal is generated by the internal clock source 1302. For example, the TTL2 signal has a higher frequency than that of the TTL1 signal.

The processing logic 1104 receives the TTL1 clock signal and the TTL2 signal, multiplies the signals TTL1 and TTL2 to generate the TTL3 signal, which is supplied to a parameter controller of an RF generator, e.g., the x MHz RF generator, the y MHz RF generator, etc., in which the DSP 1300 is located or to a parameter controller of another RF generator, e.g., the y MHz RF generator, the x MHz RF generator, etc.

In various embodiments, the DSP 1300 includes a switch that selects between the TTL1 signal and the TTL2 signal based on a state of the TTL1 signal. For example, when the TTL1 signal is in the state S0, the switch selects the TTL1 signal for providing to a parameter controller of the RF generator in which the DSP 1300 is located or to a parameter controller of another RF generator. Moreover, in this example, when the TTL1 signal is in the state S1, the switch selects the TTL2 signal for providing to a parameter controller of the RF generator in which the DSP 1300 is located or to a parameter controller of another RF generator. In this example, a portion of the TTL2 signal having the states S1a and S1b is selected during the state S1 of the TTL1 signal.

Figure 13B:
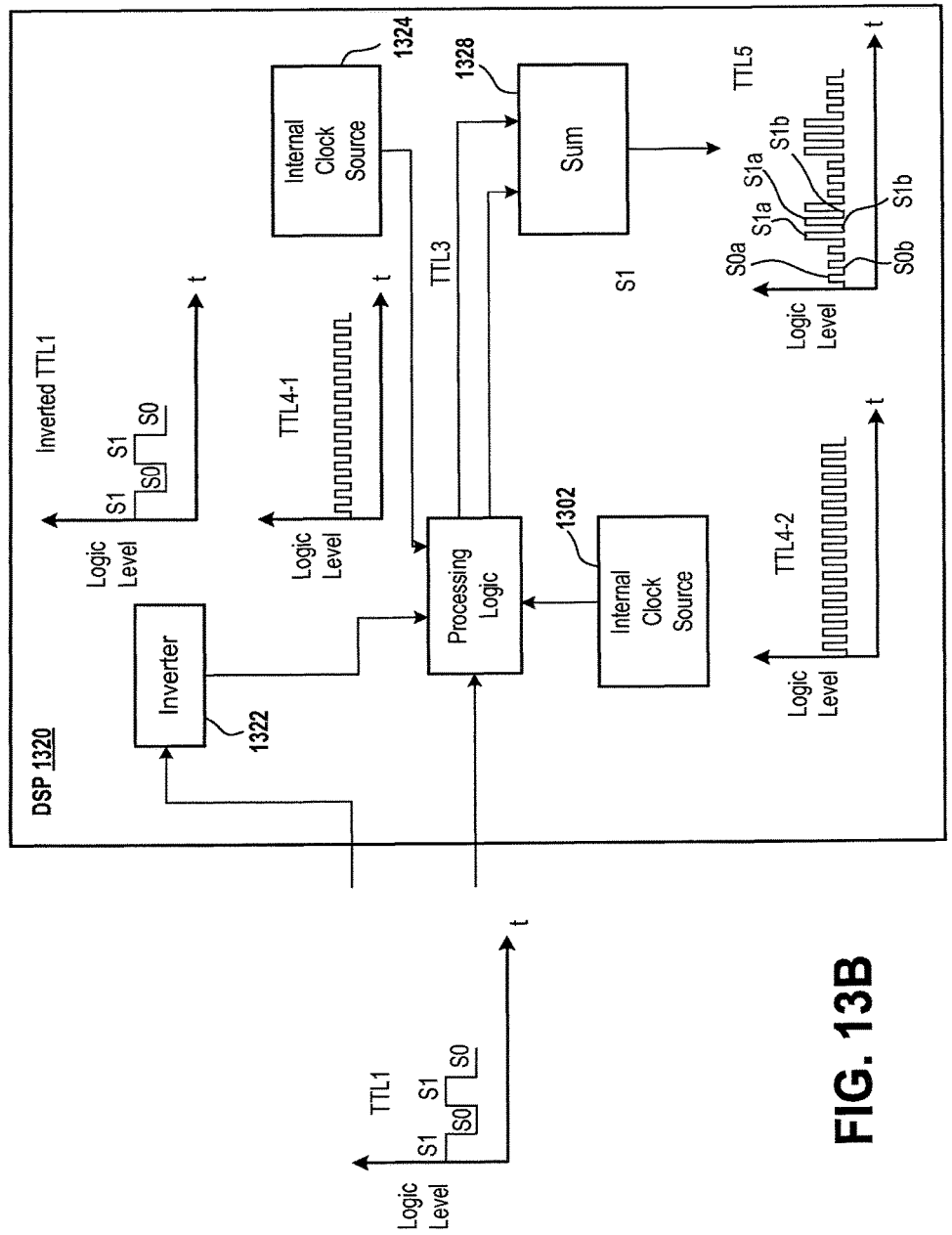
FIG. 13B is a diagram of a DSP to illustrate use of multiple internal clock sources to generate a digital pulsed signal, in accordance with various embodiments described in the present disclosure.

FIG. 13B is a diagram of an embodiment of a DSP 1320 that is used to generate the TTL5 signal. Examples of the DSP 1320 include the DSPx and the DSPy. The DSP 1320 includes the internal clock source 1302, an inverter 1322, another internal clock source 1324, a processing logic 1326, and a summer 1328.

In some embodiments, the summer 1328, the processing logic 1326, and the inverter 1322 are implemented as hardware, e.g., using logic gates, etc. In various embodiments, the summer 1328, the processing logic 1326, and the inverter 1322 are implemented as a computer program, e.g., processing logic, etc., that is executed by the DSP 1320.

The internal clock source 1302 generates a TTL4-2 signal, e.g., the TTL2 signal, etc., which is a clock signal. The processing logic 1326 processes the TTL4-2 signal and the clock signal TTL1 to generate the TTL3 signal. For example, the processing logic 1326 multiplies the TTL4-2 signal with the clock signal TTL1 to generate the TTL3 digital pulsed signal. The digital pulsed signal TTL3 is provided to the summer 1328.

Moreover, the inverter 1322 receives the TTL1 signal and inverts logic levels of the TTL1 signal. For example, the logic level 1 of the TTL1 signal is inverted to a logic level 0 and the logic level 0 of the TTL1 signal is inverted to a logic level 1. The processing logic 1326 receives an inverted TTL1 signal that is generated by the inverter 1322. Moreover, the internal clock source 1324 generates a clock signal TTL4-1 to provide to the processing logic 1326. The processing logic 1326 processes the clock signal TTL4-1 and the TTL1 clock signal to generate a TTL signal, which is added by the summer 1328 to the TTL3 signal to generate the TTL5 signal.

It should be noted that in some embodiments, a frequency of each of the TTL4-1 signal and that of the TTL4-2 signal is greater than a frequency of the TTL1 signal. In various embodiments, a frequency of the TTL4-1 signal is the same as a frequency of the TTL4-2 signal.

In some embodiments, the DSP 1320 includes a clock source that has the same frequency as that of the pulsed signal 602 (FIG. 6A) or the pulsed signal 802 (FIG. 8A).

FIG. 14 is a diagram of an embodiment of a DSP 1400 that uses a modulating signal 1203 to determine whether to generate the sub-states Sna and Snb or to generate the state Sm. Each of the DSPx and the DSPy is an example of the DSP 1400. The DSP 1400 receives a clock signal Clk, e.g., the TTL1 signal, etc., having the states Sm and Sn. In some embodiments, the state Sm is a high logic level state and the state Sn is a low logic level state. The high logic level is higher than the low logic level.

The DSP 1400 also receives the modulating signal 1203 that has three logic levels including a high logic level, an intermediate logic level, and a low logic level. The intermediate logic level is higher than the low logic level and the high logic level is higher than the intermediate logic level. Moreover, the intermediate logic level is achieved with a transition from the low level that is longer than a transition from the intermediate logic level to the high logic level.

The DSP 1400 determines that the modulating signal 1203 has a slower transition from the state Sn to the state Sm of the clock signal Clk than a transition from the state Sm to the state Sn of the clock signal Clk. Moreover, the DSP 1400 determines that the modulating signal 1203 has achieved the intermediate logic level during the state Sm of the clock signal Clk. The DSP 1400 generates a clock 1 signal Clk1, e.g., the TTL3 signal, etc., that has the state Sm upon determining that the transition from the state Sn to the state Sm of the clock signal Clk is slower than the transition from the state Sm to the state Sn of the clock signal Clk and upon determining that the modulating signal 1203 has achieved the intermediate logic level during the state Sm of the clock signal Clk.

Moreover, the DSP 1400 determines that the modulating signal 1203 has a faster transition from the state Sm to the state Sn of the clock signal Clk than a transition from the state Sn to the state Sm of the clock signal Clk. Moreover, the DSP 1400 determines that the modulating signal 1203 has achieved the high logic level during the state Sn of the clock signal Clk. The DSP 1400 generates the Clk1 signal that has the sub-states Sna and Snb upon determining that the transition from the state Sm to the state Sn of the clock signal Clk is greater than the transition from the state Sn to the state Sm of the clock signal Clk and upon determining that the modulating signal 1203 has achieved the high logic level during the state Sn of the clock signal Clk.

It should further be noted that a single clock source, e.g., the clock source that generates the clock signal Clk is used in the description of FIG. 14.

In various embodiments, a level, as used herein, includes a range. For example, a power level includes a range of amounts of power, e.g., ranging between 1950 watts and 2050 watts, ranging between 1900 watts and 2100 watts, ranging between 950 watts and 1050 watts, ranging between 900 watts and 1300 watts, etc. As another level, a frequency level includes a range of frequencies, e.g., ranging between 1.9 MHz and 2.1 MHz, ranging between 1.7 and 2.3 MHz, ranging between 58 MHz and 62 MHz, ranging between 55 MHz and 65 MHz, ranging between 25 and 29 MHz, ranging between 23 and 31 MHz, etc.

Moreover, in various embodiments, a level that is identified from a memory device of a controller or a memory device of a tuner is associated, e.g., mapped, linked, etc., with a processing rate, e.g., an etch rate, or a deposition rate, or a sputtering rate, etc., or processing the wafer 318.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, the x MHz RF generator and the y MHz RF generator are coupled to an inductor within the ICP plasma chamber.

It is also noted that although the operations above are described as being performed by a DSP, in some embodiments, the operations may be performed by one or more processors of the tool UI system 306 (FIG. 3A) or by multiple processors of multiple tool UI systems or by a combination of a DSP of an RF generator and a processor of the tool UI system 306.

It should be noted that although the above-described embodiments relate to providing one or more RF signals to the lower electrode of the chuck 314 of the plasma chamber 304, and grounding an upper electrode 316 of the plasma chamber 304, in several embodiments, the one or more RF signals are provided to the upper electrode 316 while the lower electrode is grounded.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method comprising:
generating a pulsed signal based on information regarding the pulsed signal, the pulsed signal having sub-states within a first state and having sub-states within a second state, the sub-states of the first state alternating with respect to each other at a frequency greater than a frequency of the first and second states and the sub-states of the second state alternating with respect to each other at a frequency greater than the frequency of the first and second states;
providing the pulsed signal to control power of a first radio frequency (RF) signal that is generated by a first RF generator, the power controlled to be synchronous with the pulsed signal; and
supplying the first RF signal having the sub-states of the first state and having the sub-states of the second state to an impedance matching circuit.

2. The method of claim 1, wherein the information regarding the pulsed signal includes the frequency of the sub-states of the first state, a duty cycle of the sub-states of the first state, a time for which the first state is to occur, the frequency of the sub-states of the second state, a duty cycle of the sub-states of the second state, and a time for which the second state is to occur.

3. The method of claim 1, further comprising receiving the information regarding the pulsed signal from a host computer or a second RF generator.

4. The method of claim 1, wherein the sub-states of the first state include a first sub-state and a second sub-state, wherein the first RF signal has multiple power levels, wherein during the first sub-state, the first RF signal has a first one of the power levels and during the second sub-state, the first RF signal has a second one of the power levels, wherein the first and second sub-states repeat for multiple times during the first state, wherein the first power level is different from the second power level.

5. The method of claim 1, further comprising providing by a second RF generator a second RF signal having the first state without the sub-states of the first state and having the second state without the sub-states of the second state to the impedance matching circuit.

6. The method of claim 1, wherein during the first state, an etching operation is performed on a substrate and during the second state, another etching operation is performed on the substrate.

7. The method of claim 1, wherein during the first and second states, a same type of processing operation is performed on a substrate.

8. A method comprising:
generating, by a digital signal processor of a first radio frequency (RF) generator, a pulsed signal having sub-states within a first state and having sub-states within a second state, the sub-states of each of the first state and the second state alternating with respect to each other at a frequency greater than a frequency of the first and second states;
generating, by an RF power supply of the first RF generator, a first RF signal that is synchronous with the pulsed signal, wherein the first RF signal has the sub-states of the first state during a first period of time of a cycle of the pulsed signal and has the sub-states of the second state during a second period of time of the cycle of the pulsed signal; and
providing the first RF signal to an impedance matching circuit connected to an electrode of a plasma chamber.

9. The method of claim 8, further comprising providing by a second RF generator a second RF signal having the first state without the sub-states of the first state and having the second state without the sub-states of the second state to the impedance matching circuit that is connected to the electrode, wherein the first state of the second RF signal is generated during the first period of time and the second state of the second RF signal is generated during the second period of time.

10. The method of claim 8, wherein said generating the pulsed signal is performed from information regarding the pulsed signal.

11. The method of claim 10, wherein the information regarding the pulsed signal includes the frequency of the sub-states of the first state, a duty cycle of the sub-states of the first state, a time for which the first state is to occur, the frequency of the sub-states of the second state, a duty cycle of the sub-states of the second state, and a time for which the second state is to occur.

12. The method of claim 10, further comprising receiving the information regarding the pulsed signal from a host computer or a second RF generator.

13. The method of claim 8, wherein the sub-states include a first sub-state and a second sub-state, wherein the first RF signal has multiple power levels, wherein during the first sub-state, the first RF signal has a first one of the power levels and during the second sub-state, the first RF signal has a second one of the power levels, wherein the first and second sub-states repeat for multiple times during the first state, wherein the first power level is different from the second power level.

14. The method of claim 8, wherein during the first state, an etching operation is performed on a substrate and during the second state, another etching operation is performed on the substrate.

15. The method of claim 8, wherein during the first and second states, a same type of processing operation is performed on a substrate.

16. A method comprising:
receiving a clock signal from a clock source, the clock signal having two states including a first state and a second state;
generating a pulsed signal based on the states of the clock signal, the pulsed signal having sub-states within the first state and having sub-states within the second state, the sub-states of each of the first state and the second state alternating with respect to each other at a frequency greater than a frequency of the first and second states;
providing the pulsed signal to control power of a first radio frequency (RF) signal that is generated by a first RF generator, the first RF signal having the sub-states of the first state and the sub-states of the second state and the power of the first RF signal is configured to be synchronous with the pulsed signal; and
supplying the first RF signal via an impedance matching circuit to an electrode of a plasma chamber.

17. The method of claim 16, further comprising supplying from a second RF generator a second RF signal having the first state without the sub-states and having the second state without the sub-states to the impedance matching circuit that is connected to the electrode.

18. The method of claim 16, wherein during the first state, an etching operation is performed on a substrate and during the second state, another etching operation is performed on the substrate.

19. The method of claim 16, wherein during the first and second states, a same type of processing operation is performed on a substrate.

20. The method of claim 16, wherein the pulsed signal transitions from the first state to a first one of the two sub-states of the second state, then transitions from the first sub-state to a second one of the two sub-states of the second state, then transitions from the second sub-state of the second state to the first sub-state of the second state, then transitions from the first sub-state of the second state to the second sub-state of the second state, and then transitions from the second sub-state of the second state to the first state.

* * * * *